(12) United States Patent
Yang et al.

(10) Patent No.: US 11,710,739 B2
(45) Date of Patent: Jul. 25, 2023

(54) INTEGRATED CIRCUIT DEVICE

(71) Applicant: SAMSUNG ELECTRONICS CO., LTD., Suwon-si (KR)

(72) Inventors: Junggil Yang, Hwaseong-si (KR); Minju Kim, Hwaseong-si (KR); Donghyi Koh, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 87 days.

(21) Appl. No.: 17/372,896

(22) Filed: Jul. 12, 2021

(65) Prior Publication Data
US 2022/0173097 A1    Jun. 2, 2022

(30) Foreign Application Priority Data
Dec. 2, 2020    (KR) .................. 10-2020-0166965

(51) Int. Cl.
*H01L 27/088*    (2006.01)
*H01L 29/06*    (2006.01)
*H01L 29/78*    (2006.01)

(52) U.S. Cl.
CPC ...... *H01L 27/0886* (2013.01); *H01L 29/0673* (2013.01); *H01L 29/7851* (2013.01)

(58) Field of Classification Search
CPC ............ H01L 27/0886; H01L 29/0673; H01L 29/42392; H01L 29/66545
See application file for complete search history.

(56) References Cited

U.S. PATENT DOCUMENTS

| | | | |
|---|---|---|---|
| 7,402,483 | B2 | 7/2008 | Yun et al. |
| 9,831,306 | B2 | 11/2017 | Webb et al. |
| 10,410,933 | B2 | 9/2019 | Xie et al. |
| 10,510,620 | B1 | 12/2019 | Chanemougame et al. |
| 10,566,248 | B1 | 2/2020 | Chanemougame et al. |
| 10,692,990 | B2 | 6/2020 | Bao et al. |
| 2015/0372104 | A1 | 12/2015 | Liu et al. |
| 2020/0035567 | A1* | 1/2020 | Chanemougame ... H01L 29/401 |
| 2020/0135891 | A1 | 4/2020 | Peng et al. |

OTHER PUBLICATIONS

Jan, et al. "A 14 nm SoC Platform Technology Featuring 2nd Generation Tri-Gate Transistors, 70 nm Gate Pitch, 52 nm Metal Pitch, and 0.0499 um$^2$ SRAM cells, Optimized for Low Power, High Performance and High Density SoC Products." Symposium on VLSI Technology Digest of Technical Papers. 2015.

\* cited by examiner

*Primary Examiner* — Changhyun Yi
(74) *Attorney, Agent, or Firm* — Lee IP Law, P.C.

(57) ABSTRACT

An integrated circuit device including a substrate including first and second device regions; a first fin active region on the first device region; a second fin active region on the second device region; an isolation film covering side walls of the active regions; gate cut insulating patterns on the isolation film on the device regions; a gate line extending on the fin active regions, the gate line having a length limited by the gate cut insulating patterns; and an inter-region insulating pattern on the isolation film between the fin active regions and at least partially penetrating the gate line in a vertical direction, wherein the inter-region insulating pattern has a bottom surface proximate to the substrate, a top surface distal to the substrate, and a side wall linearly extending from the bottom to the top surface.

20 Claims, 48 Drawing Sheets

X1 – X1'

X1 – X1'

INTEGRATED CIRCUIT DEVICE

CROSS-REFERENCE TO RELATED APPLICATION

Korean Patent Application No. 10-2020-0166965, filed on Dec. 2, 2020 in the Korean Intellectual Property Office, and entitled: "Integrated Circuit Device," is incorporated by reference herein in its entirety.

BACKGROUND

1. Field

Embodiments relate to an integrated circuit device.

2. Description of the Related Art

As the size of an integrated circuit device decreases, the integration density of field-effect transistors on a substrate may be increased. A horizontal nanosheet field-effect transistor (hNSFET) including a plurality of horizontal nanosheets stacked on one layout region has been considered.

SUMMARY

The embodiments may be realized by providing an integrated circuit device including a substrate including a first device region and a second device region; a first fin active region extending in a first horizontal direction on the first device region; a second fin active region extending in the first horizontal direction on the second device region; an isolation film covering opposite side walls of each of the first fin active region and the second fin active region; a plurality of gate cut insulating patterns on the isolation film on the first device region and the second device region; a gate line extending on the first fin active region and the second fin active region in a second horizontal direction that crosses the first horizontal direction, the gate line having a length in the second horizontal direction limited by the plurality of gate cut insulating patterns; and an inter-region insulating pattern on the isolation film between the first fin active region and the second fin active region and at least partially penetrating the gate line in a vertical direction, wherein the inter-region insulating pattern has a bottom surface proximate to the substrate, a top surface distal to the substrate, and a side wall linearly extending from the bottom surface to the top surface.

The embodiments may be realized by providing an integrated circuit device including a substrate including a first device region and a second device region separated from the first device region; a first fin active region extending in a first horizontal direction on the first device region; a second fin active region extending in the first horizontal direction on the second device region; an isolation film covering opposite side walls of each of the first fin active region and the second fin active region; a gate line extending on the first device region and the second device region in a second horizontal direction that crosses the first horizontal direction; a first nanosheet stack facing a first fin top of the first fin active region at a position separated from the first fin top in a vertical direction, the first nanosheet stack including at least one first nanosheet surrounded by the gate line; a second nanosheet stack facing a second fin top of the second fin active region at a position separated from the second fin top in the vertical direction, the second nanosheet stack including at least one second nanosheet surrounded by the gate line; and an inter-region insulating pattern on the isolation film between the first fin active region and the second fin active region and partially penetrating the gate line in the vertical direction, wherein the inter-region insulating pattern has a bottom surface contacting the isolation film, a top surface contacting the gate line, and a side wall linearly extending from the bottom surface to the top surface.

The embodiments may be realized by providing an integrated circuit device including a substrate including an N-channel metal-oxide semiconductor (NMOS) transistor region and a P-channel MOS (PMOS) transistor region separated from the NMOS transistor region; a first fin active region extending in a first horizontal direction on the NMOS transistor region; a second fin active region extending in the first horizontal direction on the PMOS transistor region; an isolation film covering opposite side walls of each of the first fin active region and the second fin active region; a plurality of gate cut insulating patterns on the isolation film on the NMOS transistor region and the PMOS transistor region and having a first height in a vertical direction; a gate line extending on the NMOS transistor region and the PMOS transistor region in a second horizontal direction that crosses the first horizontal direction; a first nanosheet stack on the first fin active region and including at least one first nanosheet surrounded by the gate line; a second nanosheet stack on the second fin active region and including at least one second nanosheet surrounded by the gate line; and an inter-region insulating pattern between the NMOS transistor region and the PMOS transistor region, partially penetrating the gate line in the vertical direction, and having a second height in the vertical direction that is less than the first height, wherein the inter-region insulating pattern has a bottom surface contacting the isolation film, a top surface contacting the gate line, and a side wall linearly extending from the bottom surface to the top surface.

BRIEF DESCRIPTION OF THE DRAWINGS

Features will be apparent to those of skill in the art by describing in detail exemplary embodiments with reference to the attached drawings in which:

FIGS. 18 through 25 show a partial configuration of a portion corresponding to the cross-section taken along the line Y1-Y1' in FIG. 1;

DETAILED DESCRIPTION

Figure 1:
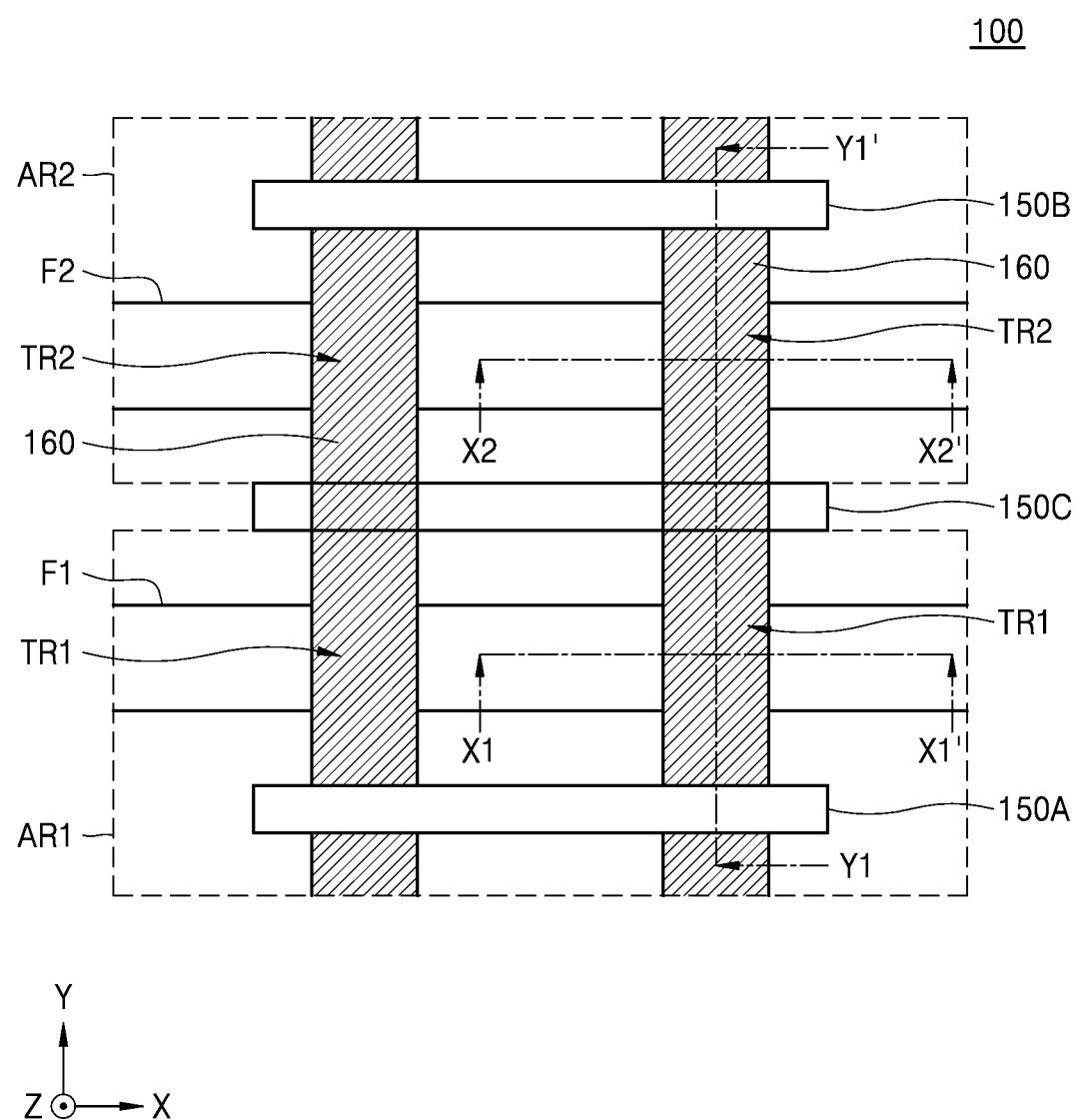
FIG. 1 is a plane layout diagram of partial configurations of an integrated circuit device, according to embodiments.
Figure 2A:
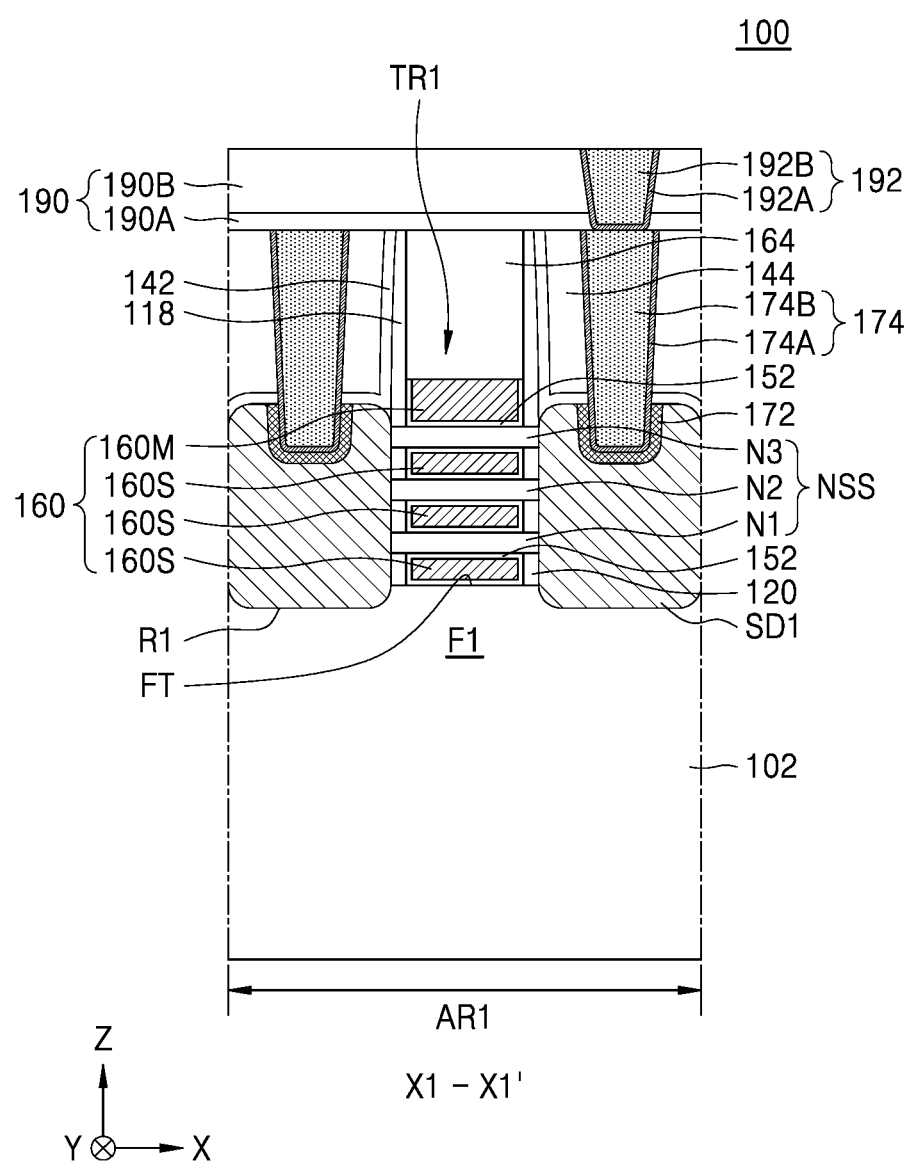
FIG. 2A is a cross-sectional view of a partial configuration of a cross-section taken along line X1-X1' in FIG. 1.
Figure 2B:
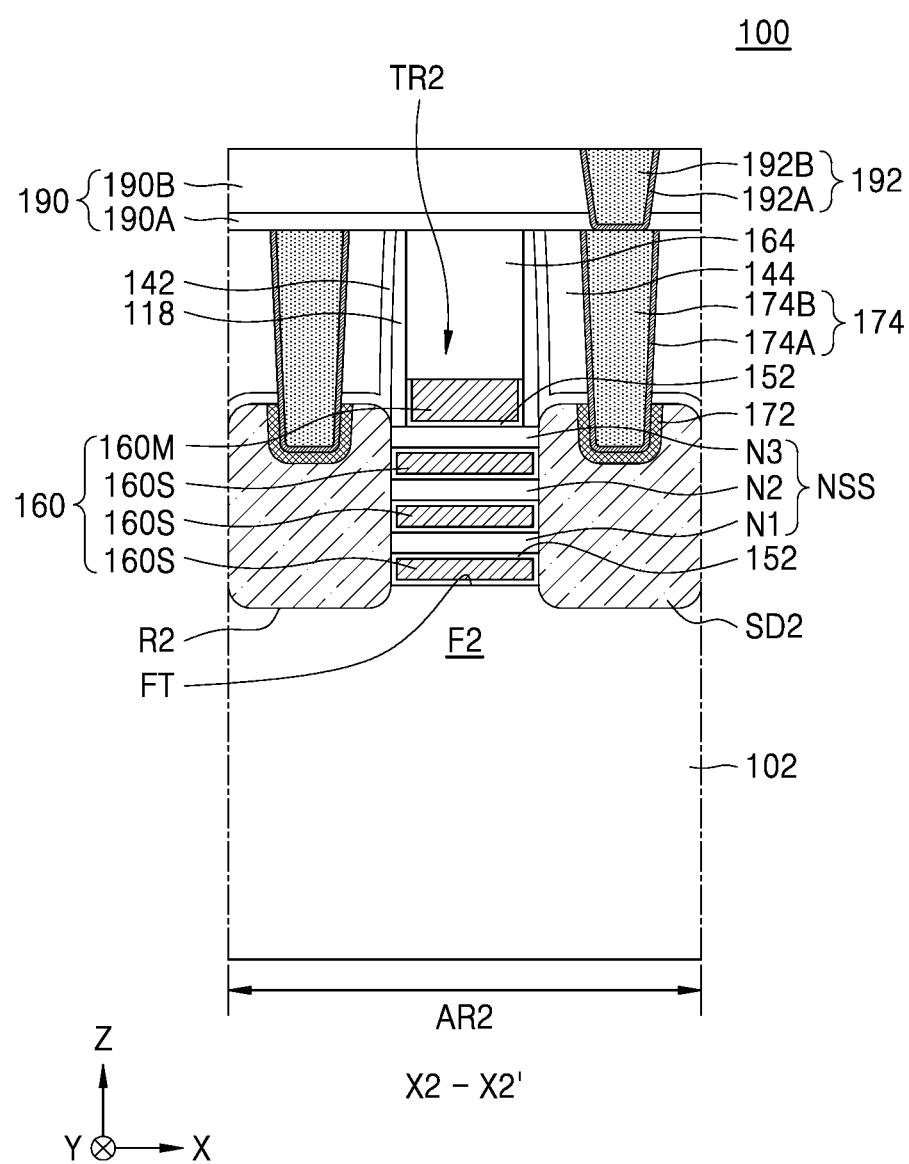
FIG. 2B is a cross-sectional view of a partial configuration of a cross-section taken along line X2-X2' in FIG. 1.
Figure 2C:
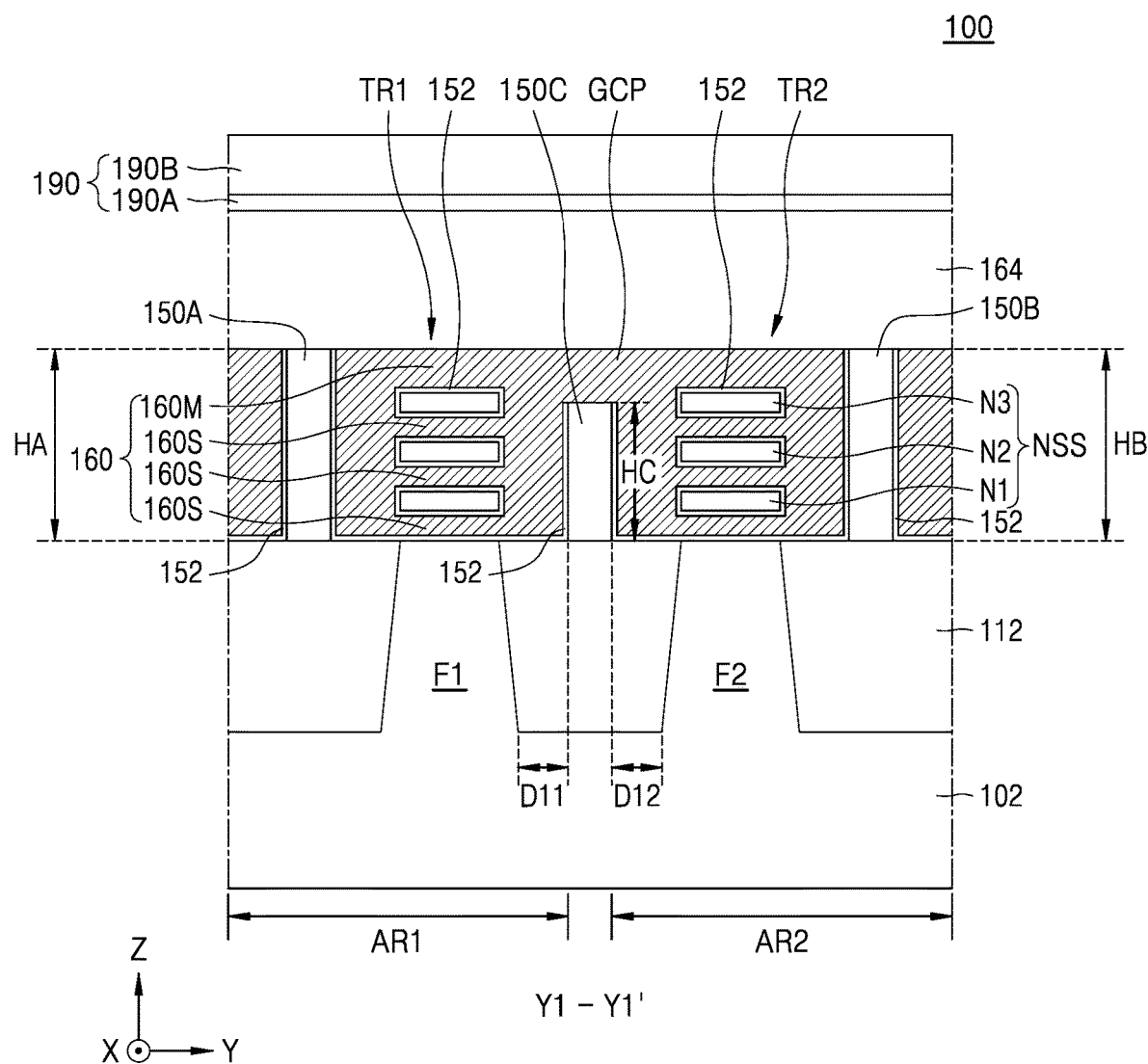
FIG. 2C is a cross-sectional view of a partial configuration of a cross-section taken along line Y1-Y1' in FIG. 1.

FIG. 1 is a plane layout diagram of partial configurations of an integrated circuit device 100, according to embodiments. FIG. 2A is a cross-sectional view of a partial configuration of a cross-section taken along line X1-X1' in FIG. 1; FIG. 2B is a cross-sectional view showing a partial configuration of a cross-section taken along line X2-X2' in FIG. 1; and FIG. 2C is a cross-sectional view of a partial configuration of a cross-section taken along line Y1-Y1' in FIG. 1.

Referring to FIG. 1 and FIGS. 2A through 2C, the integrated circuit device 100 may include a substrate 102, which includes a first device region AR1 and a second device region AR2, and a plurality of fin active regions F1 and F2, which respectively protrude from the first and second device regions AR1 and AR2 of the substrate 102 in a vertical direction (a Z direction). The fin active regions F1 and F2 may extend to be parallel with each other in a first horizontal direction (an X direction). The fin active regions F1 and F2 may include a first fin active region F1, which protrudes from the first device region AR1 of the substrate 102 in the vertical direction, and a second fin active region F2, which protrudes from the second device region AR2 of the substrate 102 in the vertical direction. In an implementation, as illustrated in FIG. 1, one first fin active region F1 may be on the first device region AR1 and one second fin active region F2 may be on the second device region AR2, or a plurality of fin active regions may be arranged on each of the first and second device regions AR1 and AR2.

The substrate 102 may include a semiconductor such as Si or Ge or a compound semiconductor such as SiGe, SiC, GaAs, InAs, InGaAs, or InP. Each of the terms "SiGe", "SiC", "GaAs", "InAs", "InGaAs", and "InP" used herein indicates a material composed of elements included in each term and is not a chemical equation representing stoichiometric relationships. The substrate 102 may include a conductive region, e.g., an impurity-doped well or an impurity-doped structure. As used herein, the term "or" is not an exclusive term, e.g., "A or B" would include A, B, or A and B.

An isolation film 112, which covers both, e.g., opposite) side walls of each of the first and second fin active regions F1 and F2, may be in the substrate 102. The isolation film 112 may include an oxide film, a nitride film, or a combination thereof. The first fin active region F1 may protrude upwardly through the isolation film 112 in a fin shape on the first device region AR1, and the second fin active region F2 may protrude upwardly through the isolation film 112 in a fin shape on the second device region AR2.

A plurality of gate lines 160 may extend lengthwise on the first and second fin active regions F1 and F2 in a second horizontal direction (a Y direction) that crosses the first horizontal direction. Each of a plurality of nanosheet stacks NSS may be above or on a fin top FT of one of the first and second fin active regions F1 and F2 at an intersection between a corresponding one of the first and second fin active regions F1 and F2 and one of the gate lines 160. Each of the nanosheet stacks NSS may face the fin top FT of a corresponding one of the first and second fin active regions F1 and F2 at a position separated in the vertical direction from the corresponding one of the first and second fin active regions F1 and F2. The term "nanosheet" used herein refers to a conductive structure having a cross-section that is substantially perpendicular to a direction in which electric current flows. It will be understood that the nanosheet may include a nanowire.

Each of the nanosheet stacks NSS may include a plurality of nanosheets, which overlap each other above the fin top FT of a corresponding one of the first and second fin active regions F1 and F2 in the vertical direction. The nanosheets may respectively have different vertical distances (e.g., Z-direction distances) from the fin top FT. The nanosheets may include a first nanosheet N1, a second nanosheet N2, and a third nanosheet N3, which are sequentially stacked on the fin top FT of each of the first and second fin active regions F1 and F2.

The numbers of nanosheet stacks NSS and gate lines 160, which are arranged on one fin active region, e.g., the first fin active region F1 or the second fin active region F2, may be a suitable number. In an implementation, one or more nanosheet stacks NSS and one or more gate lines 160 may be arranged on one fin active region, e.g., the first fin active region F1 or the second fin active region F2.

In an implementation, as illustrated in FIGS. 2A through 2C, each of the nanosheet stacks NSS may include three nanosheets, e.g., the first, second, and third nanosheets N1, N2, and N3. In an implementation, the number of nanosheets included in each nanosheet stack NSS may be a suitable number. In an implementation, each of the nanosheet stacks NSS may include one nanosheet, two nanosheets, or at least four nanosheets. Each of the first, second, and third nanosheets N1, N2, and N3 may have a channel region. In an implementation, each of the first, second, and third nanosheets N1, N2, and N3 may have a thickness (e.g., in the Z direction) of about 4 nm to about 6 nm. In an implementation, the thickness of each of the first, second, and third nanosheets N1, N2, and N3 refers to a size in the vertical direction (the Z direction). In an implementation, the first, second, and third nanosheets N1, N2, and N3 may have substantially the same thickness as one another in the vertical direction. In an implementation, at least some of the first, second, and third nanosheets N1, N2, and N3 may have different thicknesses from each other in the vertical direction.

In an implementation, as shown in FIGS. 2A and 2B, the first, second, and third nanosheets N1, N2, and N3 of one nanosheet stack NSS may have the same size as one another in the first horizontal direction. In an implementation, at least some of the first, second, and third nanosheets N1, N2, and N3 of one nanosheet stack NSS may have different sizes from each other in the first horizontal direction. In an implementation, the length (in the first horizontal direction) of each of the first and second nanosheets N1 and N2, which are relatively close or proximate to the fin top FT, may be less than the length (in the first horizontal direction) of the third nanosheet N3, which is farthest from or distal to the fin top FT.

A plurality of first recesses R1 may be in a top surface of the first fin active region F1 on the first device region AR1, and a plurality of second recesses R2 may be in a top surface of the second fin active region F2 on the second device region AR2. In an implementation, as illustrated in FIGS. 2A and 2B, the level of the bottommost surface of each of the first recesses R1 and the second recesses R2 may be lower than the level of the fin top FT of each of the first and second fin active regions F1 and F2. In an implementation, the level of the bottommost surface of each of the first recesses R1 and the second recesses R2 may be the same as or similar to the level of the fin top FT of each of the first and second fin active regions F1 and F2.

A plurality of first source/drain regions SD1 may be on the first recesses R1 on the first device region AR1, and a plurality of second source/drain regions SD2 may be on the second recesses R2 on the second device region AR2.

The gate lines 160 may extend lengthwise on the first and second fin active regions F1 and F2 and the isolation film 112 in the second horizontal direction (the Y direction) on the first and second device regions AR1 and AR2. The gate lines 160 may be on the first and second fin active regions F1 and F2 and may cover the nanosheet stacks NSS and may surround each of the first, second, and third nanosheets N1, N2, and N3. A plurality of transistors, e.g., N-channel metal-oxide semiconductor (NMOS) transistors TR1 and P-channel MOS (PMOS) transistors TR2, may be on the substrate 102 at intersections between the first and second fin active regions F1 and F2 and the gate lines 160. In an implementation, the first device region AR1 may correspond to an NMOS transistor region, and the second device region AR2 may correspond to a PMOS transistor region. The NMOS transistors TR1 may be at the intersections between the first fin active region F1 and the gate lines 160 on the first device region AR1, and the PMOS transistors TR2 may be at the intersections between the second fin active region F2 and the gate lines 160 on the second device region AR2.

Each of the gate lines 160 may include a main gate portion 160M and a plurality of sub gate portions 160S. The main gate portion 160M may extend lengthwise in the second horizontal direction (the Y direction) to cover the top surface of a nanosheet stack NSS. The sub gate portions 160S may be integrally connected to the main gate portion 160M and respectively between the third nanosheet N3 and the second nanosheet N2, between the second nanosheet N2 and the first nanosheet N1, and between the first nanosheet N1 and the first or second fin active region F1 or F2.

Each of the gate lines 160 may include a metal, a metal nitride, a metal carbide, or a combination thereof. The metal may include Ti, W, Ru, Nb, Mo, Hf, Ni, Co, Pt, Yb, Tb, Dy, Er, or Pd. The metal nitride may include TiN or TaN. The metal carbide may include TiAlC.

A plurality of gate cut insulating patterns and an inter-region insulating pattern 150C may be on the isolation film 112 on the substrate 102.

The gate cut insulating patterns may include a first gate cut insulating pattern 150A on the first device region AR1 and a second gate cut insulating pattern 150B on the second device region AR2. The inter-region insulating pattern 150C may be at a boundary between the first device region AR1 and the second device region AR2.

Each of the first and second gate cut insulating patterns 150A and 150B and the inter-region insulating pattern 150C may extend lengthwise in the first horizontal direction (the X direction) to cross the gate lines 160.

A height HA of the first gate cut insulating pattern 150A in the vertical direction (the Z direction) may be the same as or similar to a height HB of the second gate cut insulating pattern 150B in the vertical direction (the Z direction). A level of a topmost surface of each of the first and second gate cut insulating patterns 150A and 150B may be the same as or similar to the level of a topmost surface of the gate lines 160 (e.g., the surfaces may be coplanar). A pair of gate lines 160, which are respectively adjacent to both sides of one of the first and second gate cut insulating patterns 150A and 150B in the second horizontal direction (the Y direction), may not be connected, and may be separated from each other.

A height HC of the inter-region insulating pattern 150C in the vertical direction (the Z direction) may be less than the heights HA and HB of the respective first and second gate cut insulating patterns 150A and 150B.

Some gate lines 160 that are arranged in a line in the second horizontal direction (the Y direction) may be separated from one another by the first and second gate cut insulating patterns 150A and 150B. At least one gate line 160 among the gate lines 160 may have a length limited in the second horizontal direction (the Y direction) by the first and second gate cut insulating patterns 150A and 150B and may extend lengthwise in the second horizontal direction (the Y direction) on the first and second device regions AR1 and AR2.

The inter-region insulating pattern 150C may only partially penetrate the gate line 160 in the vertical direction (the Z direction). The gate line 160 may have a structure, in which only a lower portion is partially cut by the inter-region insulating pattern 150C on the isolation film 112 between the first fin active region F1 and the second fin active region F2. The gate line 160 may include a gate connecting portion GCP covering or on the inter-region insulating pattern 150C. A portion of the gate line 160 on the first device region AR1 may be integrally connected to a portion of the gate line 160 on the second device region AR2 through the gate connecting portion GCP. The inter-region insulating pattern 150C may have a bottom surface, which is in contact (e.g., direct contact) with the isolation film 112 and closest or proximate to the substrate 102, a top surface, which is in contact (e.g., direct contact) with the gate line 160 and farthest from or distal to the substrate 102, and side walls linearly extending from the bottom surface to the top surface. The top surface of the inter-region insulating pattern 150C may be in contact (e.g., direct contact) with the gate line 160.

In the vertical direction (the Z direction), the length of the gate connecting portion GCP may be less than the length (in the vertical direction) of the inter-region insulating pattern 150C. In an implementation, in the vertical direction (the Z direction), the length of the gate connecting portion GCP may be greater than or equal to the length of the inter-region insulating pattern 150C.

In an implementation, each of the first and second gate cut insulating patterns 150A and 150B and the inter-region insulating pattern 150C may include a nitrogen-containing insulating film. In an implementation, each of the first and second gate cut insulating patterns 150A and 150B and the inter-region insulating pattern 150C may include a silicon nitride film.

In an implementation, as shown in FIG. 2C, in the second horizontal direction (the Y direction), a shortest (e.g., lateral) distance D11 between the inter-region insulating pattern 150C and the first fin active region F1 may be the same as or similar to a shortest (e.g., lateral) distance D12 between the inter-region insulating pattern 150C and the second fin active region F2. In an implementation, a relative position of the inter-region insulating pattern 150C between the first and second fin active regions F1 and F2 may be determined, taking into account the performance of the NMOS transistor TR1 on the first device region AR1 and the performance of the PMOS transistor TR2 on the second device region AR2.

The level of the topmost surface of the inter-region insulating pattern 150C may be lower than the level of the topmost surface of each of the first and second gate cut insulating patterns 150A and 150B. In an implementation, the level of the topmost surface of the inter-region insulating pattern 150C may be lower than or equal to the level of the topmost surface of the nanosheet stacks NSS. In an implementation, the level of the topmost surface of the inter-region insulating pattern 150C may be lower than the level of the topmost surface of each of the first and second gate cut insulating patterns 150A and 150B and higher than the level of the topmost surface of the nanosheet stacks NSS. In the specification, the term "level" refers to a height from the top surface of the substrate 102 in the vertical direction (the Z direction or a −Z direction).

A gate dielectric film 152 may be between the first, second, and third nanosheets N1, N2, and N3 of each nanosheet stack NSS and the gate line 160. The gate dielectric film 152 may include portions covering the surfaces of the first, second, and third nanosheets N1, N2, and N3; portions covering the side walls of the main gate portion 160M; and portions covering the sidewalls of the first and second gate cut insulating patterns 150A and 150B and the inter-region insulating pattern 150C.

In an implementation, the gate dielectric film 152 may include a stack structure of an interface film and a high-k dielectric film. The interface film may include a low-k dielectric film, e.g., a silicon oxide film, a silicon oxynitride film, or a combination thereof, having a permittivity of about 9 or less. In an implementation, the interface film may be omitted. The high-k dielectric film may include a material having a higher dielectric constant than a silicon oxide film. In an implementation, the high-k dielectric film may have a dielectric constant of about 10 to about 25. In an implementation, the high-k dielectric film may include hafnium oxide.

In an implementation, the first, second, and third nanosheets N1, N2, and N3 may respectively include semiconductor layers including the same element. In an implementation, each of the first, second, and third nanosheets N1, N2, and N3 may include an Si layer. On the first device region AR1, the first, second, and third nanosheets N1, N2, and N3 may be doped with a dopant of the same conductivity type as the first source/drain region SD1. On the second device region AR2, the first, second, and third nanosheets N1, N2, and N3 may be doped with a dopant of the same conductivity type as the second source/drain region SD2. In an implementation, the first, second, and third nanosheets N1, N2, and N3 on the first device region AR1 may include an Si layer doped with an n-type dopant, and the first, second, and third nanosheets N1, N2, and N3 on the second device region AR2 may include an Si layer doped with a p-type dopant.

Both (e.g., opposite) side walls of each gate line 160 on the first and second fin active regions F1 and F2 and the isolation film 112 may be covered with a plurality of outer insulating spacers 118. The outer insulating spacers 118 may be on the top surface of the nanosheet stacks NSS to cover both (e.g., opposite) side walls of the main gate portion 160M. Each of the outer insulating spacers 118 may be separated from the gate line 160 with the gate dielectric film 152 between each outer insulating spacer 118 and the gate line 160. The outer insulating spacers 118 may include silicon nitride, silicon oxide, SiCN, SiBN, SiON, SiOCN, SiBCN, SiOC, or a combination thereof. Each of the terms "SiCN" "SiBN", "SiON", "SiOCN", "SiBCN", and "SiOC" used herein indicates a material composed of elements included in each term and is not a chemical equation representing stoichiometric relationships.

As shown in FIG. 2A, on the first device region AR1, a plurality of inner insulating spacers 120 may be between the third nanosheet N3 and the second nanosheet N2, between the second nanosheet N2 and the first nanosheet N1, between the first nanosheet N1 and the first fin active region F1, and between the sub gate portions 160S and the first source/drain region SD1. Each of opposite side walls of each of the sub gate portions 160S on the first device region AR1 may be covered with an inner insulating spacer 120 with the gate dielectric film 152 between the side wall of each sub gate portion 160S and the inner insulating spacer 120. On the first device region AR1, each of the sub gate portions 160S may be separated from the first source/drain region SD1 with the gate dielectric film 152 and the inner insulating spacer 120 between each sub gate portion 160S and the first source/drain region SD1. Each of the inner insulating spacers 120 may be in contact (e.g., direct contact) with the first source/drain region SD1. At least some of the inner insulating spacers 120 may overlap any one of the outer insulating spacers 118 in the vertical direction (the Z direction). The inner insulating spacers 120 may include silicon nitride, silicon oxide, SiCN, SiBN, SiON, SiOCN, SiBCN, SiOC, or a combination thereof. The inner insulating spacers 120 may further include an air gap. In an implementation, the inner insulating spacers 120 may include the same material as the outer insulating spacers 118. In an implementation, the outer insulating spacers 118 may include a different material than the inner insulating spacers 120.

On the first device region AR1, each of a plurality of first source/drain regions SD1 may face each of the sub gate portions 160S with an inner insulating spacer 120 between each first source/drain region SD1 and each sub gate portion 160S in the first horizontal direction (the X direction). The first source/drain regions SD1 may not include any portion that is in contact with the gate dielectric film 152.

In an implementation, as shown in FIG. 2B, on the second device region AR2, each of both (e.g., opposite) side walls of each of the sub gate portions 160S between the third nanosheet N3 and the second nanosheet N2, between the second nanosheet N2 and the first nanosheet N1, and between the first nanosheet N1 and the second fin active region F2 may be separated from a second source/drain region SD2 with the gate dielectric film 152 between each side wall of each sub gate portion 160S and the second source/drain region SD2. The gate dielectric film 152 may include a portion that is in contact (e.g., direct contact) with the second source/drain region SD2. Each of a plurality of second source/drain regions SD2 may face the nanosheet stack NSS and the sub gate portions 160S in the first horizontal direction (the X direction).

In an implementation, the gate lines 160 may have a structure, in which a metal nitride film, a metal film, a conductive capping film, and a gap-fill metal film are sequentially stacked. The metal nitride film and the metal film may include Ti, Ta, W, Ru, Nb, Mo, or Hf. The gap-fill metal film may include a W film or an Al film. Each of the gate lines 160 may include a work function metal film. The work function metal film may include a metal, e.g., Ti, W, Ru, Nb, Mo, Hf, Ni, Co, Pt, Yb, Tb, Dy, Er, or Pd. In an implementation, each of the gate lines 160 may include a stack structure of TiAlC/TiN/W, TiN/TaN/TiAlC/TiN/W, or TiN/TaN/TiN/TiAlC/TiN/W.

In an implementation, as shown in FIGS. 2A through 2C, the gate line 160 and the gate dielectric film 152 (covering the side walls of the gate line 160) may be covered with a capping insulating pattern 164. The capping insulating pattern 164 may include a silicon nitride film.

On the first device region AR1, the main gate portion 160M of the gate line 160 may be separated from a first source/drain region SD1 with an outer insulating spacer 118 between the main gate portion 160M and the first source/drain region SD1. On the second device region AR2, the main gate portion 160M of the gate line 160 may be separated from a second source/drain region SD2 with an outer insulating spacer 118 between the main gate portion 160M and the second source/drain region SD2.

In an implementation, the first device region AR1 may correspond to an NMOS transistor region, and the second device region AR2 may correspond to a PMOS transistor region. In this case, a plurality of first source/drain regions SD1 on the first device region AR1 may include an Si layer doped with an n-type dopant or a SiC layer doped with an n-type dopant, and a plurality of second source/drain regions SD2 on the second device region AR2 may include a SiGe layer doped with a p-type dopant. The n-type dopant may include, e.g., phosphorus (P), arsenic (As), or antimony (Sb). The p-type dopant may include, e.g., boron (B) or gallium (Ga).

In an implementation, the first source/drain regions SD1 on the first device region AR1 may have a different shape and size than the second source/drain regions SD2 on the second device region AR2. In an implementation, a plurality of first and second source/drain regions SD1 and SD2 having various shapes and sizes may be on the first and second device regions AR1 and AR2.

In an implementation, as shown in FIGS. 2A and 2B, the first and second source/drain regions SD1 and SD2 may be covered with an insulating liner 142. The insulating liner 142 may conformally cover the outer insulating spacer 118 and the surface of each of the first and second source/drain regions SD1 and SD2. The insulating liner 142 may include SiN, SiCN, SiBN, SiON, SiOCN, SiBCN, SiOC, SiO$_2$, or a combination thereof.

On the first and second device regions AR1 and AR2, the insulating liner 142 may be covered with an intergate insulating film 144. The intergate insulating film 144 may include a silicon nitride film, a silicon oxide film, SiON, SiOCN, or a combination thereof. A plurality of capping insulating patterns 164 and the intergate insulating film 144 between each of the capping insulating patterns 164 may be covered with an insulating structure 190. The insulating structure 190 may include an etch stop film 190A and an interlayer insulating film 190B. The etch stop film 190A may include silicon carbide (SiC), SiN, nitrogen-doped silicon carbide (SiC:N), SiOC, AlN, AlON, AlO, AlOC, or a combination thereof. The interlayer insulating film 190B may include an oxide film, a nitride film, an ultra low-k (ULK) film having an ultra low dielectric constant k of about 2.2 to about 2.4, or a combination thereof. In an implementation, the interlayer insulating film 190B may include a tetraethylorthosilicate (TEOS) film, a high density plasma (HDP) film, a boro-phospho-silicate glass (BPSG) film, a flowable chemical vapor deposition (FCVD) oxide film, a SiON film, a SiN film, a SiOC film, a SiCOH film, or a combination thereof.

In an implementation, as shown in FIGS. 2A and 2B, on the first and second device regions AR1 and AR2, a plurality of source/drain contacts 174 and a plurality of source/drain via contacts 192 may be on the first and second source/drain regions SD1 and SD2. The first and second source/drain regions SD1 and SD2 may be connected to a conductive line thereabove through the source/drain contacts 174 and the source/drain via contacts 192.

A metal silicide film 172 may be between each of the first and second source/drain regions SD1 and SD2 and a source/drain contact 174. In an implementation, the metal silicide film 172 may include Ti, W, Ru, Nb, Mo, Hf, Ni, Co, Pt, Yb, Tb, Dy, Er, or Pd. In an implementation, the metal silicide film 172 may include titanium silicide. The source/drain contact 174 may pass through the intergate insulating film 144 and the insulating liner 142 in the vertical direction (the Z direction) and may be in contact (e.g., direct contact) with the metal silicide film 172. Each of the source/drain via contacts 192 may pass through the insulating structure 190 in the vertical direction (the Z direction) and may be in contact (e.g., direct contact) with the source/drain contact 174.

Each of the source/drain contacts 174 may include a conductive barrier film 174A and a metal plug 174B. Each of the source/drain via contacts 192 may include a conductive barrier film 192A and a metal plug 192B. The conductive barrier films 174A and 192A may include Ti, Ta, TiN, TaN, or a combination thereof, and the metal plugs 174B and 192B may include W, Co, Cu, Ru, Mn, or a combination thereof. In an implementation, a side wall of each of the source/drain contacts 174 and the source/drain via contacts 192 may be surrounded by a contact insulating spacer. The contact insulating spacer may include SiCN, SiOCN, silicon nitride (SiN), or a combination.

A gate contact may be on a top of each of the gate lines 160. Each of the gate lines 160 may be connected to a conductive line thereabove through the gate contact. The gate contact may have a structure similar to that of each of the source/drain contacts 174 and the source/drain via contacts 192.

The integrated circuit device 100 illustrated in FIG. 1 and FIGS. 2A through 2C may include the inter-region insulating pattern 150C on the isolation film 112 between the first device region AR1 and the second device region AR2. The inter-region insulating pattern 150C may help remove or reduce the probability of occurrence of defective processes during the manufacture of the integrated circuit device 100 and may contribute to the enhancement of the performance and reliability of the NMOS transistor TR1 on the first device region AR1 and the PMOS transistor TR2 on the second device region AR2.

Figure 3:
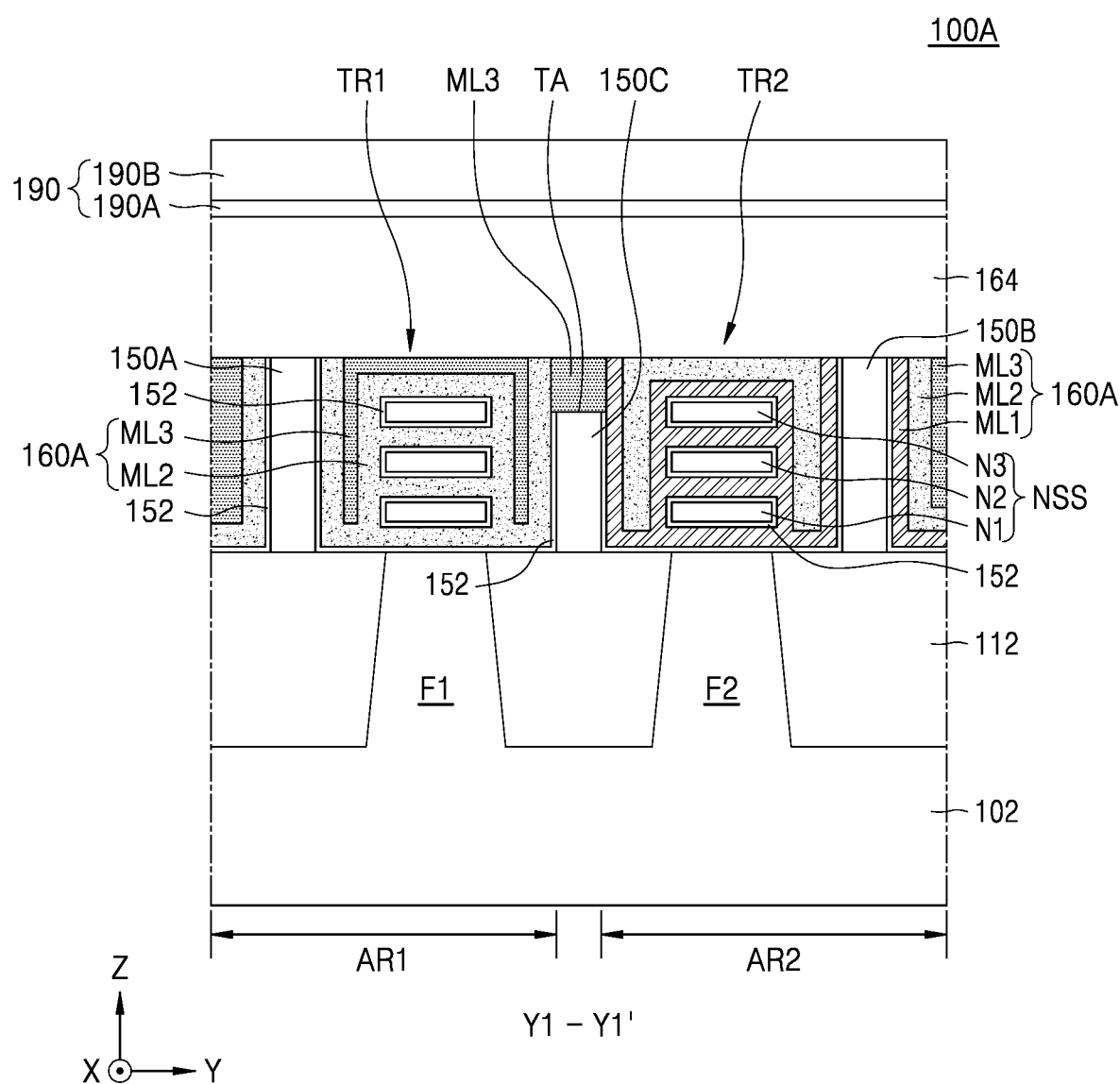
FIG. 3 is a cross-sectional view of an integrated circuit device according to some embodiments.

FIG. 3 is a cross-sectional view of an integrated circuit device 100A according to some embodiments. FIG. 3 illustrates a partial configuration of a portion corresponding to the cross-section taken along the line Y1-Y1' in FIG. 1.

Referring to FIG. 3, the integrated circuit device 100A may have substantially the same configuration as the integrated circuit device 100 described with reference to FIG. 1 and FIGS. 2A through 2C. The integrated circuit device 100A may include a plurality of gate lines 160A. The gate lines 160A may have substantially the same configuration as the gate lines 160 described with reference to FIG. 1 and FIGS. 2A through 2C. In an implementation, the gate lines 160A may have different stack structures between the first device region AR1 and the second device region AR2.

Each of the gate lines 160A may have a stack structure, and may include at least two layers selected from a first work function metal film ML1, a second work function metal film ML2, and a gap-fill metal film ML3. In an implementation, the first work function metal film ML1 may include a TiN film. The second work function metal film ML2 may include a combination of a first TiN film, a TiAlC film, and a second TiN film. The gap-fill metal film ML3 may include W, Al, or a combination thereof.

On a portion of the second device region AR2, a gate line 160A may include the first work function metal film ML1 contacting (e.g., directly contacting) the gate dielectric film 152 and the second work function metal film ML2 contacting (e.g., directly contacting) the first work function metal film ML1. On another portion of the second device region AR2, a gate line 160A may include the first work function metal film ML1 contacting (e.g., directly contacting) the gate dielectric film 152, the second work function metal film ML2 contacting (e.g., directly contacting) the first work function metal film ML1, and the gap-fill metal film ML3 contacting (e.g., directly contacting) the second work function metal film ML2.

The gate line 160A on the first device region AR1 may not include the first work function metal film ML1. In an implementation, the gate line 160A on the first device region AR1 may include the second work function metal film ML2 contacting (e.g., directly contacting) the gate dielectric film 152 and the gap-fill metal film ML3 contacting (e.g., directly contacting) the second work function metal film ML2.

The inter-region insulating pattern 150C between the first device region AR1 and the second device region AR2 may have a flat top surface TA. The flat top surface TA of the inter-region insulating pattern 150C may be covered with the gap-fill metal film ML3. Similarly to the description of the gate connecting portion GCP that has been given with reference to FIG. 2C, a portion of the gate line 160A on the first device region AR1 may be integrally connected to a portion of the gate line 160A in the second device region AR2 through the gap-fill metal film ML3 that covers the flat top surface TA of the inter-region insulating pattern 150C.

In an implementation, the gap-fill metal film ML3 that covers the flat top surface TA of the inter-region insulating pattern 150C may include a single metal film. In an implementation, the gap-fill metal film ML3 that covers the flat top surface TA of the inter-region insulating pattern 150C may include a W film or an Al film.

Figure 4:
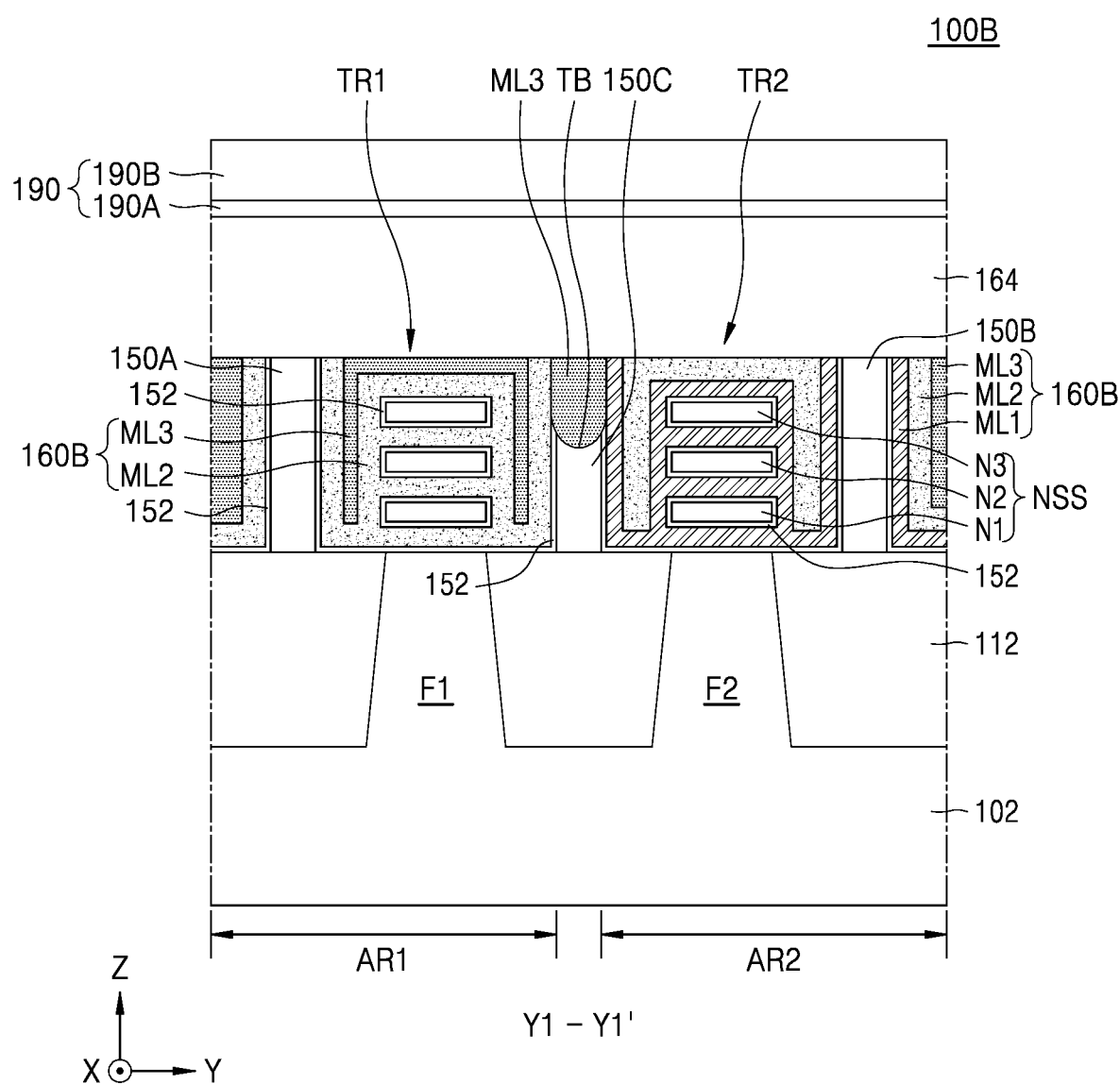
FIG. 4 is a cross-sectional view of an integrated circuit device according to some embodiments.

FIG. 4 is a cross-sectional view of an integrated circuit device 100B according to some embodiments. FIG. 4 illustrates a partial configuration of a portion corresponding to the cross-section taken along the line Y1-Y1' in FIG. 1.

Referring to FIG. 4, the integrated circuit device 100B may have substantially the same configuration as the integrated circuit device 100A described with reference to FIG. 3. The inter-region insulating pattern 150C of the integrated circuit device 100B may have a non-linear or non-planar top surface TB (e.g., the top surface TB may not be flat). The integrated circuit device 100B may include a gate line 160B, which includes the gap-fill metal film ML3 covering the non-planar top surface TB of the inter-region insulating pattern 150C. A portion of the gap-fill metal film ML3 of the gate line 160B may be in contact (e.g., direct contact) with the non-planar top surface TB and have a non-planar surface corresponding to (e.g., complementary to) the non-planar top surface TB. The detailed configuration of the gate line 160B may be substantially the same as that of the gate line 160A described with reference to FIG. 3.

Similarly to the description of the gate connecting portion GCP that has been given with reference to FIG. 2C, a portion of the gate line 160B on the first device region AR1 may be integrally connected to a portion of the gate line 160B on the second device region AR2 through the portion of the gap-fill metal film ML3 that covers the non-planar top surface TB of the inter-region insulating pattern 150C.

Figure 5:
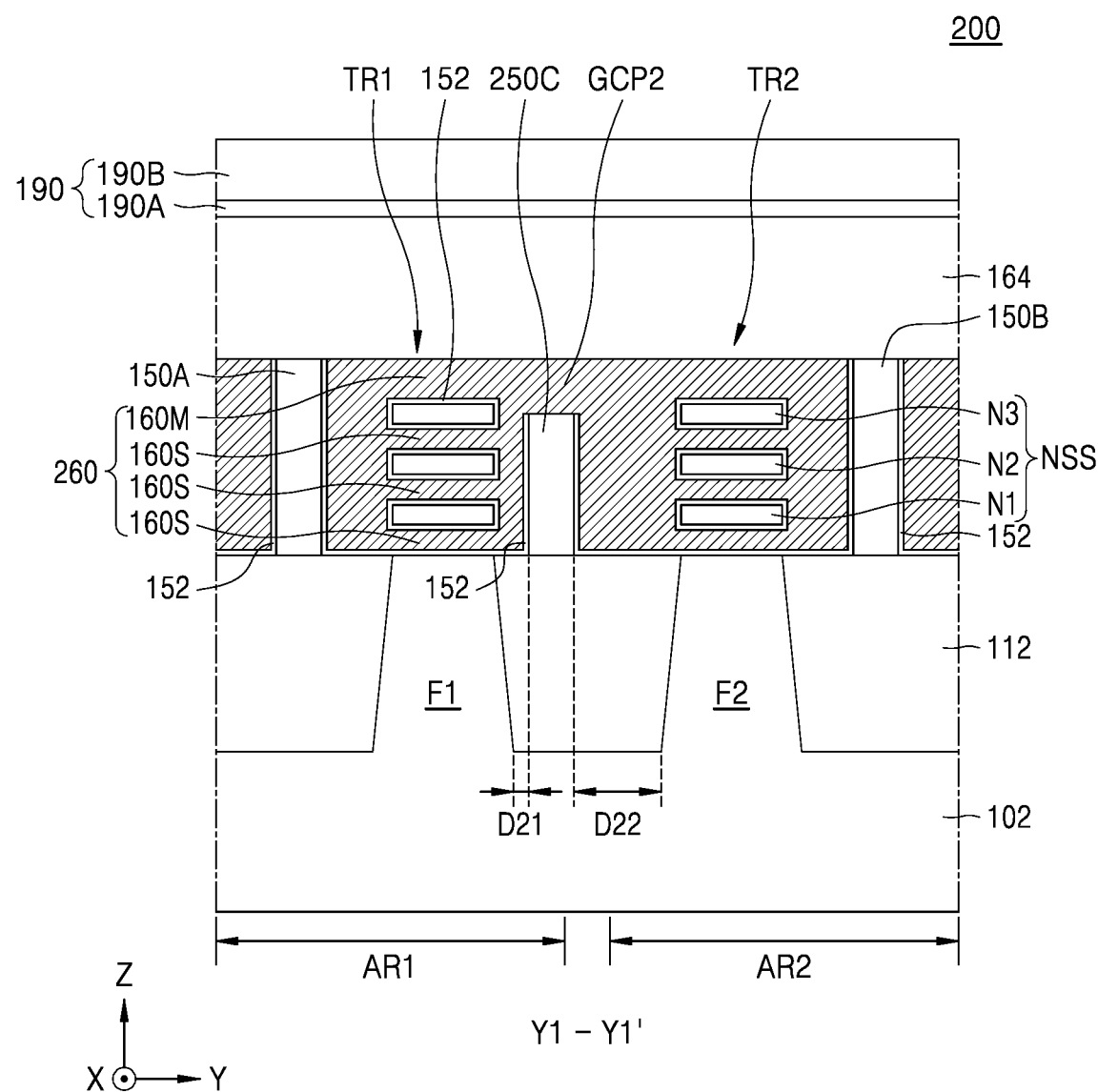
FIG. 5 is a cross-sectional view of an integrated circuit device according to some embodiments.

FIG. 5 is a cross-sectional view of an integrated circuit device 200 according to some embodiments. FIG. 5 illustrates a partial configuration of a portion corresponding to the cross-section taken along the line Y1-Y1' in FIG. 1.

Referring to FIG. 5, the integrated circuit device 200 may have substantially the same configuration as the integrated circuit device 100 described with reference to FIG. 1 and FIGS. 2A through 2C. In an implementation, the integrated circuit device 200 may include a gate line 260, which extends lengthwise on the first device region AR1 and the second device region AR2 in the second horizontal direction (the Y direction), and an inter-region insulating pattern 250C on the isolation film 112 between the first device region AR1 and the second device region AR2.

Similarly to the description of the gate line 160 that has been given with reference to FIG. 1 and FIGS. 2A through 2C, the gate line 260 may include the main gate portion 160M and the sub gate portions 160S and may have a length limited or defined in the second horizontal direction (the Y direction) by the first and second gate cut insulating patterns 150A and 150B. The gate line 260 may have a structure, in which only a lower portion is partially cut by the inter-region insulating pattern 250C on the isolation film 112. The gate line 260 may include a gate connecting portion GCP2 covering or on the top surface of the inter-region insulating pattern 250C. A portion of the gate line 260 on the first device region AR1 may be integrally connected to a portion of the gate line 260 on the second device region AR2 through the gate connecting portion GCP2.

The inter-region insulating pattern 250C may have substantially the same configuration as the inter-region insulating pattern 150C described with reference to FIG. 1 and FIGS. 2A through 2C. In an implementation, the inter-region insulating pattern 250C may be closer to the first fin active region F1 of the first device region AR1 than to the second fin active region F2 of the second device region AR2. In the second horizontal direction (the Y direction), a shortest (e.g., lateral) distance D21 between the inter-region insulating pattern 250C and the first fin active region F1 may be less than a shortest (e.g., lateral) distance D22 between the inter-region insulating pattern 250C and the second fin active region F2. In an implementation, a volume of a portion of the gate line 260 between the nanosheet stack NSS on the first device region AR1 and the inter-region insulating pattern 250C may be less than a volume of a portion of the gate line 260 between the nanosheet stack NSS on the second device region AR2 and the inter-region insulating pattern 250C. The detailed configuration of the gate line 260 may be substantially the same as that of the gate line 160 described with reference to FIG. 1 and FIGS. 2A through 2C.

In an implementation, the gate line 260 may have different stack structures between or on the first device region AR1 and the second device region AR2. In an implementation, similarly to the description of the gate line 160A that has been given with reference to FIG. 3, the gate line 260 on the first device region AR1 may include the second work function metal film ML2 contacting the gate dielectric film 152 and the gap-fill metal film ML3 contacting the second work function metal film ML2. On a portion of the second device region AR2, the gate line 260 may include the first work function metal film ML1 contacting the gate dielectric film 152 and the second work function metal film ML2 contacting the first work function metal film ML1. On another portion of the second device region AR2, the gate line 260 may include the first work function metal film ML1 contacting the gate dielectric film 152, the second work function metal film ML2 contacting the first work function metal film ML1, and the gap-fill metal film ML3 contacting the second work function metal film ML2. The detailed configurations of the first work function metal film ML1, the second work function metal film ML2, and the gap-fill metal film ML3 have been described above with reference to FIG. 3.

Figure 6:
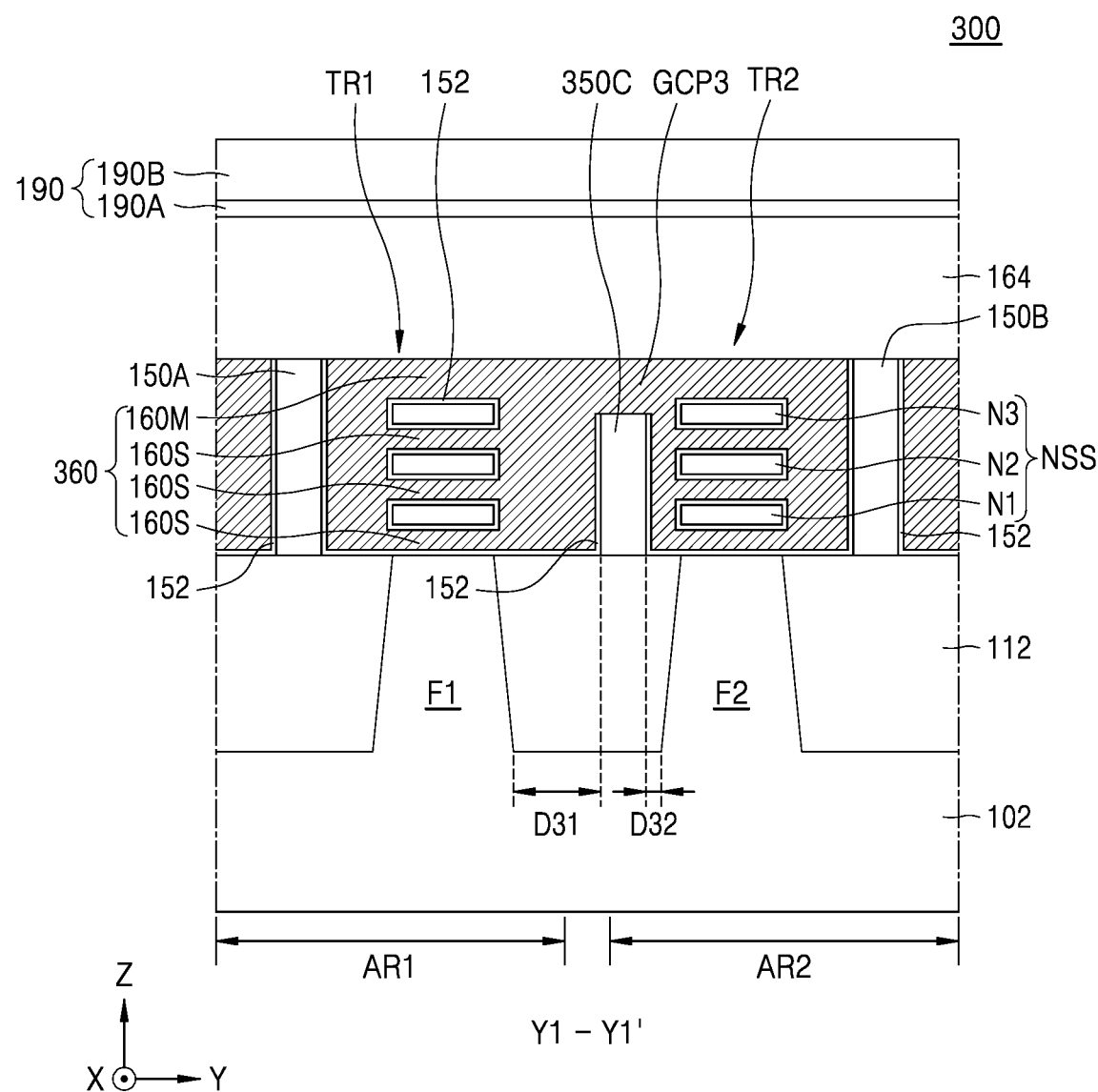
FIG. 6 is a cross-sectional view of an integrated circuit device according to some embodiments.

FIG. 6 is a cross-sectional view of an integrated circuit device 300 according to some embodiments. FIG. 6 illustrates a partial configuration of a portion corresponding to the cross-section taken along the line Y1-Y1' in FIG. 1.

Referring to FIG. 6, the integrated circuit device 300 may have substantially the same configuration as the integrated circuit device 100 described with reference to FIG. 1 and FIGS. 2A through 2C. In an implementation, the integrated circuit device 300 may include a gate line 360, which extends lengthwise on the first device region AR1 and the second device region AR2 in the second horizontal direction (the Y direction), and an inter-region insulating pattern 350C on the isolation film 112 between the first device region AR1 and the second device region AR2.

Similarly to the description of the gate line 160 that has been given with reference to FIG. 1 and FIGS. 2A through 2C, the gate line 360 may include the main gate portion 160M and the sub gate portions 160S and may have a length limited in the second horizontal direction (the Y direction) by the first and second gate cut insulating patterns 150A and 150B. The gate line 360 may have a structure, in which only a lower portion is partially cut by the inter-region insulating pattern 350C on the isolation film 112. The gate line 360 may include a gate connecting portion GCP3 covering the top surface of the inter-region insulating pattern 350C. A portion of the gate line 360 on the first device region AR1 may be integrally connected to a portion of the gate line 360 on the second device region AR2 through the gate connecting portion GCP3.

The inter-region insulating pattern 350C may have substantially the same configuration as the inter-region insulating pattern 150C described with reference to FIG. 1 and FIGS. 2A through 2C. In an implementation, the inter-region insulating pattern 350C may be closer to the second fin active region F2 on the second device region AR2 than to the first fin active region F1 on the first device region AR1. In the second horizontal direction (the Y direction), a shortest (e.g., lateral) distance D31 between the inter-region insulating pattern 350C and the first fin active region F1 may be greater than a shortest (e.g., lateral) distance D32 between the inter-region insulating pattern 350C and the second fin active region F2. In an implementation, the volume of a portion of the gate line 360 between the nanosheet stack NSS on the first device region AR1 and the inter-region insulating pattern 350C may be greater than the volume of a portion of the gate line 360 between the nanosheet stack NSS on the second device region AR2 and the inter-region insulating pattern 350C. The detailed configuration of the gate line 360 is substantially the same as that of the gate line 160 described with reference to FIG. 1 and FIGS. 2A through 2C.

In an implementation, the gate line 360 may have different stack structures between or on the first device region AR1 and the second device region AR2. In an implementation, similarly to the description of the gate line 160A that has been given with reference to FIG. 3, the gate line 360 on the first device region AR1 may include the second work function metal film ML2 contacting the gate dielectric film 152 and the gap-fill metal film ML3 contacting the second work function metal film ML2. On a portion of the second device region AR2, the gate line 360 may include the first work function metal film ML1 contacting the gate dielectric film 152 and the second work function metal film ML2 contacting the first work function metal film ML1. On another portion of the second device region AR2, the gate line 360 may include the first work function metal film ML1 contacting the gate dielectric film 152, the second work function metal film ML2 contacting the first work function metal film ML1, and the gap-fill metal film ML3 contacting the second work function metal film ML2. The detailed configurations of the first work function metal film ML1, the second work function metal film ML2, and the gap-fill metal film ML3 have been described above with reference to FIG. 3.

Figure 7:
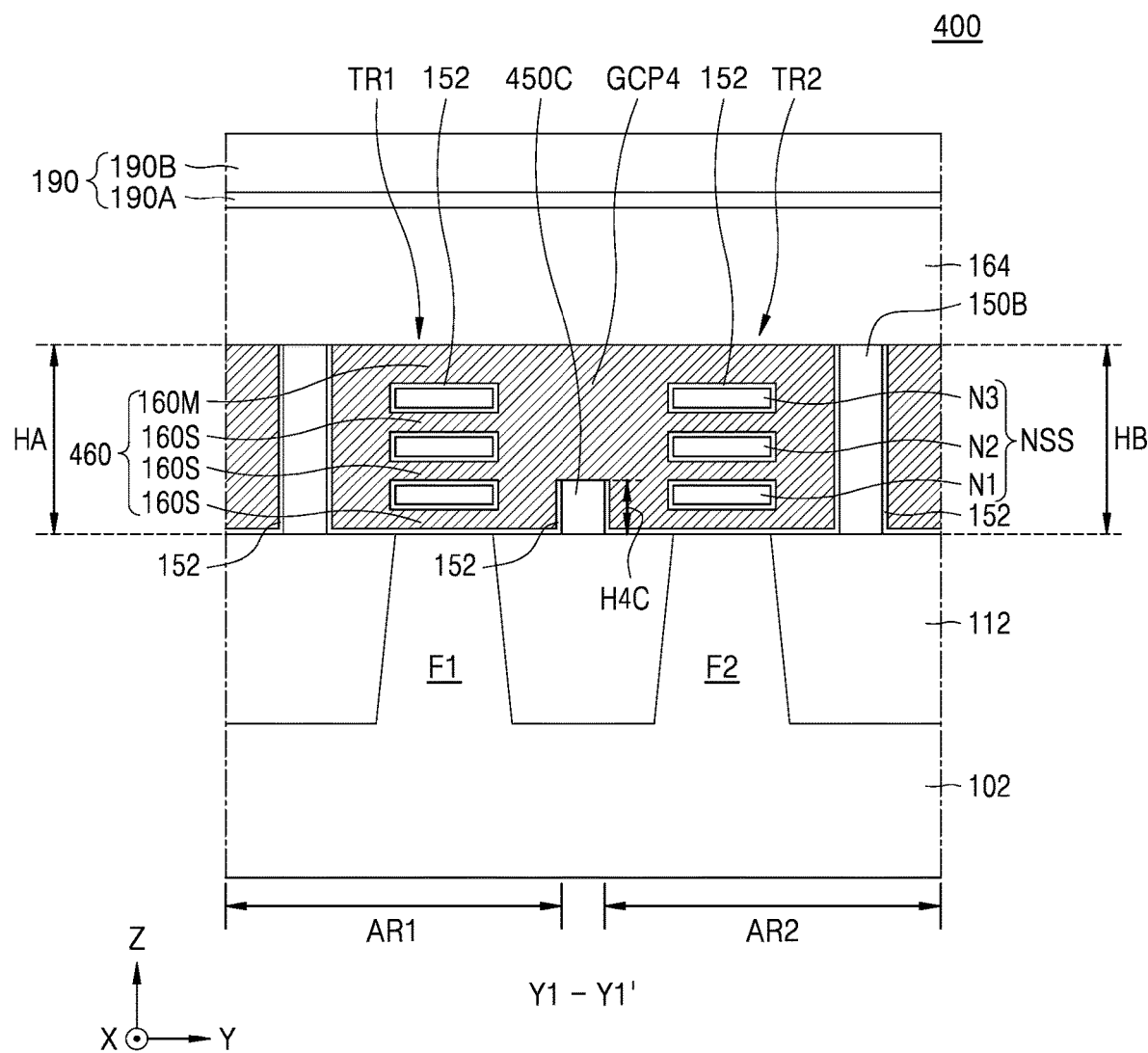
FIG. 7 is a cross-sectional view of an integrated circuit device according to some embodiments.

FIG. 7 is a cross-sectional view of an integrated circuit device 400 according to some embodiments. FIG. 7 illustrates a partial configuration of a portion corresponding to the cross-section taken along the line Y1-Y1' in FIG. 1.

Referring to FIG. 7, the integrated circuit device 400 may have substantially the same configuration as the integrated circuit device 100 described with reference to FIG. 1 and FIGS. 2A through 2C. In an implementation, the integrated circuit device 400 may include a gate line 460, which extends lengthwise on the first device region AR1 and the second device region AR2 in the second horizontal direction (the Y direction), and an inter-region insulating pattern 450C on the isolation film 112 between the first device region AR1 and the second device region AR2. A height H4C of the inter-region insulating pattern 450C in the vertical direction (the Z direction) may be less than each of the heights HA and HB of the respective first and second gate cut insulating patterns 150A and 150B in the vertical direction (the Z direction).

Similarly to the description of the gate line 160 that has been given with reference to FIG. 1 and FIGS. 2A through 2C, the gate line 460 may include the main gate portion 160M and the sub gate portions 160S and may have a length limited in the second horizontal direction (the Y direction) by the first and second gate cut insulating patterns 150A and 150B. The gate line 460 may have a structure, in which only a lower portion is partially cut by the inter-region insulating pattern 450C on the isolation film 112. The gate line 460 may include a gate connecting portion GCP4 covering the top surface of the inter-region insulating pattern 450C. A portion of the gate line 460 on the first device region AR1 may be integrally connected to a portion of the gate line 460 on the second device region AR2 through the gate connecting portion GCP4.

A length or height of the gate connecting portion GCP4 may be greater than the length or height of the inter-region insulating pattern 450C in the vertical direction (the Z direction). In an implementation, a level of the topmost surface of the inter-region insulating pattern 450C may be lower than a level of the topmost surface of the nanosheet stack NSS. In an implementation, at least one of the first, second, and third nanosheets N1, N2, and N3 of the nanosheet stack NSS may be at a higher level than the topmost surface of the inter-region insulating pattern 450C.

The detailed configuration of the gate line 460 is substantially the same as that of the gate line 160 described with reference to FIG. 1 and FIGS. 2A through 2C. In an implementation, the gate line 460 may have different stack structures between or on the first device region AR1 and the second device region AR2. In an implementation, similarly to the description of the gate line 160A that has been given with reference to FIG. 3, the gate line 460 on the first device region AR1 may include the second work function metal film ML2 contacting the gate dielectric film 152 and the gap-fill metal film ML3 contacting the second work function metal film ML2. On a portion of the second device region AR2, the gate line 460 may include the first work function metal film ML1 contacting the gate dielectric film 152 and the second work function metal film ML2 contacting the first work function metal film ML1. On another portion of the second device region AR2, the gate line 460 may include the first work function metal film ML1 contacting the gate dielectric film 152, the second work function metal film ML2 contacting the first work function metal film ML1, and the gap-fill metal film ML3 contacting the second work function metal film ML2. The detailed configurations of the first work function metal film ML1, the second work function metal film ML2, and the gap-fill metal film ML3 have been described above with reference to FIG. 3.

Figure 8:
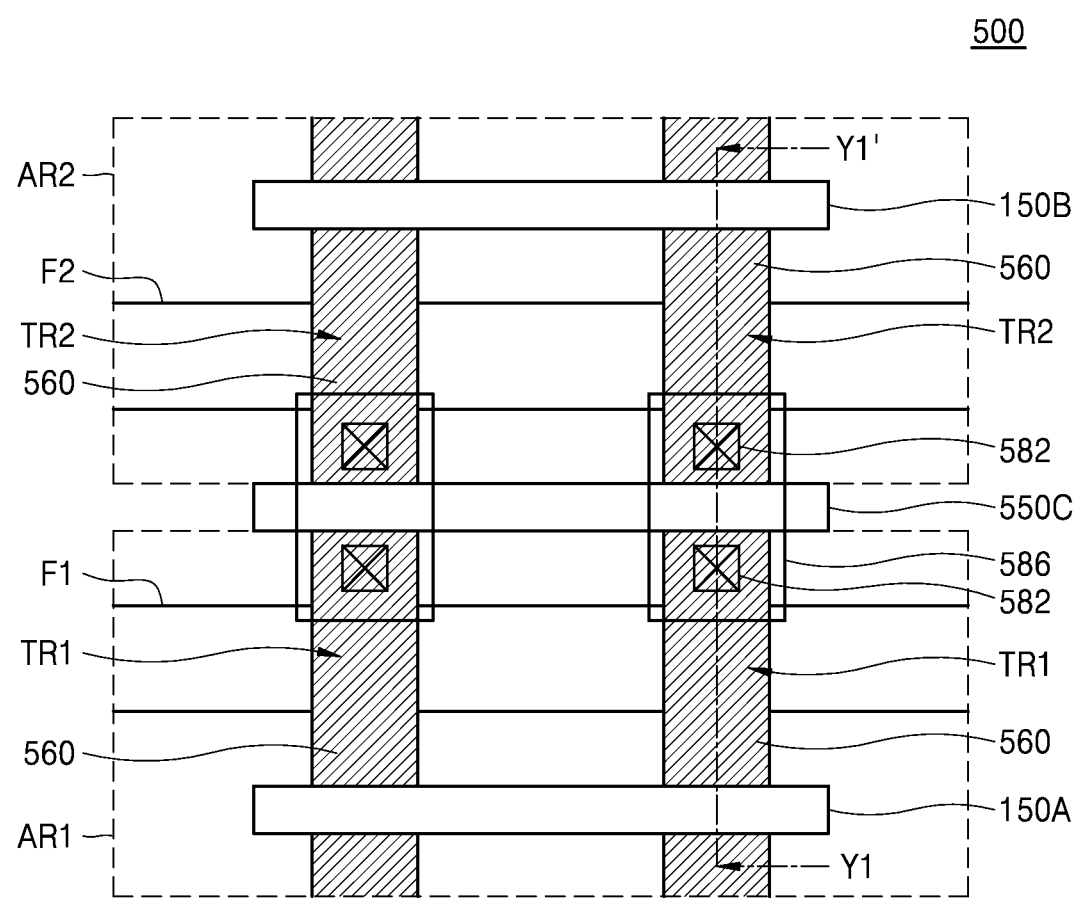
FIG. 8 is a plane layout diagram of partial configurations of an integrated circuit device, according to embodiments.
Figure 9:
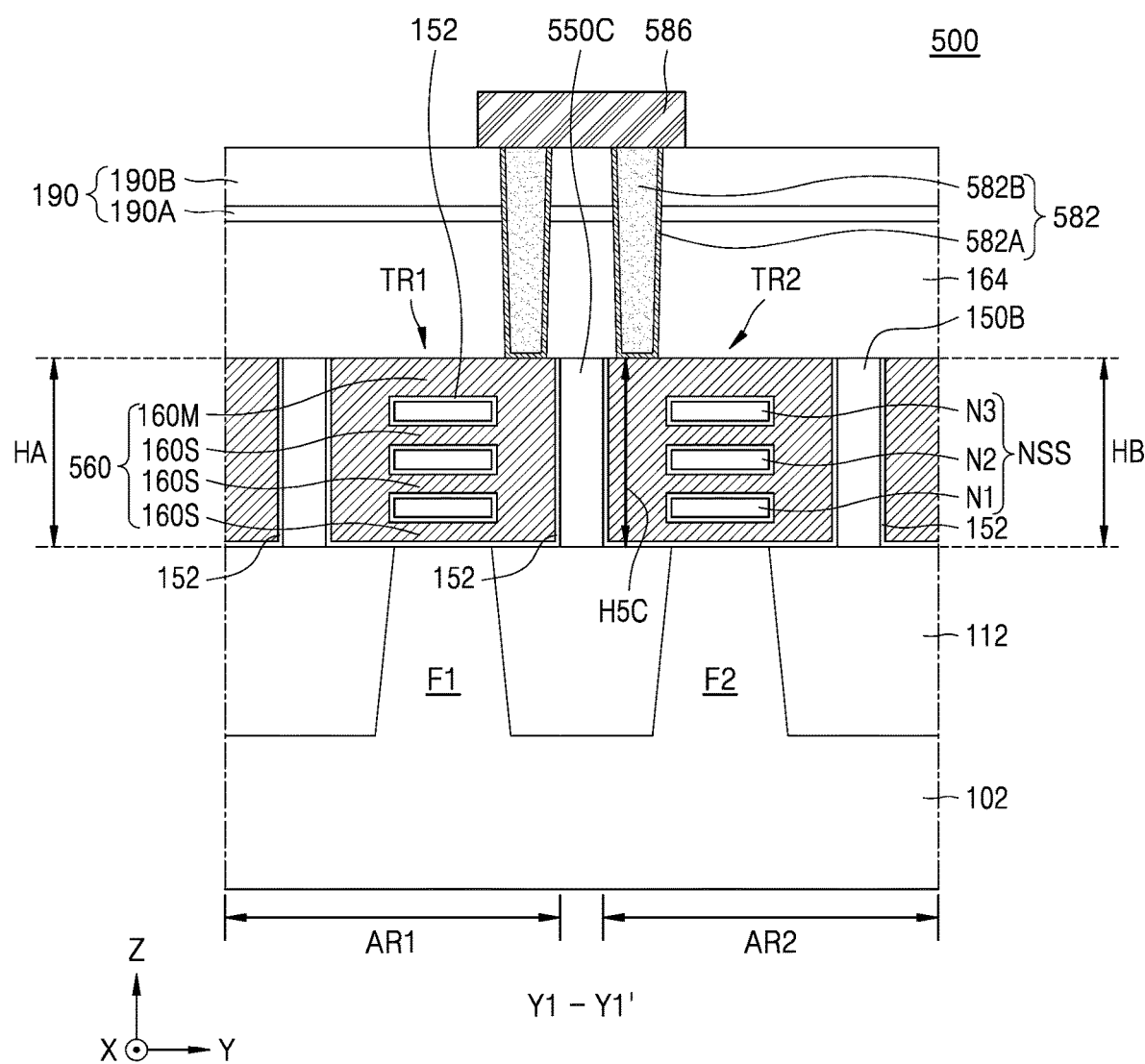
FIG. 9 is a cross-sectional view of a partial configuration of a cross-section taken along line Y1-Y1' in FIG. 8.

FIG. 8 is a plane layout diagram of partial configurations of an integrated circuit device 500, according to embodiments. FIG. 9 is a cross-sectional view showing a partial configuration of a cross-section taken along line Y1-Y1' in FIG. 8.

Referring to FIGS. 8 and 9, the integrated circuit device 500 may have substantially the same configuration as the integrated circuit device 100 described with reference to FIG. 1 and FIGS. 2A through 2C. In an implementation, the integrated circuit device 500 may include a plurality of gate lines 560 on the first and second fin active regions AR1 and F2 on the first and second device regions AR1 and AR2 and an inter-region insulating pattern 550C on the isolation film 112 between the first device region AR1 and the second device region AR2. A height H5C of the inter-region insulating pattern 550C in the vertical direction (the Z direction) may be the same as or similar to each of the heights HA and HB of the respective first and second gate cut insulating patterns 150A and 150B in the vertical direction (the Z direction). The inter-region insulating pattern 550C may include a silicon nitride film.

Similarly to the description of the gate line 160 that has been given with reference to FIG. 1 and FIGS. 2A through 2C, each of the gate lines 560 may include the main gate portion 160M and the sub gate portions 160S. In an implementation, the length of a gate line 560 on the first device region AR1 in the second horizontal direction (the Y direction) may be limited by the first gate cut insulating pattern 150A and the inter-region insulating pattern 550C. The length of a gate line 560 on the second device region AR2 in the second horizontal direction (the Y direction) may be limited by the second gate cut insulating pattern 150B and the inter-region insulating pattern 550C.

Among the gate lines 560, a pair of gate lines 560, which are respectively on the first device region AR1 and the second device region AR2 and arranged in a line (e.g., aligned) in the second horizontal direction (the Y direction), may be separated from each other in the second horizontal direction (the Y direction) with the inter-region insulating pattern 550C therebetween. The pair of gate lines 560 may not include a portion that covers the top surface of the inter-region insulating pattern 550C. In an implementation, the level of the topmost surface of the inter-region insulating pattern 550C may be the same as or similar to the level of the topmost surface of each gate line 560.

The detailed configuration of the gate line 560 is substantially the same as that of the gate line 160 described with reference to FIG. 1 and FIGS. 2A through 2C.

In the integrated circuit device 500, a pair of gate lines 560, which are arranged in a line in the second horizontal direction (the Y direction) and separated from each other with the inter-region insulating pattern 550C therebetween in the second horizontal direction (the Y direction), may be electrically connected to each other. For this configuration, the integrated circuit device 500 may include a pair of gate contacts 582 respectively connected to the gate lines 560 and a conductive line 586 connected to the gate contacts 582. The gate lines 560 may be electrically connected to each other through the gate contacts 582 and the conductive line 586.

Each of the gate contacts 582 may include a conductive barrier film 582A and a metal plug 582B. The conductive barrier film 582A may include Ti, Ta, TiN, TaN, or a combination thereof, and the metal plug 582B may include W, Co, Cu, Ru, Mn, or a combination thereof. The conductive line 586 may include Ti, Ta, TiN, TaN, W, Co, Cu, Ru, Mn, or a combination thereof. In an implementation, the material and shape of each of the gate contacts 582 and the conductive line 586 may be variously changed or modified.

Figure 10:
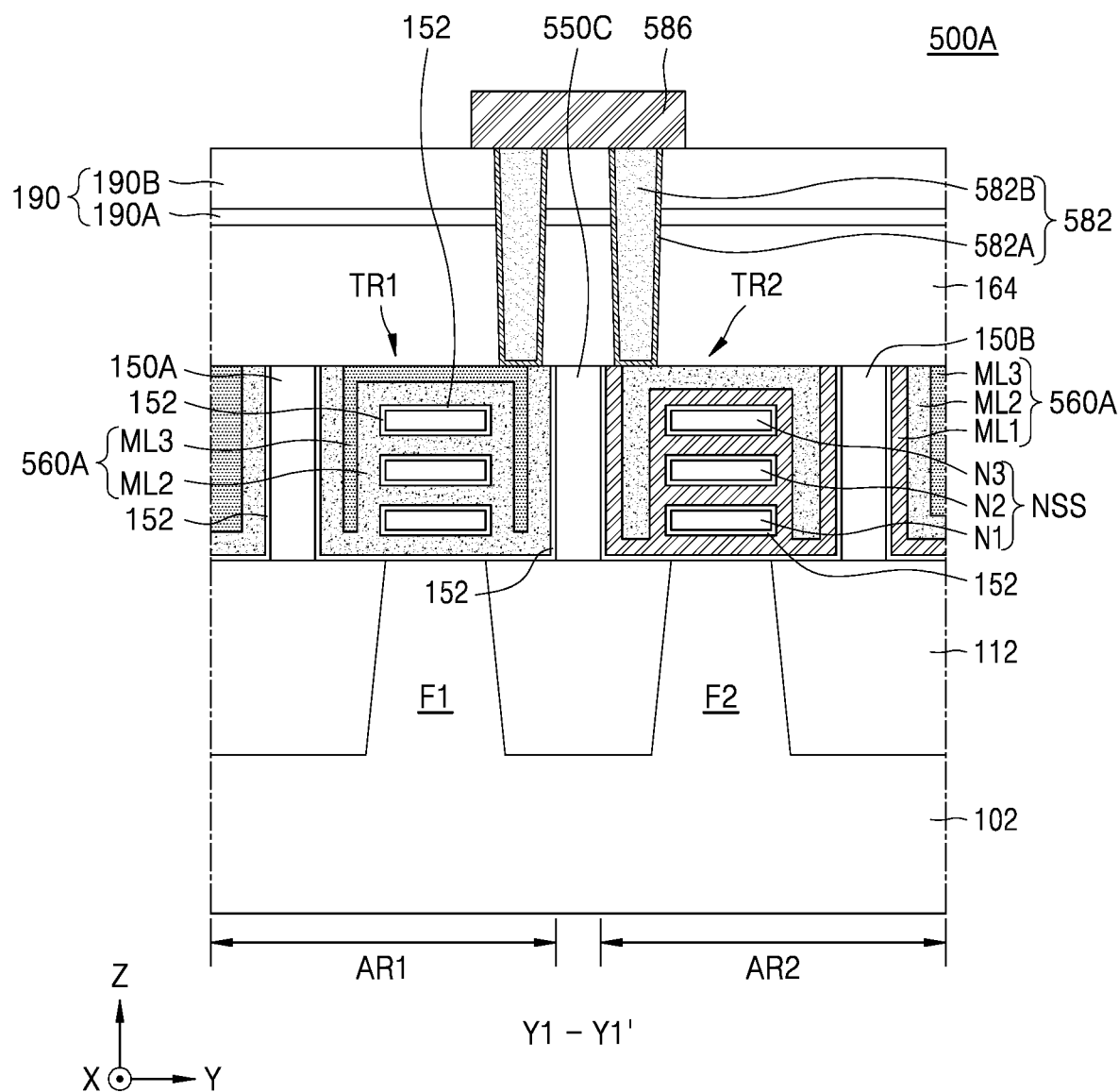
FIG. 10 is a cross-sectional view of an integrated circuit device according to some embodiments.

FIG. 10 is a cross-sectional view of an integrated circuit device 500A according to some embodiments. FIG. 10 illustrates a partial configuration of a portion corresponding to the cross-section taken along the line Y1-Y1' in FIG. 8.

Referring to FIG. 10, the integrated circuit device 500A may have substantially the same configuration as the integrated circuit device 500 described with reference to FIGS. 8 and 9. In an implementation, the integrated circuit device 500A may include a plurality of gate lines 560A. The gate lines 560A may have substantially the same configuration as the gate lines 560 described with reference to FIGS. 8 and 9. In an implementation, gate lines 560A on the first device region AR1 may have a different stack structure than gate lines 560A on the second device region AR2.

Each of the gate lines 560A may have a stack structure, and may include at least two layers selected from a first work function metal film ML1, a second work function metal film ML2, and a gap-fill metal film ML3. A gate line 560A on the first device region AR1 may not include the first work function metal film ML1. In an implementation, the gate line 560A on the first device region AR1 may include the second work function metal film ML2 contacting the gate dielectric film 152 and the gap-fill metal film ML3 contacting the second work function metal film ML2. Some gate lines 560A on the second device region AR2 may include the first work function metal film ML1 contacting the gate dielectric film 152 and the second work function metal film ML2 contacting the first work function metal film ML1. Other gate lines 560A on the second device region AR2 may include the first work function metal film ML1 contacting the gate dielectric film 152, the second work function metal film ML2 contacting the first work function metal film ML1, and the gap-fill metal film ML3 contacting the second work function metal film ML2. The detailed configurations of the first work function metal film ML1, the second work function metal film ML2, and the gap-fill metal film ML3 have been described above with reference to FIG. 3.

Each of the integrated circuit devices 100, 100A, 100B, 200, 300, 400, 500, and 500A described with reference to FIGS. 1 through 10 includes the inter-region insulating pattern 150C, 250C, 350C, 450C, or 550C on the isolation film 112 between the first device region AR1 and the second device region AR2. Each of the inter-region insulating patterns 150C, 250C, 350C, 450C, and 550C may help remove or reduce the probability of occurrence of defective processes during the manufacture of the integrated circuit device 100, 100A, 100B, 200, 300, 400, 500, or 500A and may contribute to the enhancement of the performance and reliability of the NMOS transistor TR1 in the first device region AR1 and the PMOS transistor TR2 in the second device region AR2.

Figure 11A:
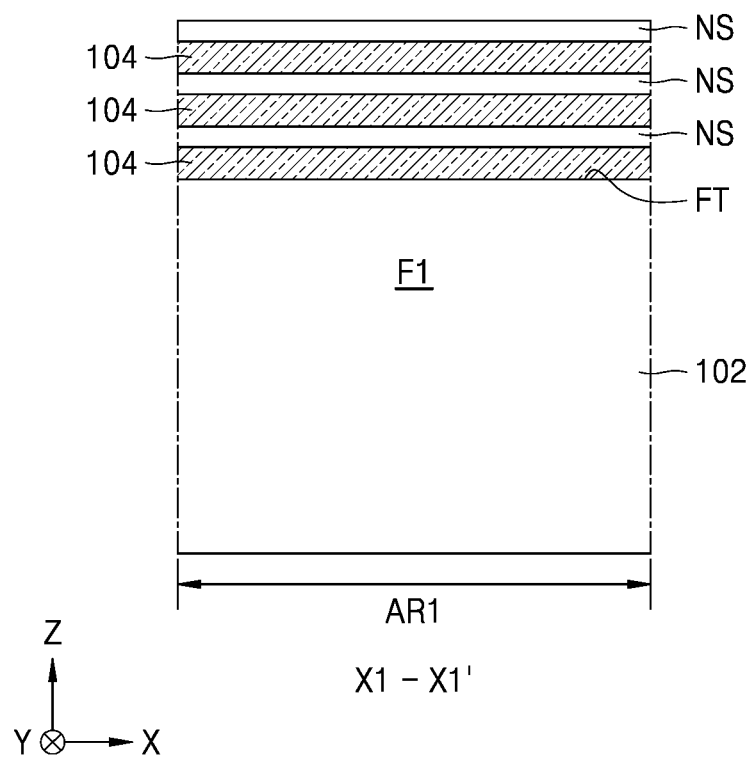
FIGS. 11A through 25 are cross-sectional views of stages in a method of manufacturing an integrated circuit device, according to embodiments, in which FIGS. 11A, 12A, . . . , and 17A show a partial configuration of a portion corresponding to the cross-section taken along the line X1-X1' in FIG. 1, FIGS. 11B, 12B, . . . , and 17B show a partial configuration of a portion corresponding to the cross-section taken along the line X2-X2' in FIG. 1, and FIGS. 11C, 12C, . . . , and 17C
Figure 11B:
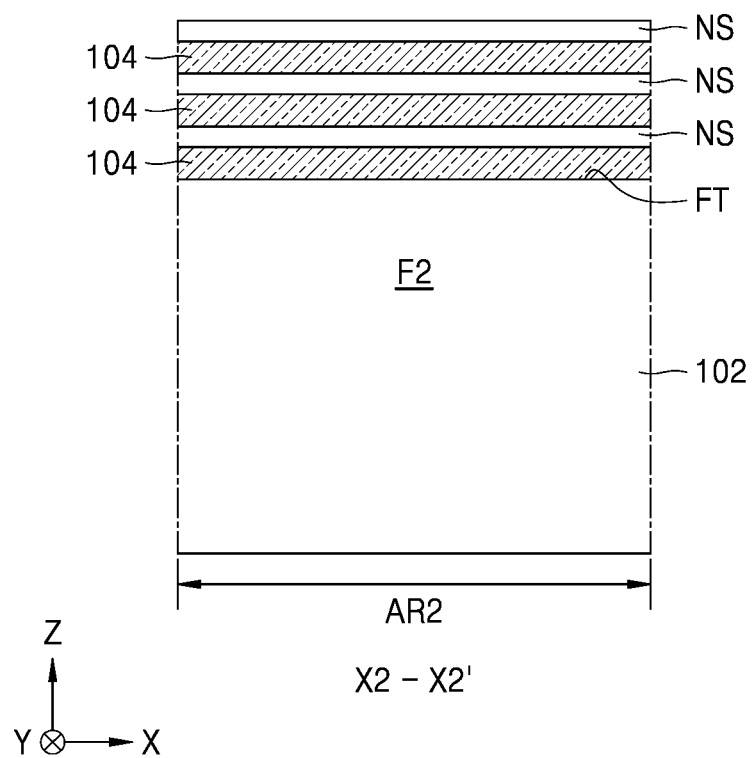
Figure 11C:
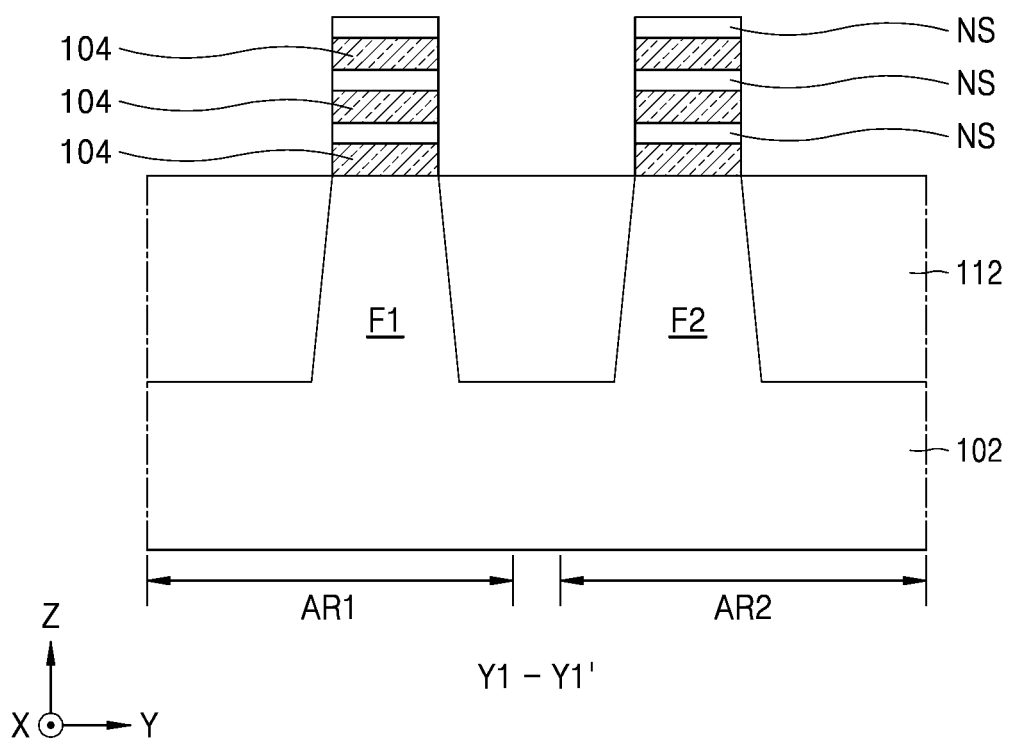
Figure 12A:
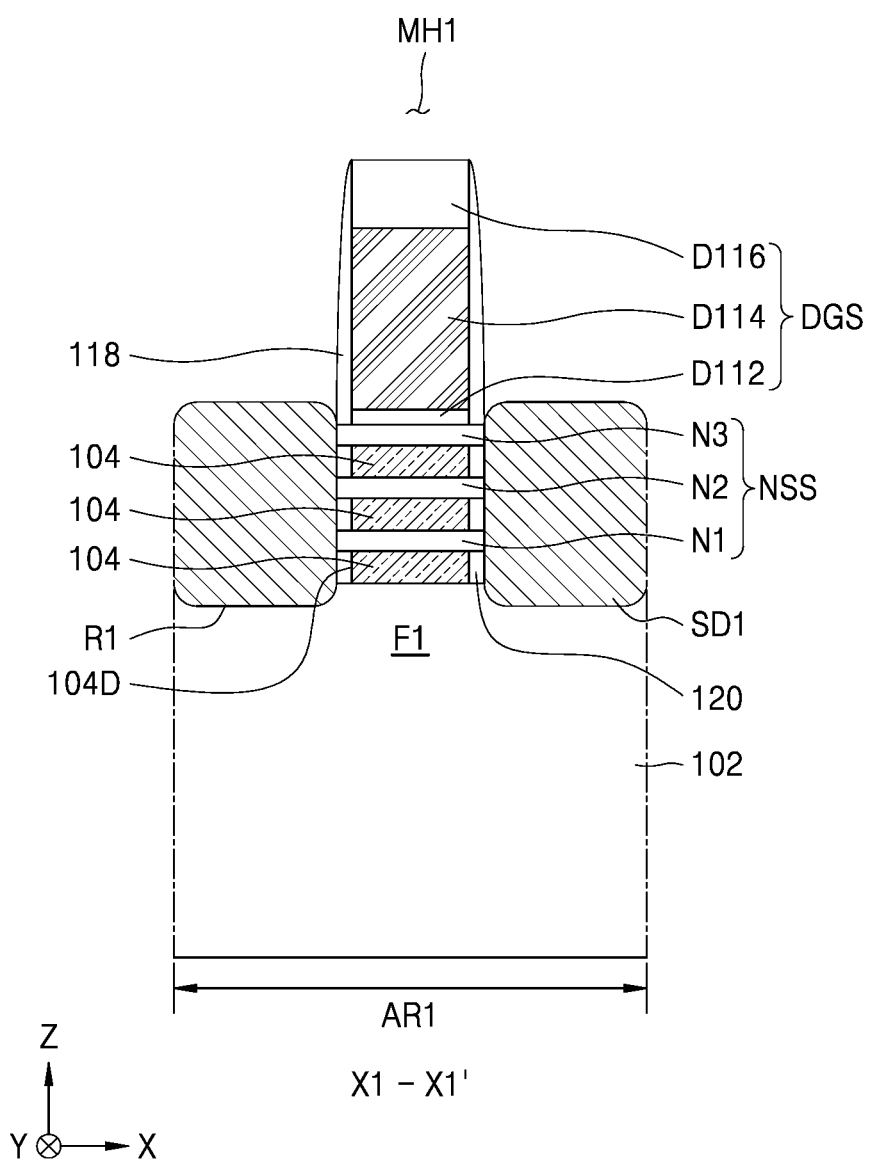
Figure 12B:
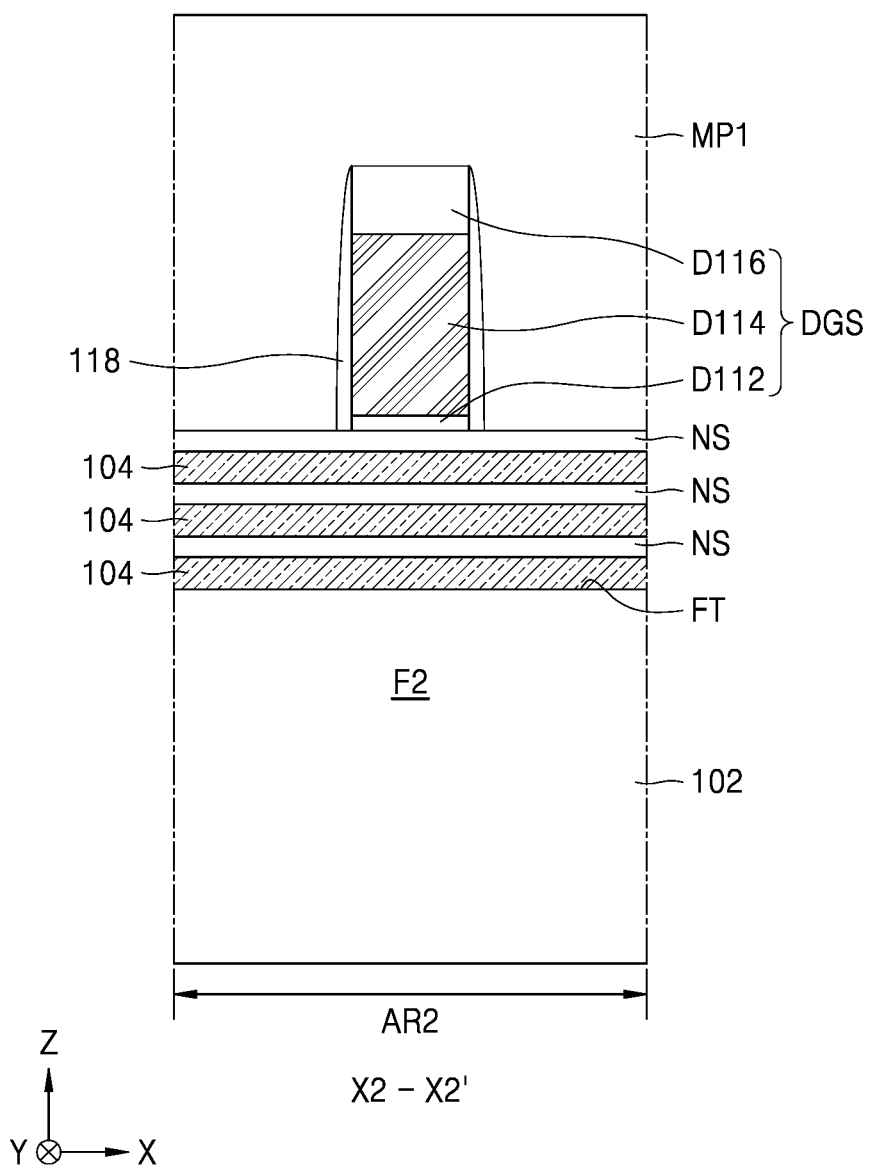
Figure 12C:
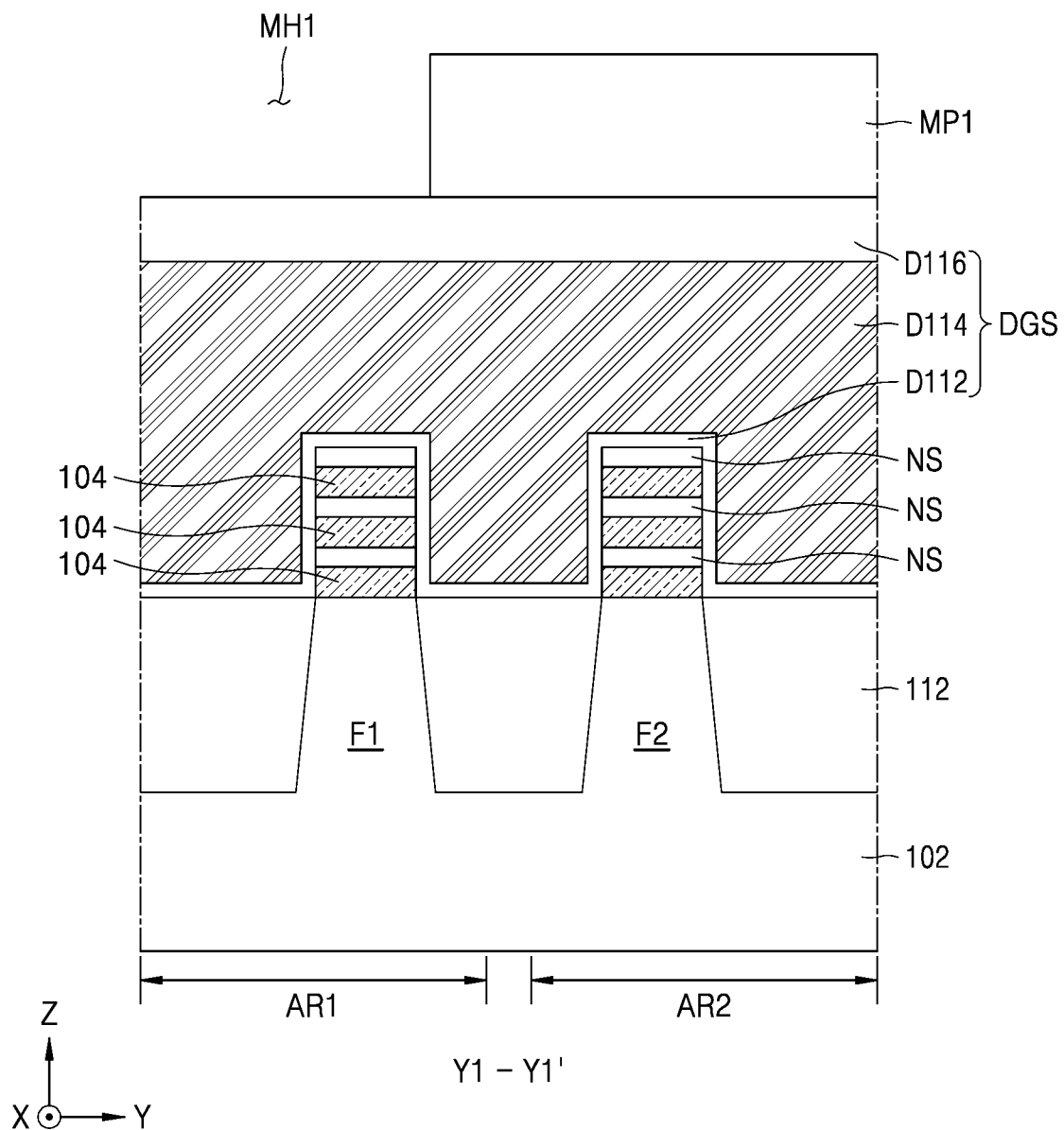

FIGS. 11A through 25 are cross-sectional views of stages in a method of manufacturing an integrated circuit device, according to embodiments, in which FIGS. 11A, 12A, . . . , and 17A show a partial configuration of a portion corresponding to the cross-section taken along the line X1-X1' in FIG. 1, FIGS. 11B, 12B, . . . , and 17B show a partial configuration of a portion corresponding to the cross-section taken along the line X2-X2' in FIG. 1, and FIGS. 11C, 12C, . . . , and 17C and FIGS. 18 through 25 show a partial configuration of a portion corresponding to the cross-section taken along the line Y1-Y1' in FIG. 1. Example methods of manufacturing the integrated circuit devices 100 and 100B illustrated in FIGS. 1 through 3 will be described with reference to FIGS. 11A through 25 below. In FIGS. 1 through 3 and FIGS. 11A through 25, like reference numerals denote like elements, and detailed descriptions thereof may be omitted.

Referring to FIGS. 11A through 11C, a plurality of sacrificial semiconductor layers 104 and a plurality of nanosheet semiconductor layers NS may be alternately stacked on the substrate 102. Thereafter, the first fin active region F1 and the second fin active region F2, which protrude above the substrate 102 in the vertical direction (the Z direction) and extend in the first horizontal direction (the X direction) to be parallel with each other, by partially etching each of the sacrificial semiconductor layers 104, the nanosheet semiconductor layers NS, and the substrate 102; and the isolation film 112, which covers both side walls of a lower portion of each of the first and second fin active regions F1 and F2, may be formed. The level of the top surface of the isolation film 112 may be the same as or similar to the level of the fin top FT of each of the first and second fin active regions F1 and F2.

A stack structure of the sacrificial semiconductor layers 104 and the nanosheet semiconductor layers NS may remain on the fin top FT of each of the first fin active region F1 on the first device region AR1 and the second fin active region F2 on the second device region AR2.

The sacrificial semiconductor layers 104 may include a semiconductor material having a different etch selectivity than a semiconductor material of the nanosheet semiconductor layers NS. In an implementation, the nanosheet semiconductor layers NS may include an Si layer, and the sacrificial semiconductor layers 104 may include an SiGe layer. In an implementation, the sacrificial semiconductor layers 104 may have a constant Ge content. The SiGe layer of the sacrificial semiconductor layers 104 may have a constant Ge content of about 5 at % to about 60 at %, e.g., about 10 at % to about 40 at %. The Ge content of the SiGe layer of the sacrificial semiconductor layers 104 may be variously changed as desired.

Referring to FIGS. 12A through 12C, a plurality of dummy gate structures DGS and outer insulating spacers 118 respectively covering opposite side walls of each of the dummy gate structures DGS may be formed on the stack structure of the sacrificial semiconductor layers 104 and the nanosheet semiconductor layers NS. The dummy gate structures DGS may continuously extend lengthwise in the second horizontal direction (the Y direction) at positions corresponding to the gate lines 160 illustrated in FIG. 1.

Each of the dummy gate structures DGS may have a structure, in which an oxide film D112, a dummy gate layer D114, and a capping layer D116 are sequentially stacked. In an implementation, the dummy gate layer D114 may include a polysilicon film, and the capping layer D116 may include a silicon nitride film.

Thereafter, a first mask pattern MP1 having a first opening MH1 exposing the first device region AR1 may be formed on the resultant structure including a dummy gate structure DGS and the outer insulating spacers 118. A plurality of nanosheet stacks NSS may be formed from the nanosheet semiconductor layers NS on the first device region AR1 by partially removing each of the sacrificial semiconductor layers 104 and the nanosheet semiconductor layers NS using the dummy gate structure DGS and the outer insulating spacers 118 as etch masks on the first device region AR1 in the state where the second device region AR2 is covered with the first mask pattern MP1. Each of the nanosheet stacks NSS may include the first, second, and third nanosheets N1, N2, and N3. A plurality of first recesses R1 may be formed in an upper portion of the first fin active region F1 by etching some portions of the first fin active region F1, which are exposed among the nanosheet stacks NSS on the first device region AR1. To form the first recesses R1, the first fin active region F1 may be etched using dry etching, wet etching, or a combination thereof.

Thereafter, a plurality of indents 104D may be formed among the first, second, and third nanosheets N1, N2, and N3 and the first fin active region F1 by selectively removing portions of the sacrificial semiconductor layers 104 exposed by the first recesses R1 at opposite sides of each nanosheet stack NSS, and a plurality of inner insulating spacers 120 filling the indents 104D may be formed. The indents 104D may be formed by selectively etching the portions of the sacrificial semiconductor layers 104 using a difference in etch selectivity between the sacrificial semiconductor layers 104 and the first, second, and third nanosheets N1, N2, and N3. The inner insulating spacers 120 may be formed using atomic layer deposition (ALD), chemical vapor deposition (CVD), oxidation, or a combination thereof.

Thereafter, a plurality of first source/drain regions SD1 may be formed on the first fin active region F1 at opposite sides of each of the nanosheet stacks NSS. The first source/drain regions SD1 may be formed by epitaxially growing a semiconductor material from a surface of the first fin active region F1 exposed at the bottoms of the first recesses R1 and the side walls of the first, second, and third nanosheets N1, N2, and N3. In an implementation, the first source/drain regions SD1 may be formed by performing low-pressure CVD (LPCVD), selective epitaxial growth (SEG), or cyclic deposition and etching (CDE) using source materials including an elemental semiconductor precursor. In an implementation, the first source/drain regions SD1 may include an Si layer doped with an n-type dopant. Silane ($SiH_4$), disilane ($Si_2H_6$), trisilane ($Si_3H_8$), dichlorosilane ($SiH_2Cl_2$), or the like may be used as an Si source to form the first source/drain regions SD1. The n-type dopant may include P, As, or Sb.

Figure 13A:
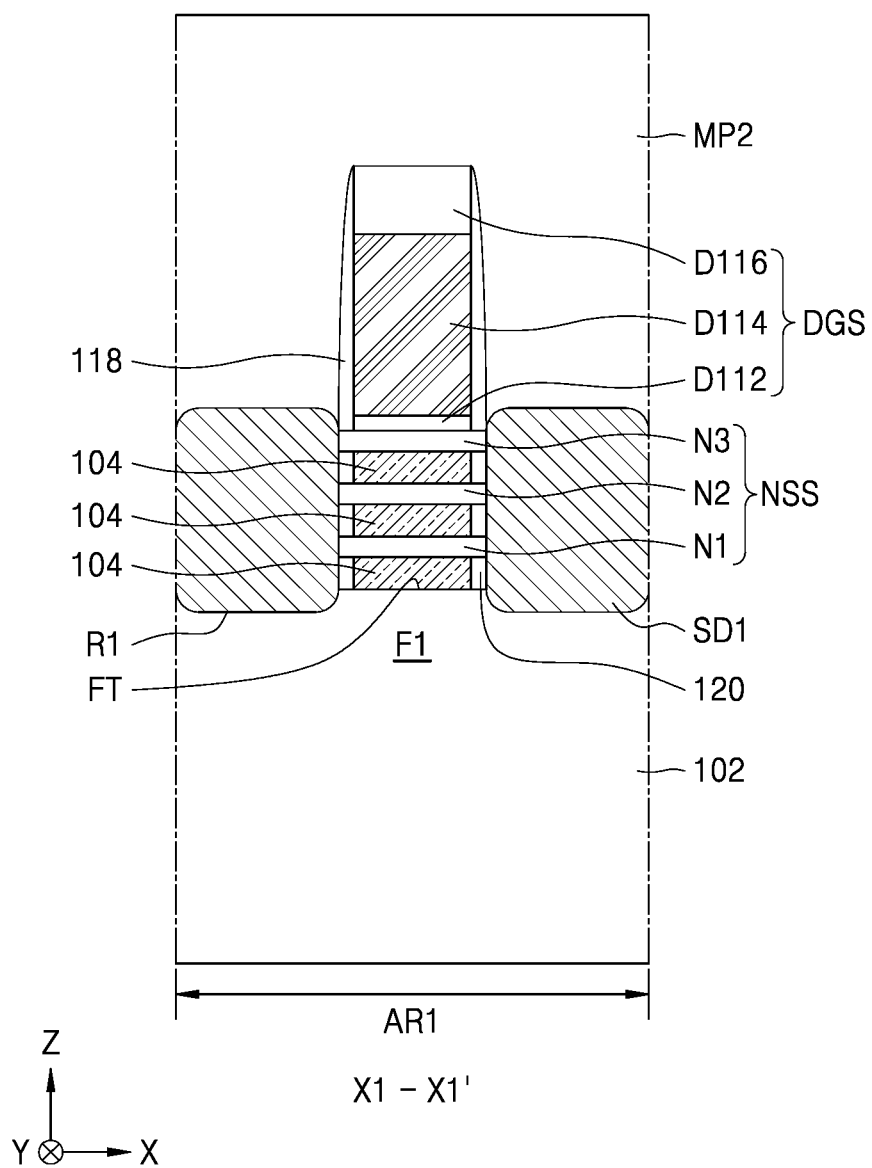
Figure 13B:
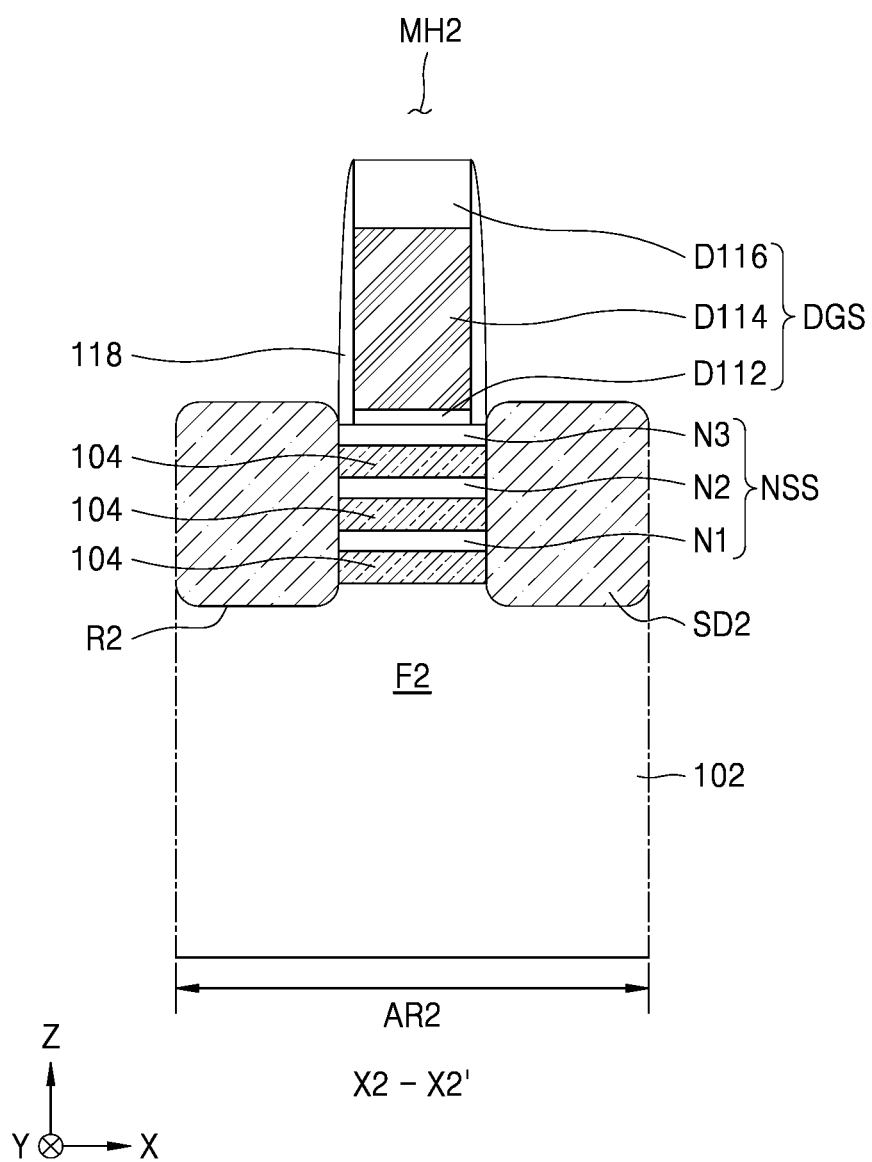
Figure 13C:
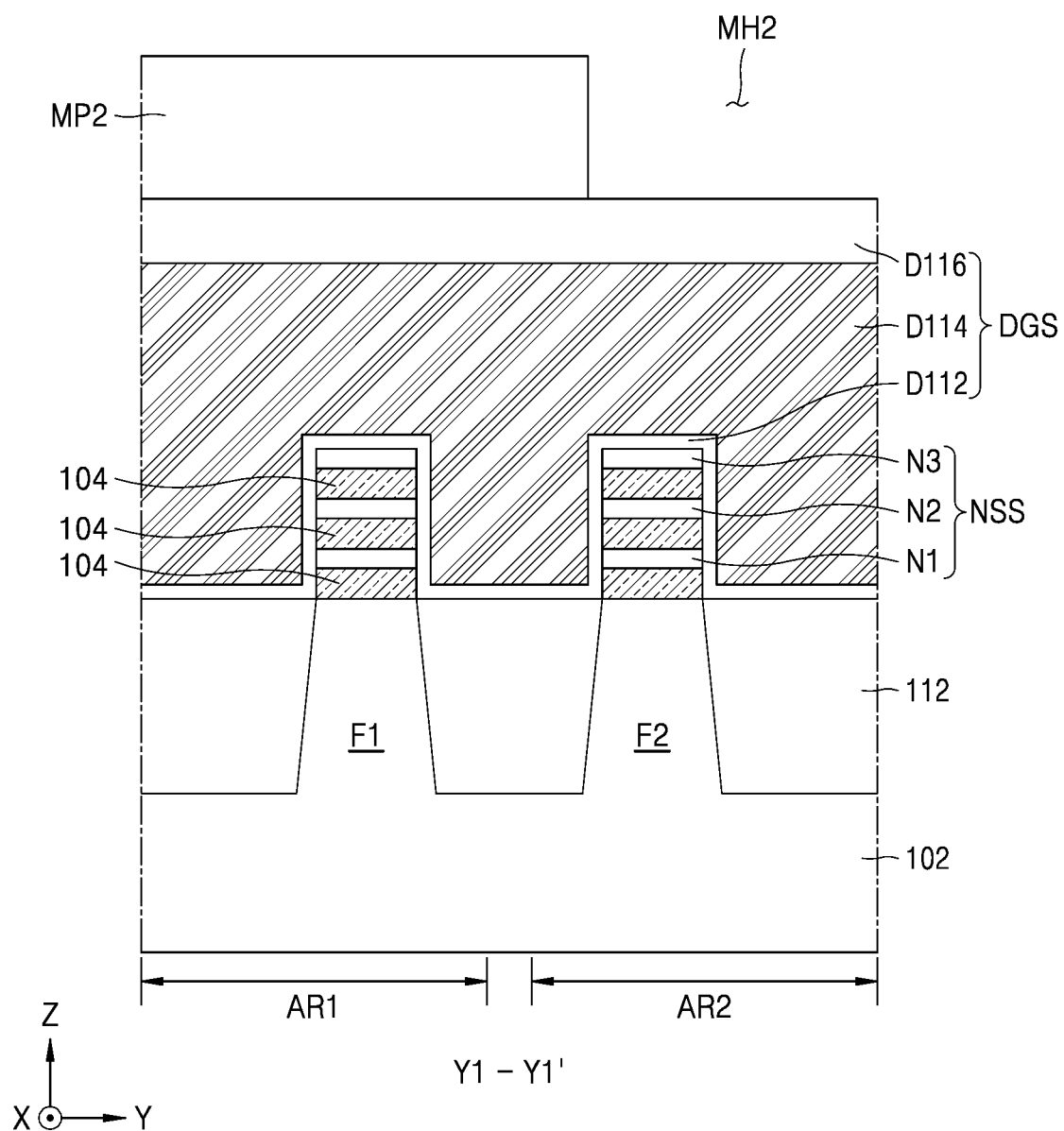

Referring to FIGS. 13A through 13C, after the first mask pattern MP1 is removed from the resultant structure of FIGS. 12A through 12C, a second mask pattern MP2 having a second opening MH2 exposing the second device region AR2 may be formed. A plurality of nanosheet stacks NSS may be formed from the nanosheet semiconductor layers NS on the second device region AR2 by partially removing each of the sacrificial semiconductor layers 104 and the nanosheet semiconductor layers NS using the dummy gate structure DGS and the outer insulating spacers 118 as etch masks in the second device region AR2 in the state where the first device region AR1 is covered with the second mask pattern MP2. Each of the nanosheet stacks NSS may include the first, second, and third nanosheets N1, N2, and N3.

A plurality of second recesses R2 may be formed in an upper portion of the second fin active region F2 by etching the second fin active region F2 exposed among the nanosheet stacks NSS on the second device region AR2. A method of forming the second recesses R2 is the same as the method of forming the first recesses R1, which has been described with reference to FIGS. 12A through 12C.

Thereafter, a plurality of second source/drain regions SD2 may be formed on the second fin active region F2 at opposite sides of each of the nanosheet stacks NSS. Similarly to the description of the first source/drain regions SD1, which has been given with reference to FIGS. 12A through 12C, the second source/drain regions SD2 may be formed by epitaxially growing a semiconductor material from a surface of the second fin active region F2 exposed at the bottoms of the second recesses R2 and the side walls of the first, second, and third nanosheets N1, N2, and N3. In an implementation, the second source/drain regions SD2 may include an SiGe layer doped with a p-type dopant. An Si source and a Ge source may be used to form the second source/drain regions SD2. Silane ($SiH_4$), disilane ($Si_2H_6$), trisilane ($Si_3H_8$), dichlorosilane ($SiH_2Cl_2$), or the like may be used as the Si source. Germane ($GeH_4$), digermane ($Ge_2H_6$), trigermane ($Ge_3H_8$), tetragermane ($Ge_4H_{10}$), dichlorogermane ($Ge_2H_2Cl_2$), or the like may be used as the Ge source. The p-type dopant may include B or Ga.

Figure 14A:
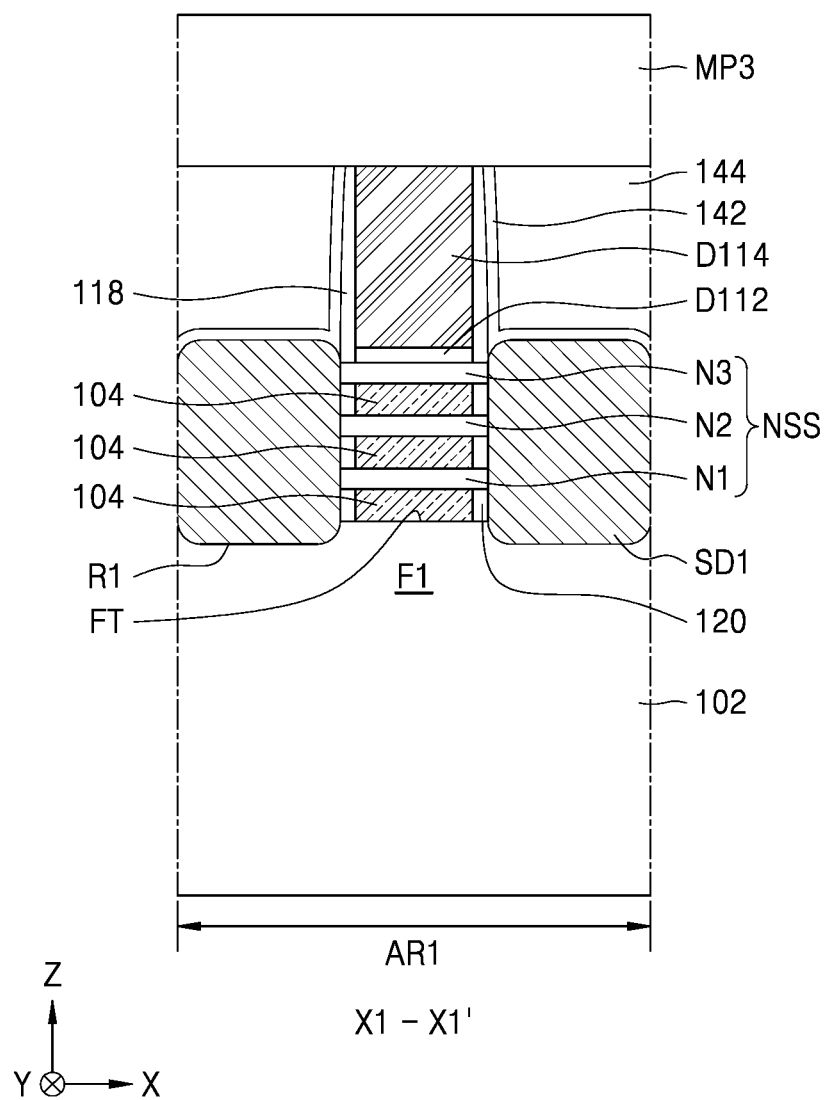
Figure 14B:
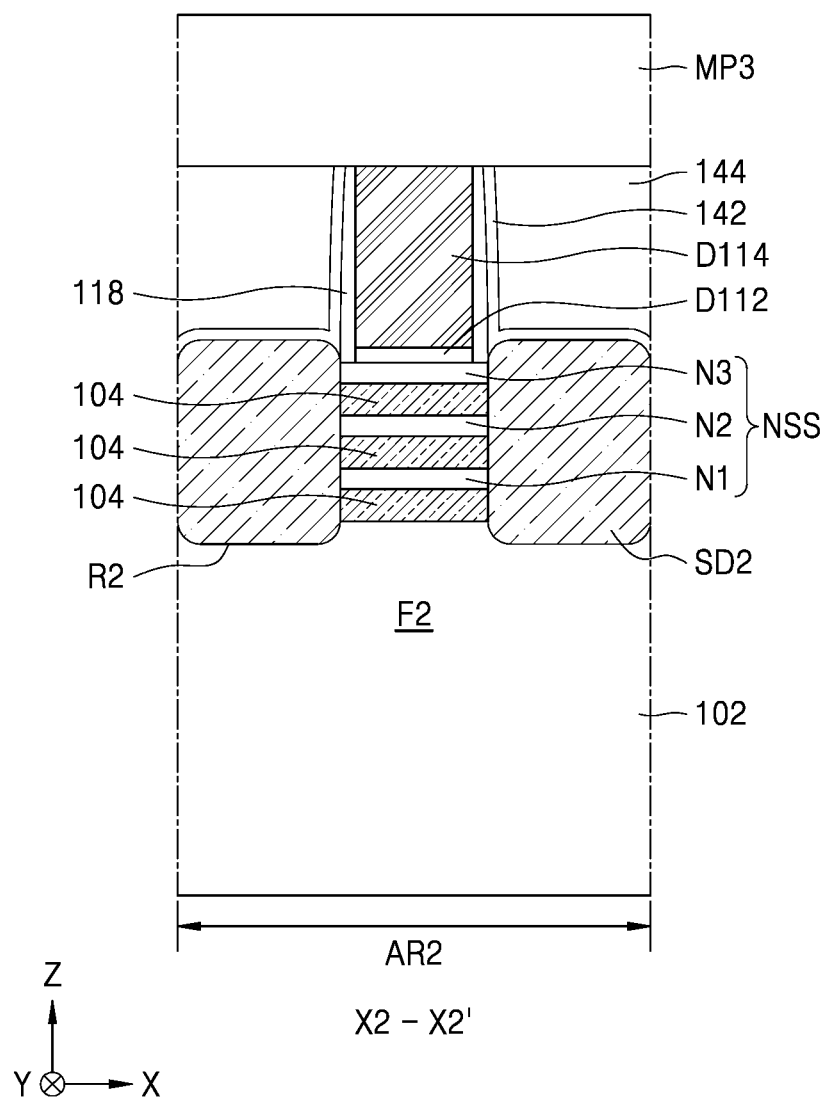
Figure 14C:
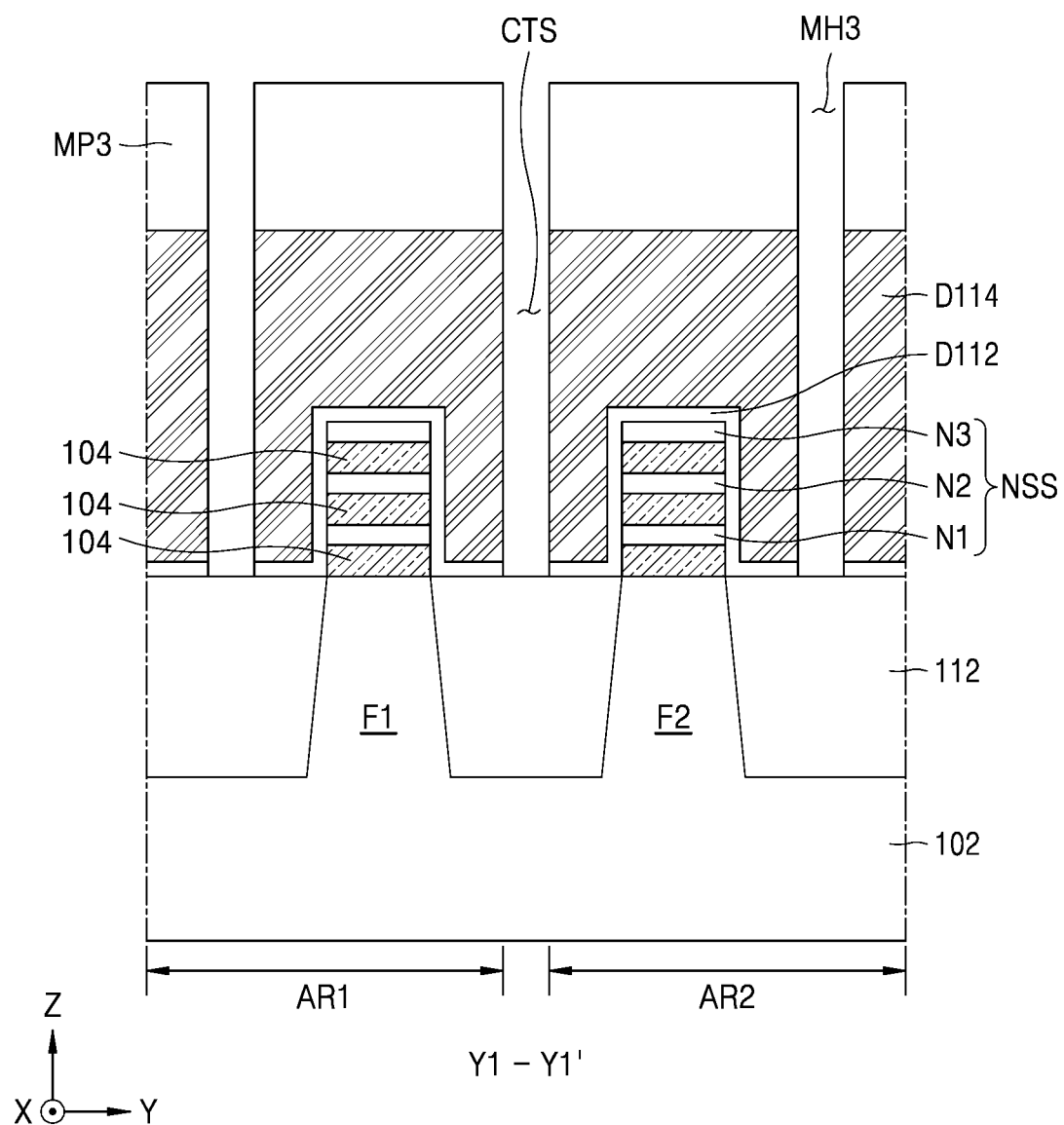

Referring to FIGS. 14A through 14C, after the second mask pattern MP2 is removed from the resultant structure of FIGS. 13A through 13C, the insulating liner 142, which covers the surface of each of the first and second source/drain regions SD1 and SD2 and the surface of each of the outer insulating spacers 118, may be formed, and the intergate insulating film 144 may be formed on the insulating liner 142. Thereafter, the top surface of the dummy gate layer D114 may be exposed by removing the capping layer D116 and planarizing the outer insulating spacers 118, the insulating liner 142, and the intergate insulating film 144.

Thereafter, a third mask pattern MP3, which covers the dummy gate layer D114, the insulating liner 142, and the intergate insulating film 144, may be formed. The third mask pattern MP3 may have a plurality of third openings MH3, each of which exposes a portion of the dummy gate layer D114 and a portion of each of the outer insulating spacers 118, the insulating liner 142, and the intergate insulating film 144, which are adjacent to exposed portion of the dummy gate layer D114. The respective positions of the third openings MH3 of the third mask pattern MP3 may respectively correspond to the respective positions of the first and second gate cut insulating patterns 150A and 150B and the inter-region insulating pattern 150C in FIG. 1.

The isolation film 112 may be exposed by the third openings MH3 by selectively performing anisotropic etching on a portion of the dummy gate layer D114 exposed by the third openings MH3 and etching the oxide film D112, which is exposed by the third openings MH3 as a result of etching the portion of the dummy gate layer D114. As a result, a plurality of gate cut spaces CTS respectively communicating with the third openings MH3 may be formed in the dummy gate layer D114.

Figure 15A:
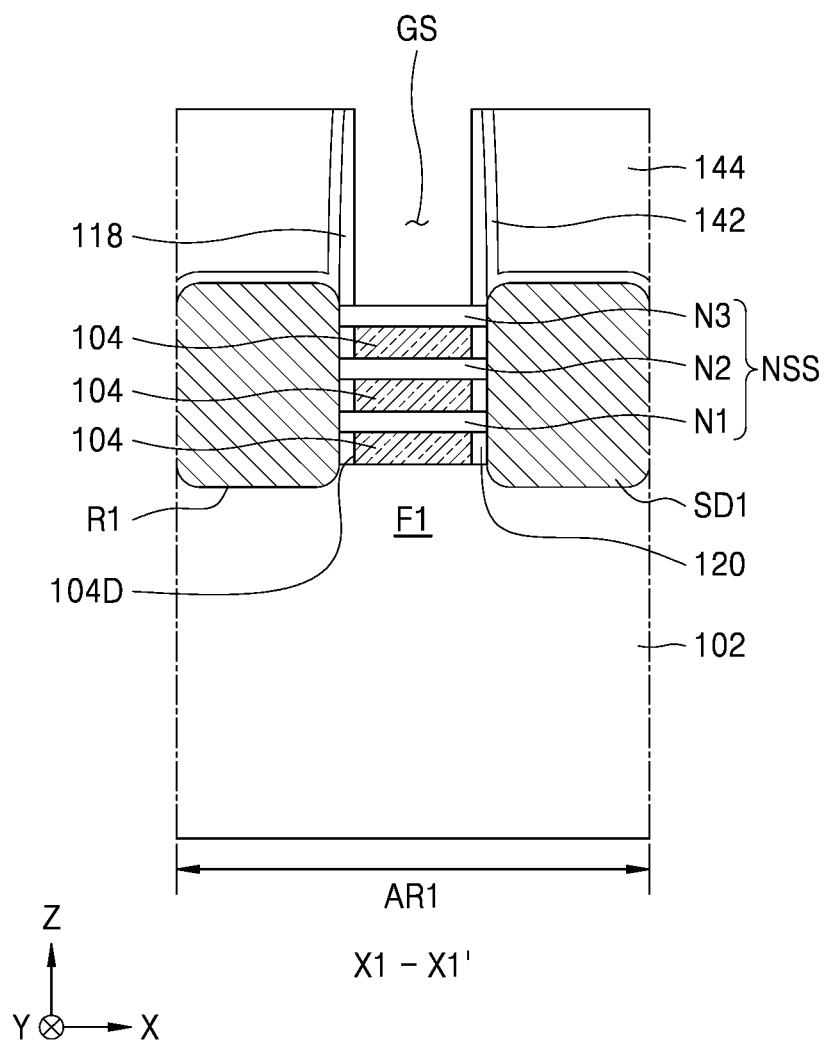
Figure 15B:
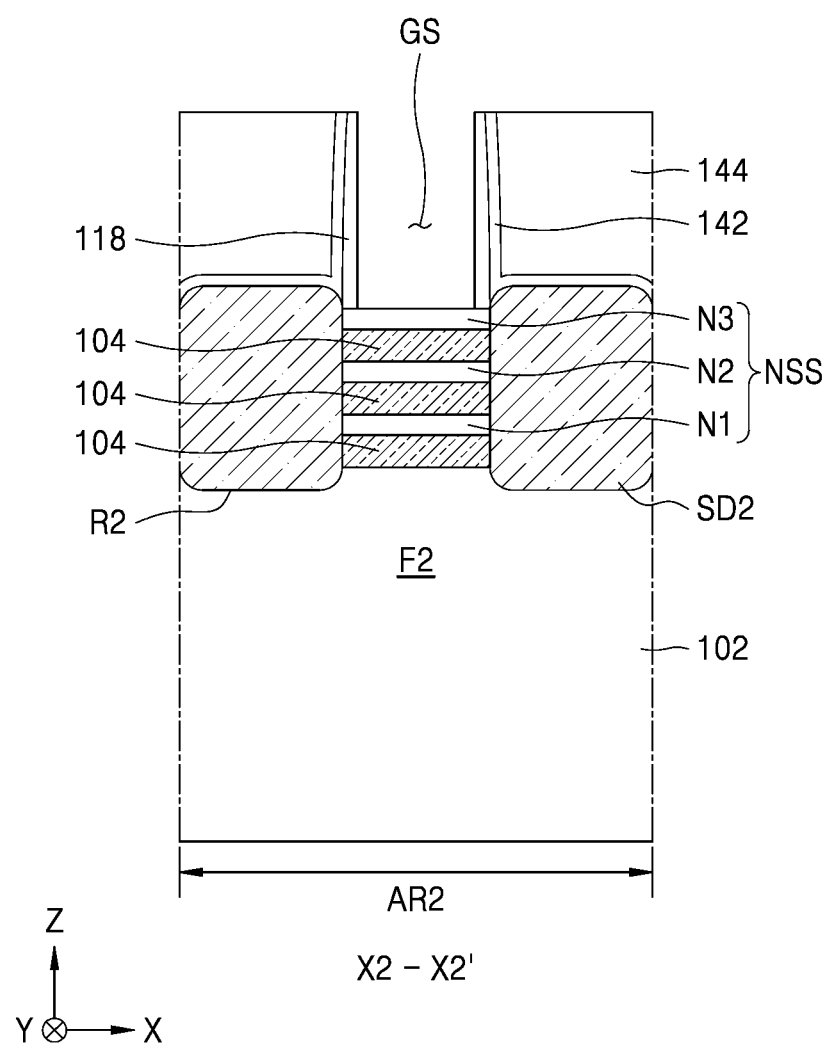
Figure 15C:
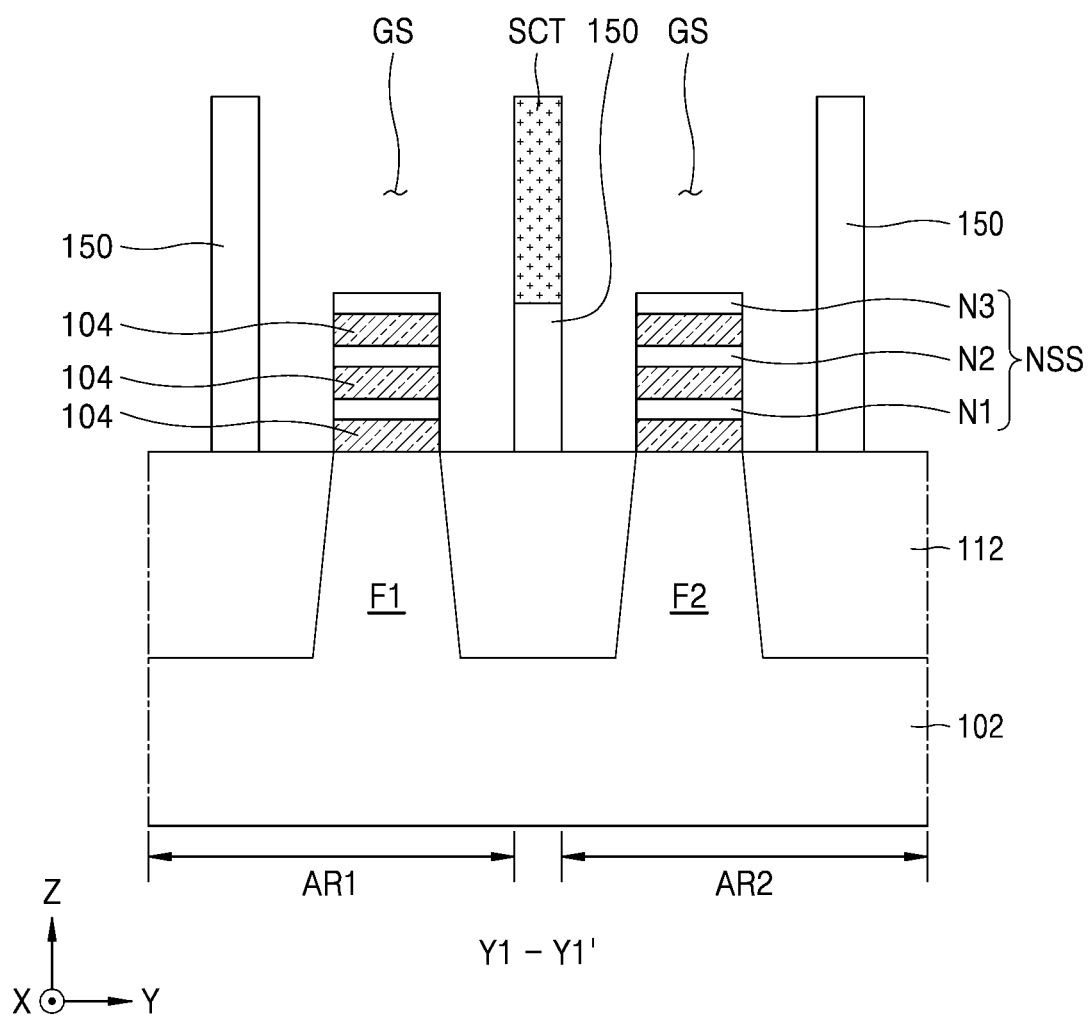

Referring to FIGS. 15A through 15C, after the third mask pattern MP3 is removed from the resultant structure of FIGS. 14A through 14C, a plurality of gate cut insulating films 150 respectively filling the gate cut spaces CTS may be formed, and an upper portion of a gate cut insulating film 150 on the boundary between the first device region AR1 and the second device region AR2 may be substituted by a sacrificial film SCT. Each of the gate cut insulating films 150 and the sacrificial film SCT may include a material, which has an etch selectivity with respect to a material of the dummy gate layer D114. In an implementation, when the dummy gate layer D114 includes a polysilicon film, the gate cut insulating films 150 may include silicon nitride and the sacrificial film SCT may include silicon oxide.

Thereafter, a plurality of gate spaces GS may be formed on the nanosheet stacks NSS by removing the dummy gate layer D114 and the oxide film D112 below the dummy gate layer D114. The lengths of the gate spaces GS in the second horizontal direction (the Y direction) may be limited by the gate cut insulating films 150 and the sacrificial film SCT.

Figure 16A:
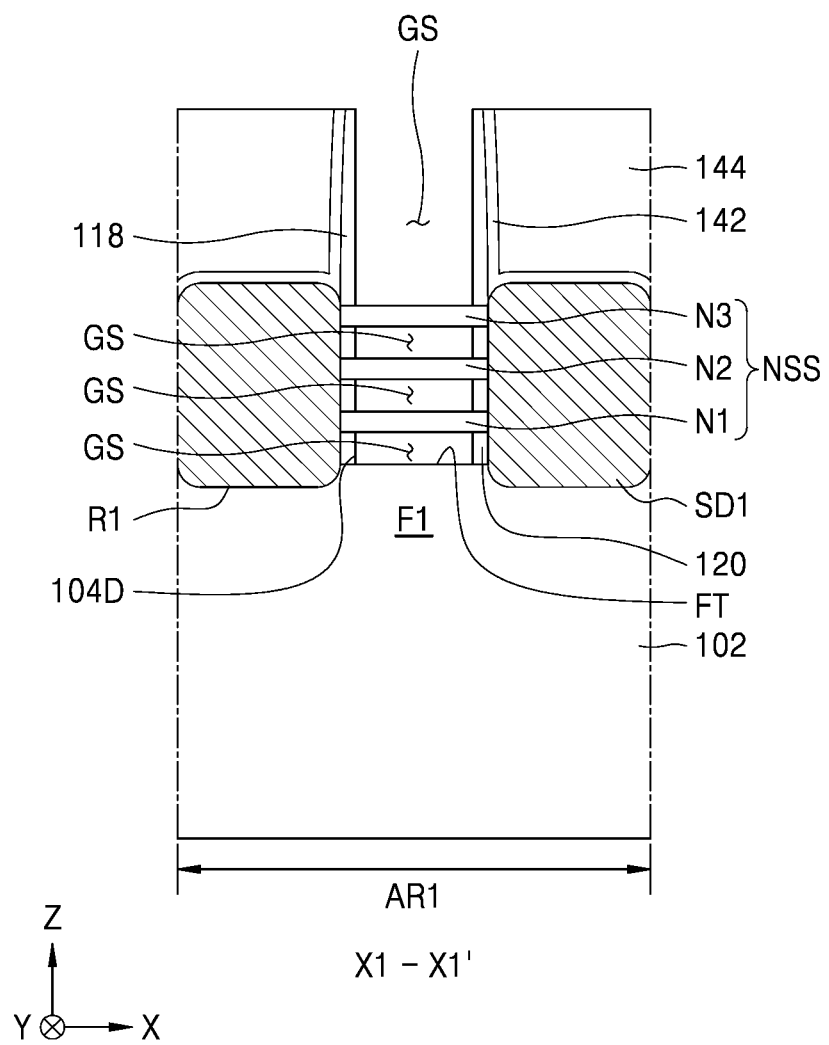
Figure 16B:
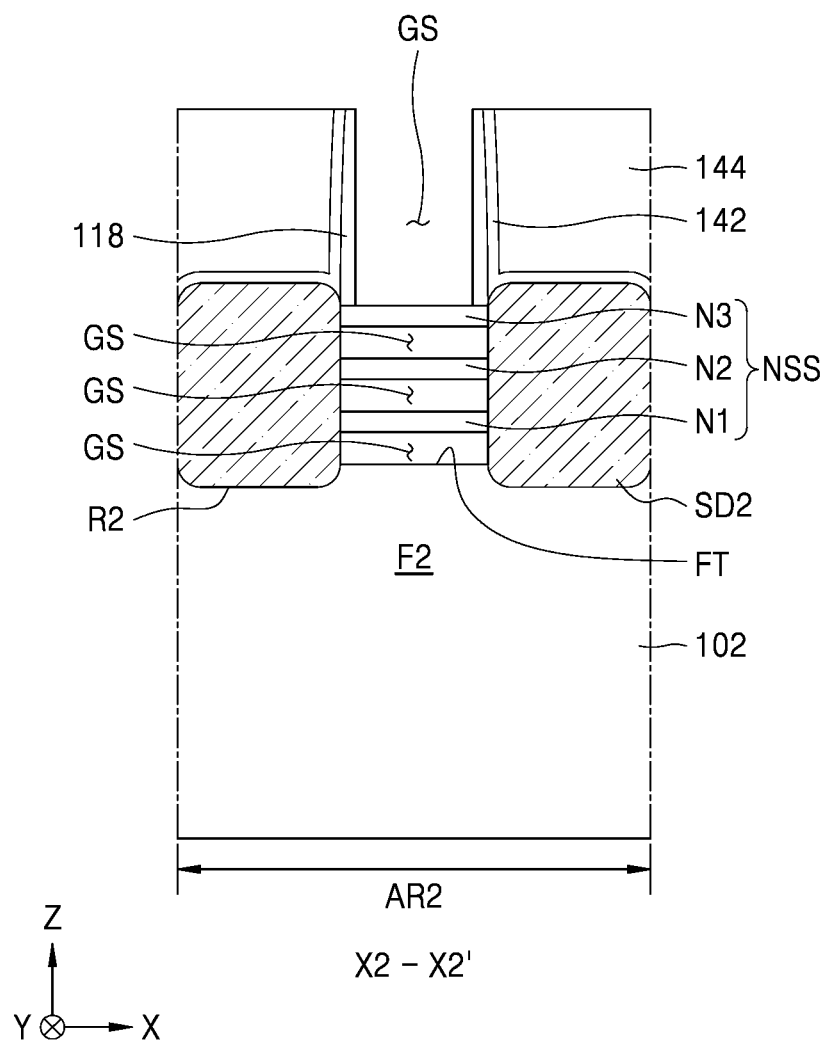
Figure 16C:
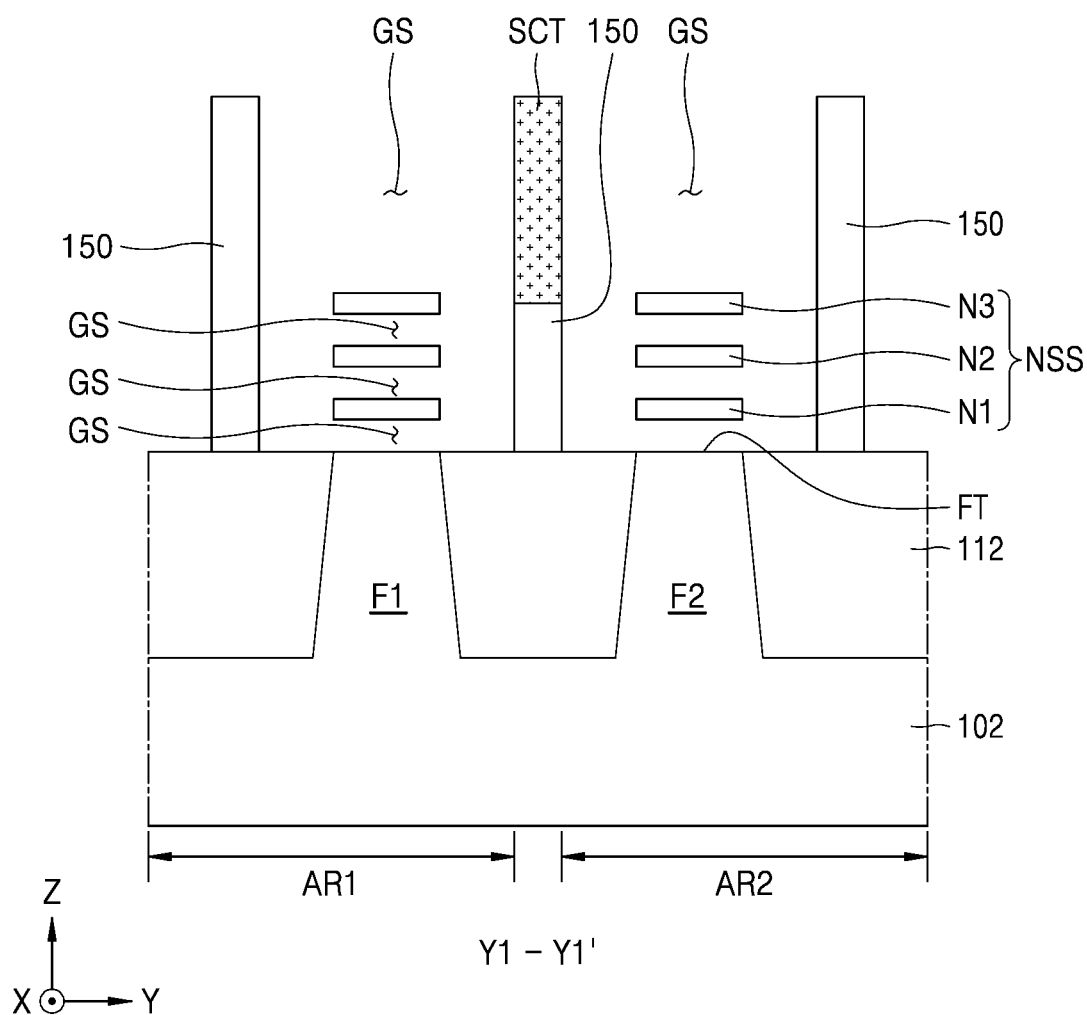

Referring to FIGS. 16A through 16C, the sacrificial semiconductor layers 104 remaining on each of the first and second fin active regions F1 and F2 may be removed from the resultant structure of FIGS. 15A through 15C through a gate space GS above a nanosheet stack NSS such that the gate space GS may extend to spaces among the first, second, and third nanosheets N1, N2, and N3 and the fin top FT.

In an implementation, to selectively remove the sacrificial semiconductor layers 104, a difference in etch selectivity between the sacrificial semiconductor layers 104 and the first, second, and third nanosheets N1, N2, and N3 may be used. To selectively remove the sacrificial semiconductor layers 104, a liquid or gas etchant may be used. In an implementation, to selectively remove the sacrificial semiconductor layers 104, a $CH_3COOH$ etchant, e.g., an etchant including a mixture of $CH_3COOH$, $HNO_3$, and HF or a mixture of $CH_3COOH$, $H_2O_2$, and HF, may be used.

Figure 17A:
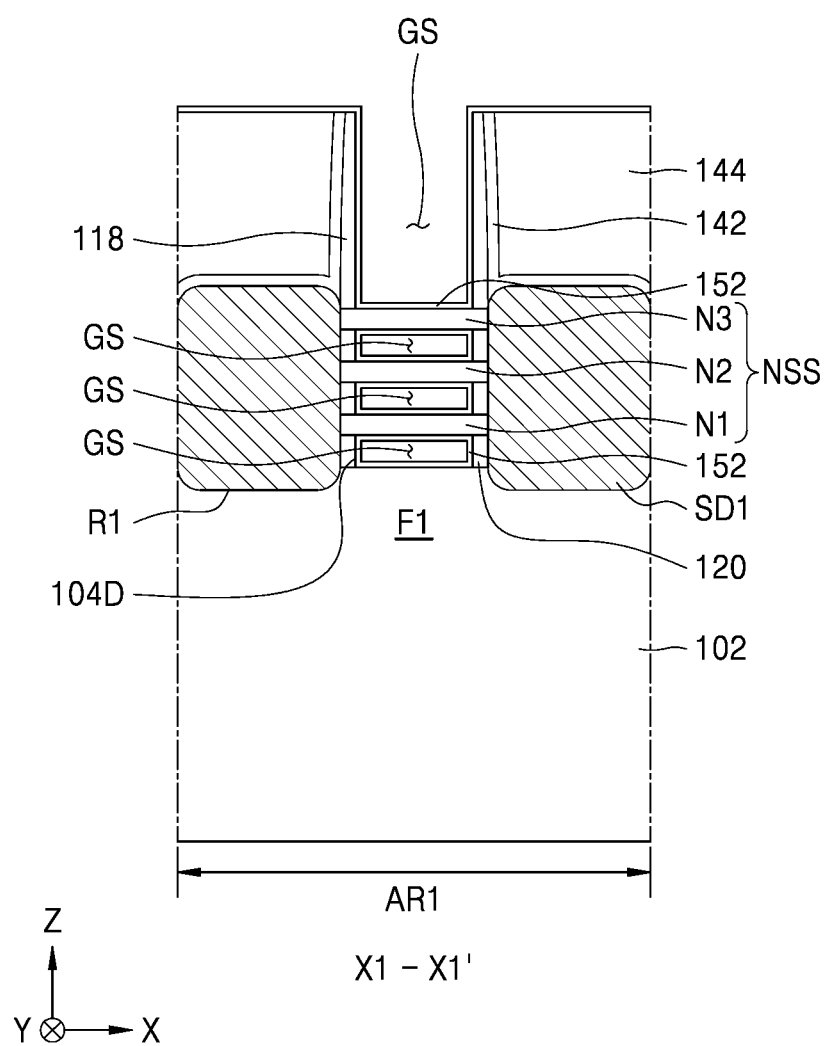
Figure 17B:
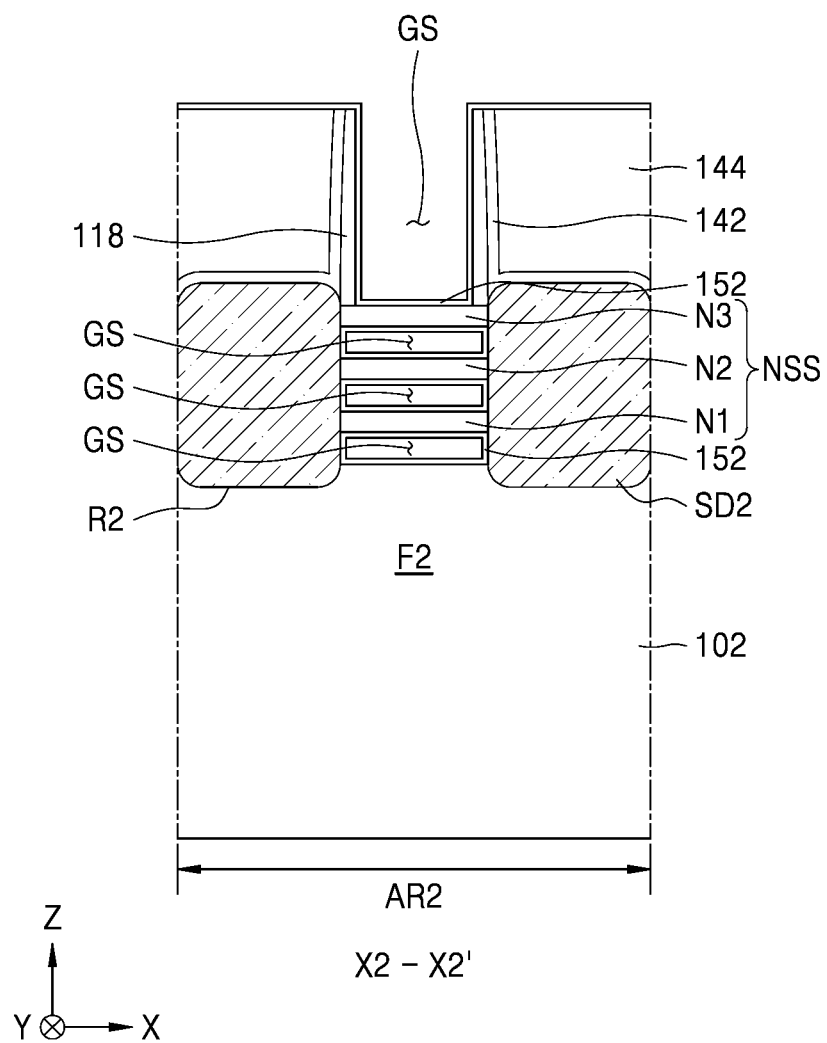
Figure 17C:
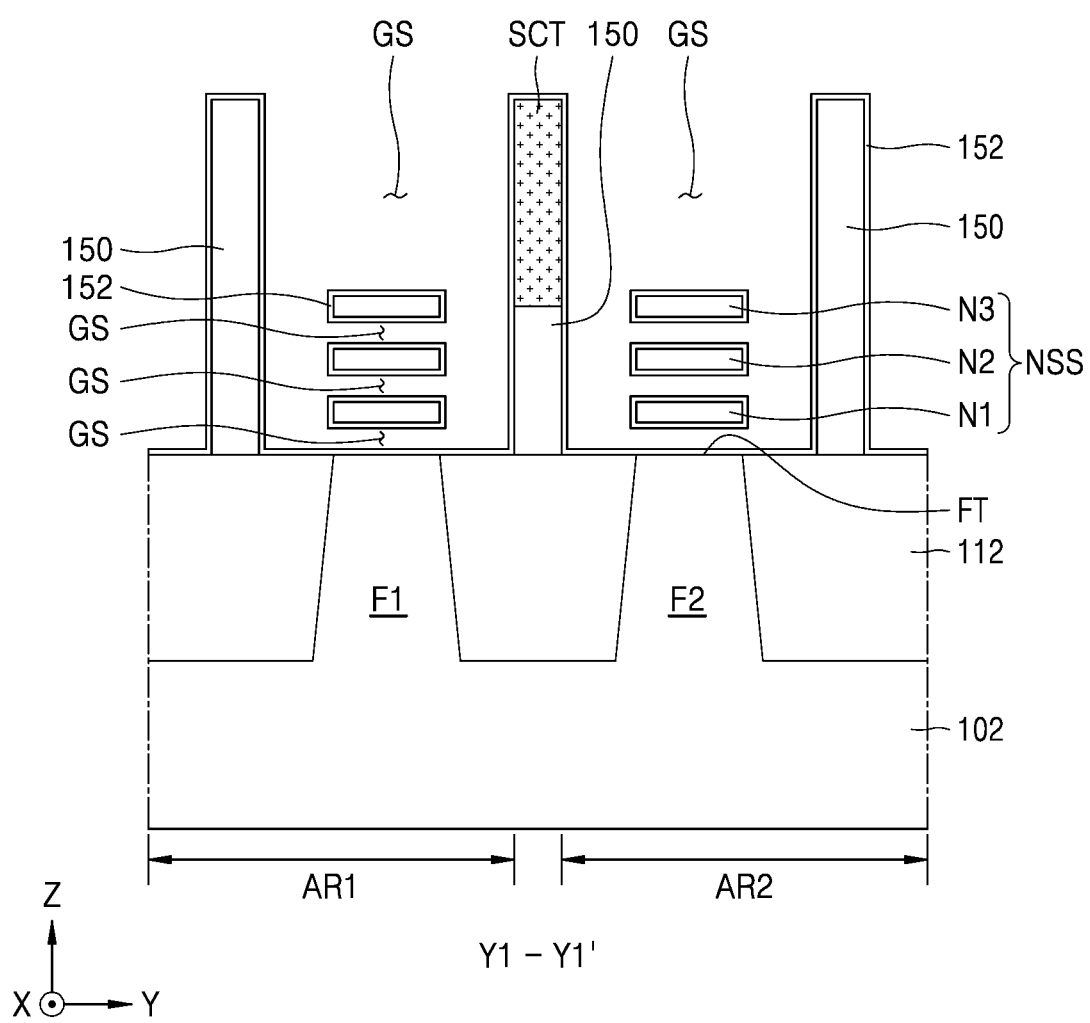

Referring to FIGS. 17A through 17C, the gate dielectric film 152, which covers the exposed surfaces of the first, second, and third nanosheets N1, N2, and N3 and the first and second fin active regions F1 and F2 in the resultant structure of FIGS. 16A through 16C, may be formed. The gate dielectric film 152 may conformally cover the surfaces of the outer insulating spacers 118, the gate cut insulating films 150, and the sacrificial film SCT, which are exposed by the gate spaces GS.

Figure 18:
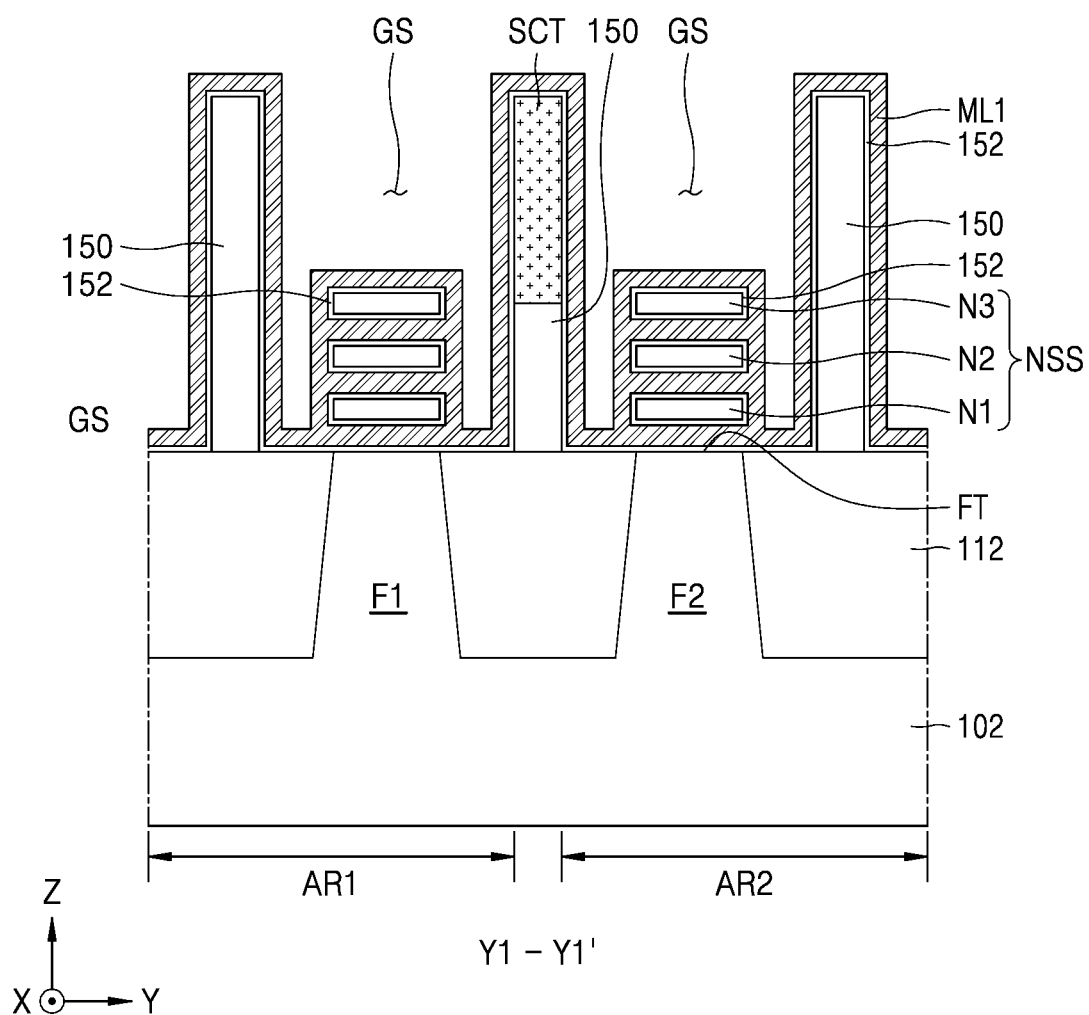

Referring to FIG. 18, the first work function metal film ML1, which covers the exposed surfaces in the resultant structure of FIGS. 17A through 17C, may be formed. The first work function metal film ML1 may fill the spaces among the first, second, and third nanosheets N1, N2, and N3 and the respective fin tops FT of the first and second fin active regions F1 and F2 in the first and second device regions AR1 and AR2.

Figure 19:
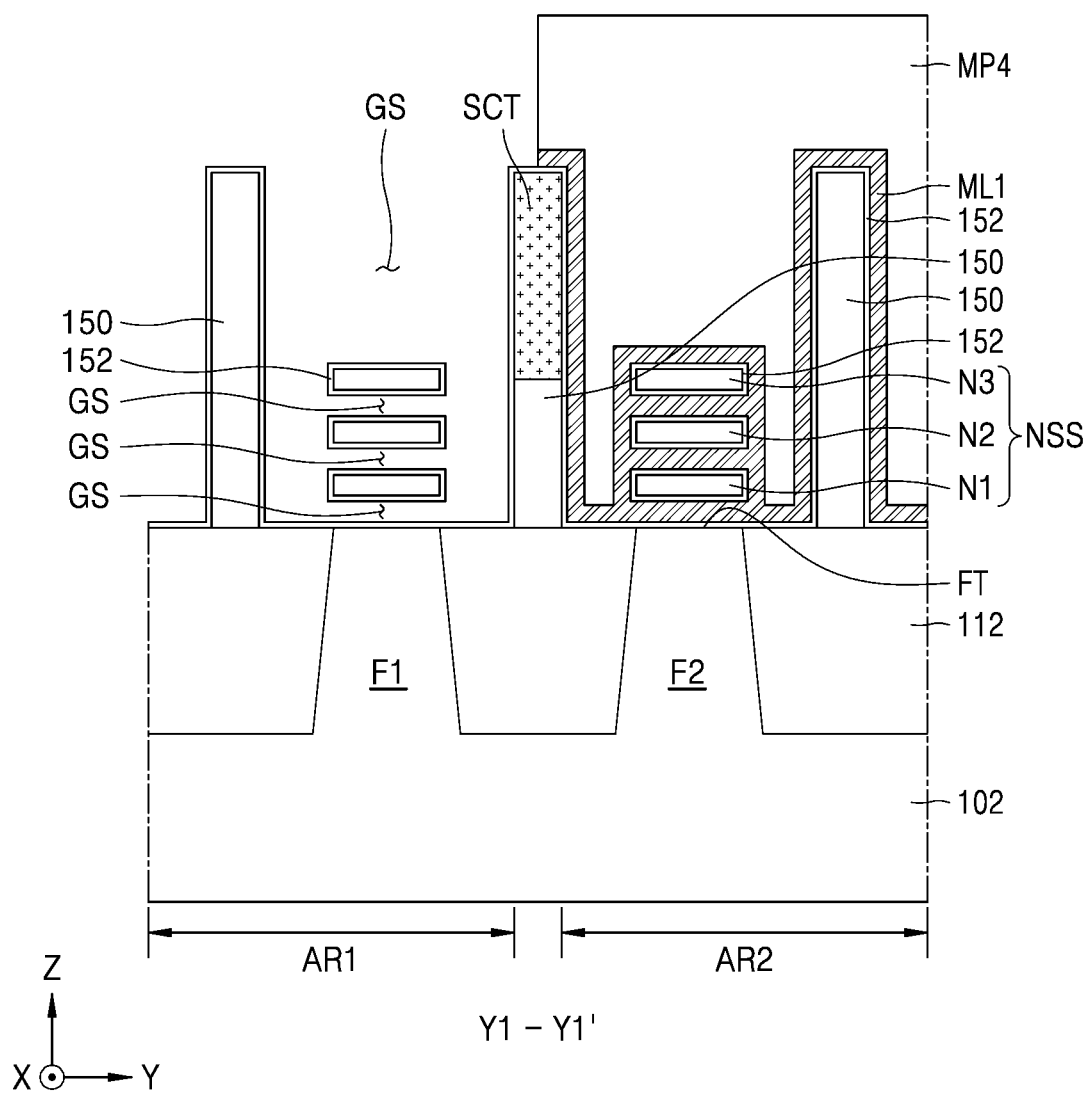

Referring to FIG. 19, a fourth mask pattern MP4, which covers the second device region AR2 and exposes the first device region AR1 in the resultant structure of FIG. 18, may be formed, and the gate dielectric film 152 on the first device region AR1 may be exposed by selectively removing the first work function metal film ML1 exposed in the first device region AR1 around the fourth mask pattern MP4.

In an implementation, to selectively remove the first work function metal film ML1 exposed on the first device region AR1, wet etching may be performed. Because the stack structure of a gate cut insulating film 150 and the sacrificial film SCT is on the isolation film 112 between the first device region AR1 and the second device region AR2, wet etching may be performed for a sufficient time to completely remove even portions of the first work function metal film ML1, which fill the spaces among the first, second, and third nanosheets N1, N2, and N3 and the fin top FT of the first fin active region F1, during a process of removing the first work function metal film ML1 from the first device region AR1. During the wet etching, the first work function metal film ML1 and structures around the first work function metal film ML1 on the second device region AR2 may be protected by the fourth mask pattern MP4 and the stack structure of the gate cut insulating film 150 and the sacrificial film SCT on the isolation film 112 between the first device region AR1 and the second device region AR2 against an etching atmosphere.

After the first work function metal film ML1 is removed from the first device region AR1, the gate space GS among the first, second, and third nanosheets N1, N2, and N3 and the fin top FT may be empty on the first device region AR1.

Figure 20:
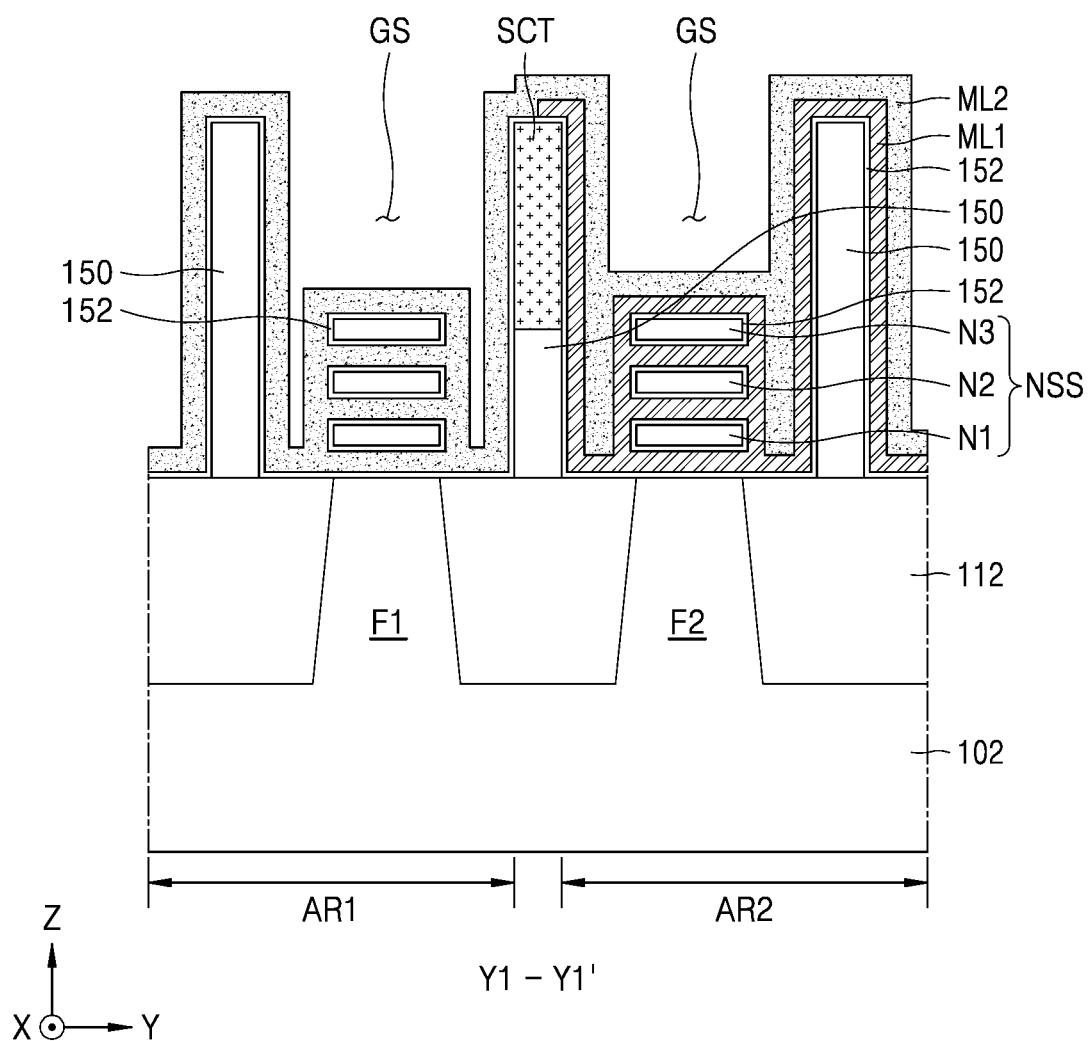

Referring to FIG. 20, after the fourth mask pattern MP4 is removed from the resultant structure of FIG. 19, the second work function metal film ML2, which covers surfaces exposed by the gate spaces GS in the first and second device regions AR1 and AR2, may be formed. The second work function metal film ML2 in a gate space GS on the first device region AR1 may be in contact with the gate dielectric film 152. The second work function metal film ML2 in a gate space GS on the second device region AR2 may be in contact with the first work function metal film ML1.

Figure 21:
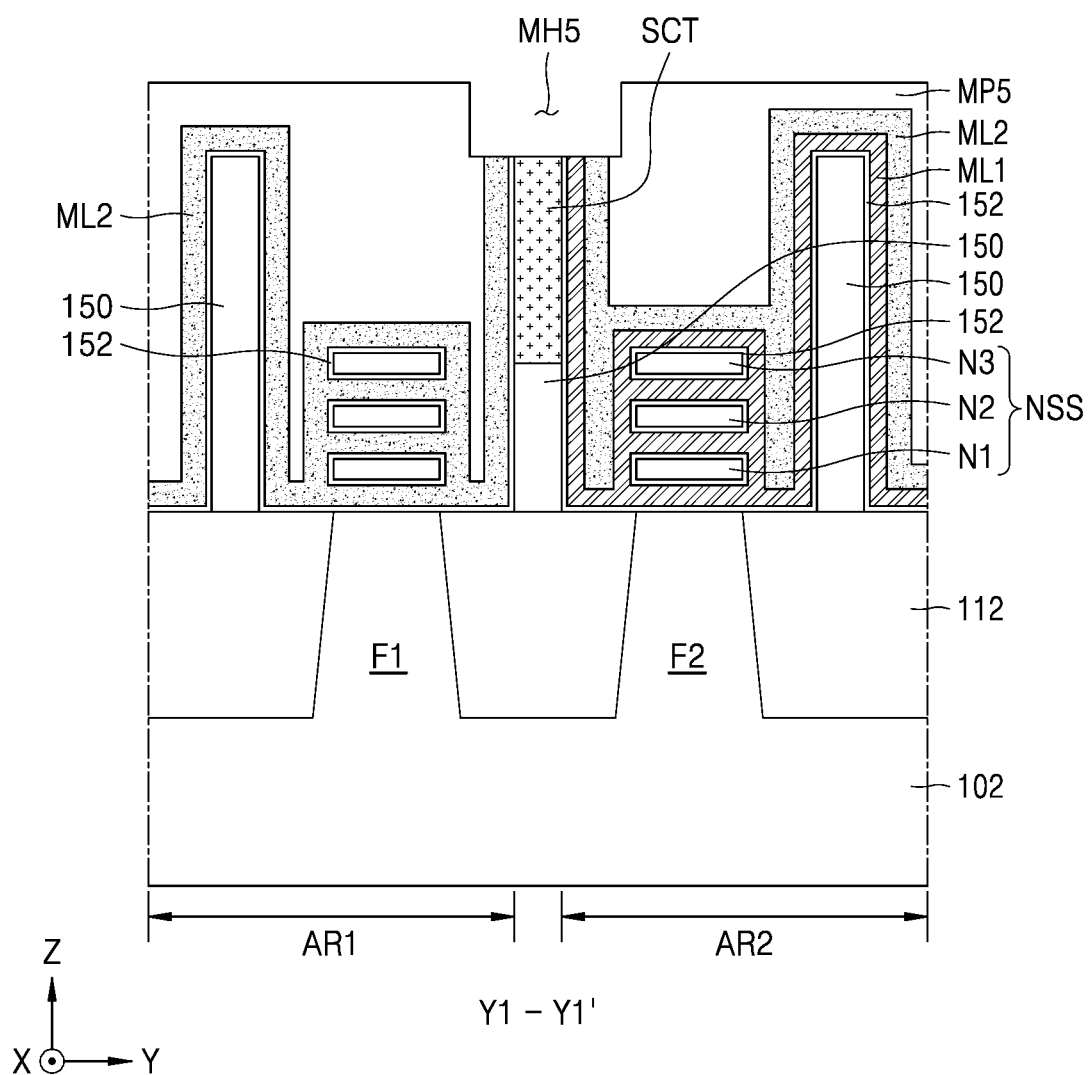

Referring to FIG. 21, a fifth mask pattern MP5 covering the resultant structure of FIG. 20 may be formed. The fifth mask pattern MP5 may have an opening MH5 at a position corresponding to the sacrificial film SCT. In an implementation, the fifth mask pattern MP5 may include a carbon-containing film including a spin-on hardmask (SOH) material. The carbon-containing film may include an organic compound having a relatively high carbon content of about 85 wt % to about 99 wt % based on the total weight thereof. The organic compound may include a hydrocarbon compound including an aromatic ring or a derivative of the hydrocarbon compound.

The top surface of the sacrificial film SCT may be exposed by partially removing each of the second work function metal film ML2, the first work function metal film ML1, and the gate dielectric film 152, which are exposed by the opening MH5.

Figure 22:
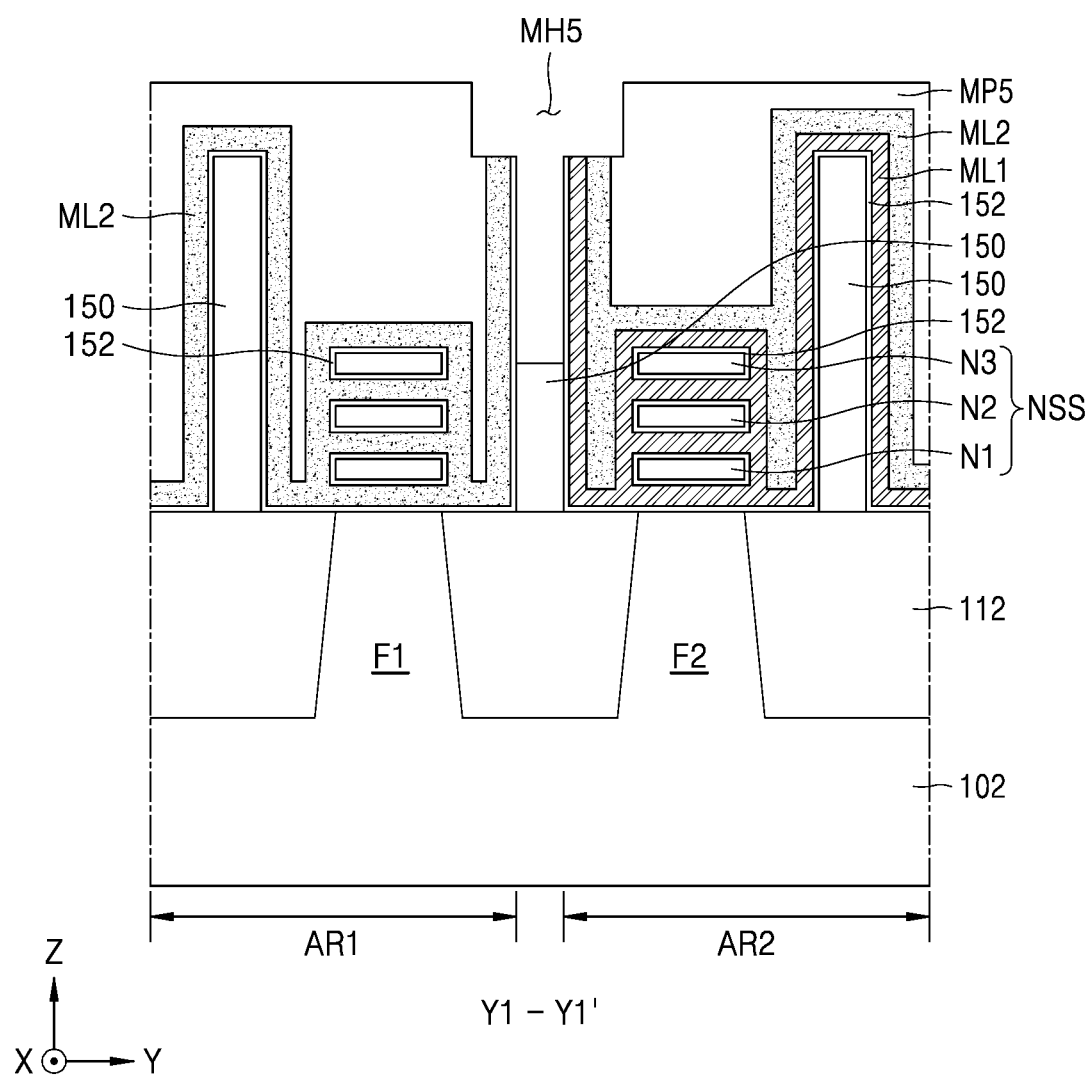

Referring to FIG. 22, the top surface of the gate cut insulating film 150 at the boundary between the first device region AR1 and the second device region AR2 may be exposed by the opening MH5 by removing the sacrificial film SCT from the resultant structure of FIG. 21. Wet etching, dry etching, or a combination thereof may be used to remove the sacrificial film SCT.

Figure 23:
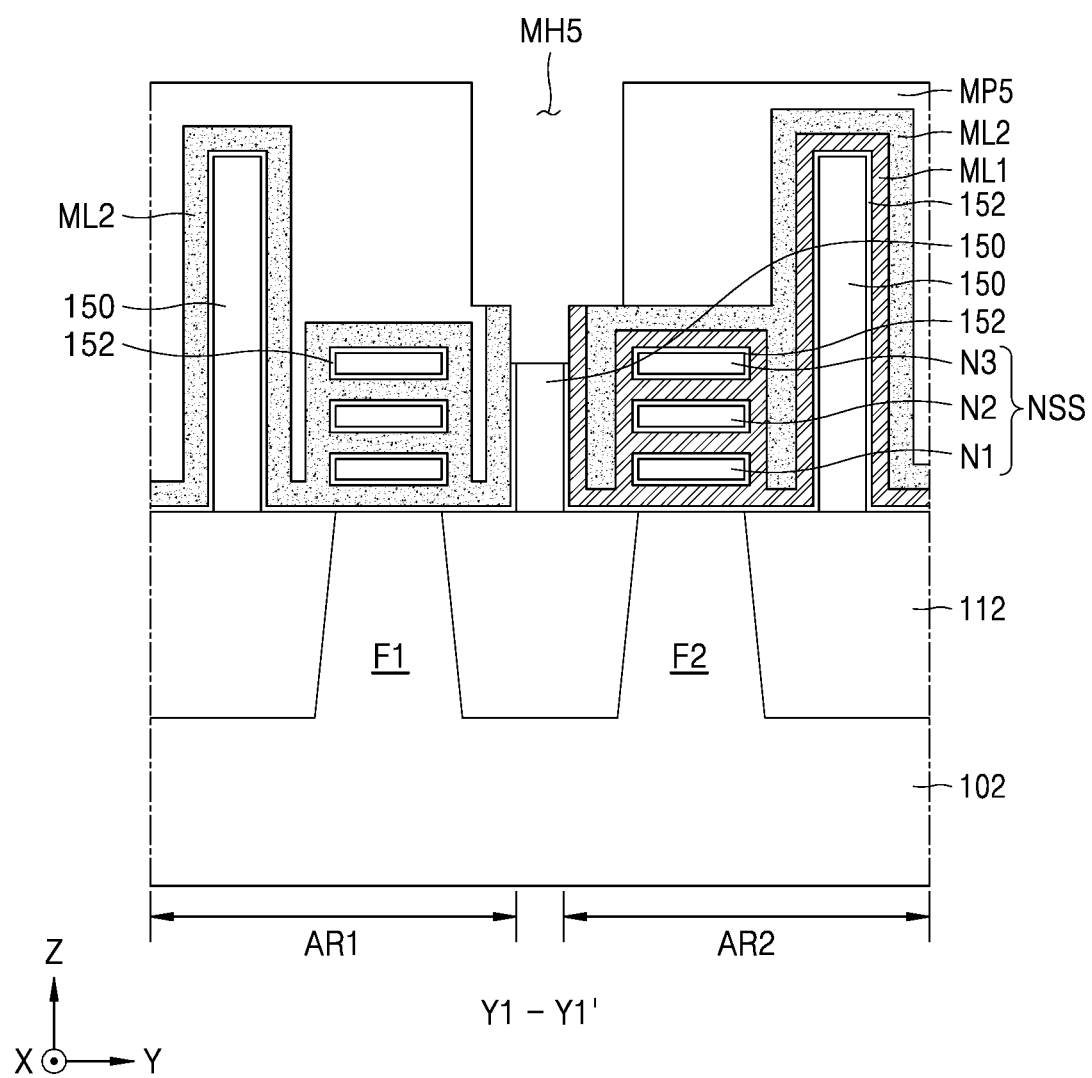

Referring to FIG. 23, the gate dielectric film 152, the second work function metal film ML2, and first work function metal film ML1, which are around the gate cut insulating film 150 at the boundary between the first device region AR1 and the second device region AR2, may be lowered by partially removing the gate dielectric film 152, the second work function metal film ML2, and first work function metal film ML1, which are exposed by the opening MH5, from the resultant structure of FIG. 22. Wet etching, dry etching, or a combination thereof may be used to partially remove the gate dielectric film 152, the second work function metal film ML2, and first work function metal film ML1.

Figure 24:
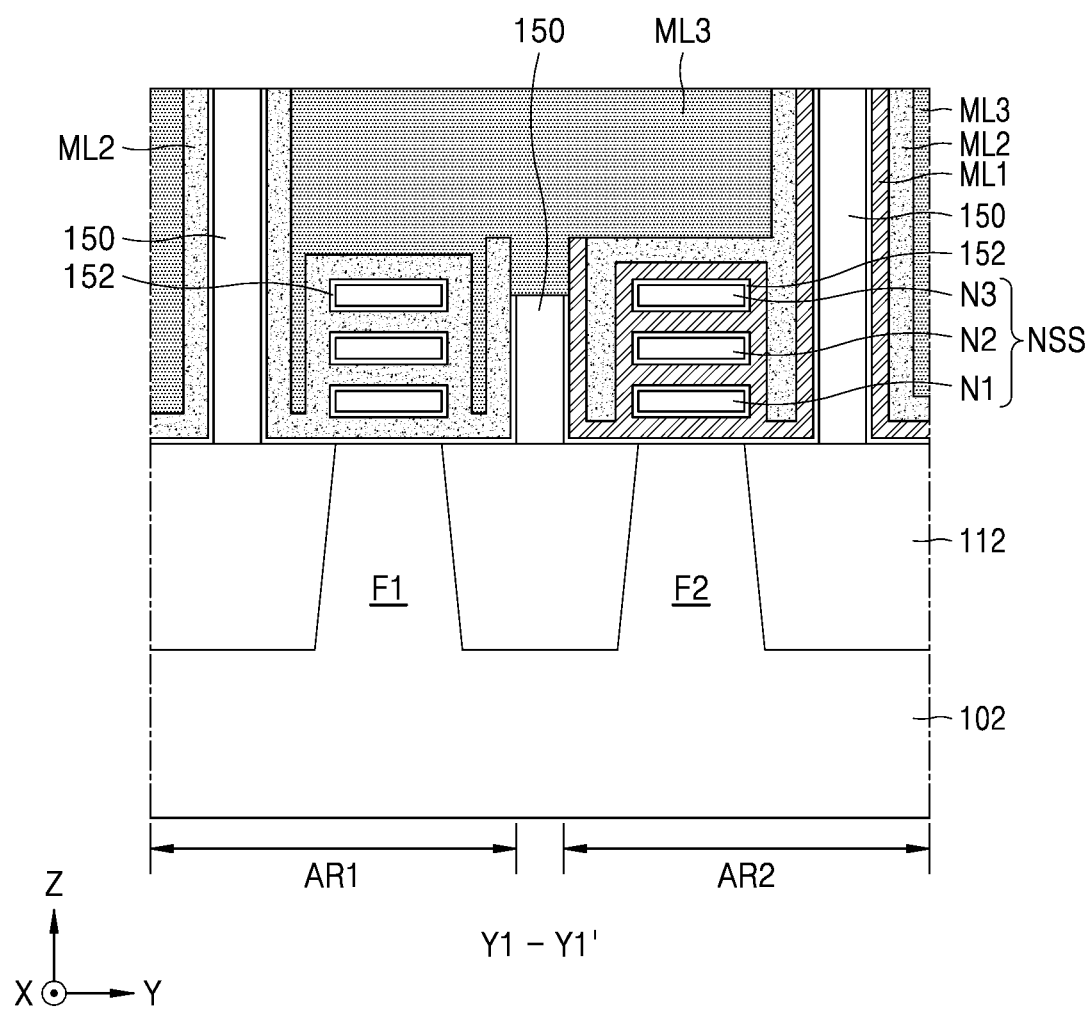

Referring to FIG. 24, after the fifth mask pattern MP5 is removed from the resultant structure of FIG. 23, the gap-fill metal film ML3 filling the remaining portions of the gate spaces GS on the first and second device regions AR1 and AR2 may be formed and then planarized such that the topmost surfaces of a plurality of gate cut insulating films 150 are exposed. As a result, the first work function metal film ML1, the second work function metal film ML2, and the gap-fill metal film ML3 may fill only the gate spaces GS (see FIG. 17C) and a space above the gate cut insulating film 150 at the boundary between the first device region AR1 and the second device region AR2.

Figure 25:
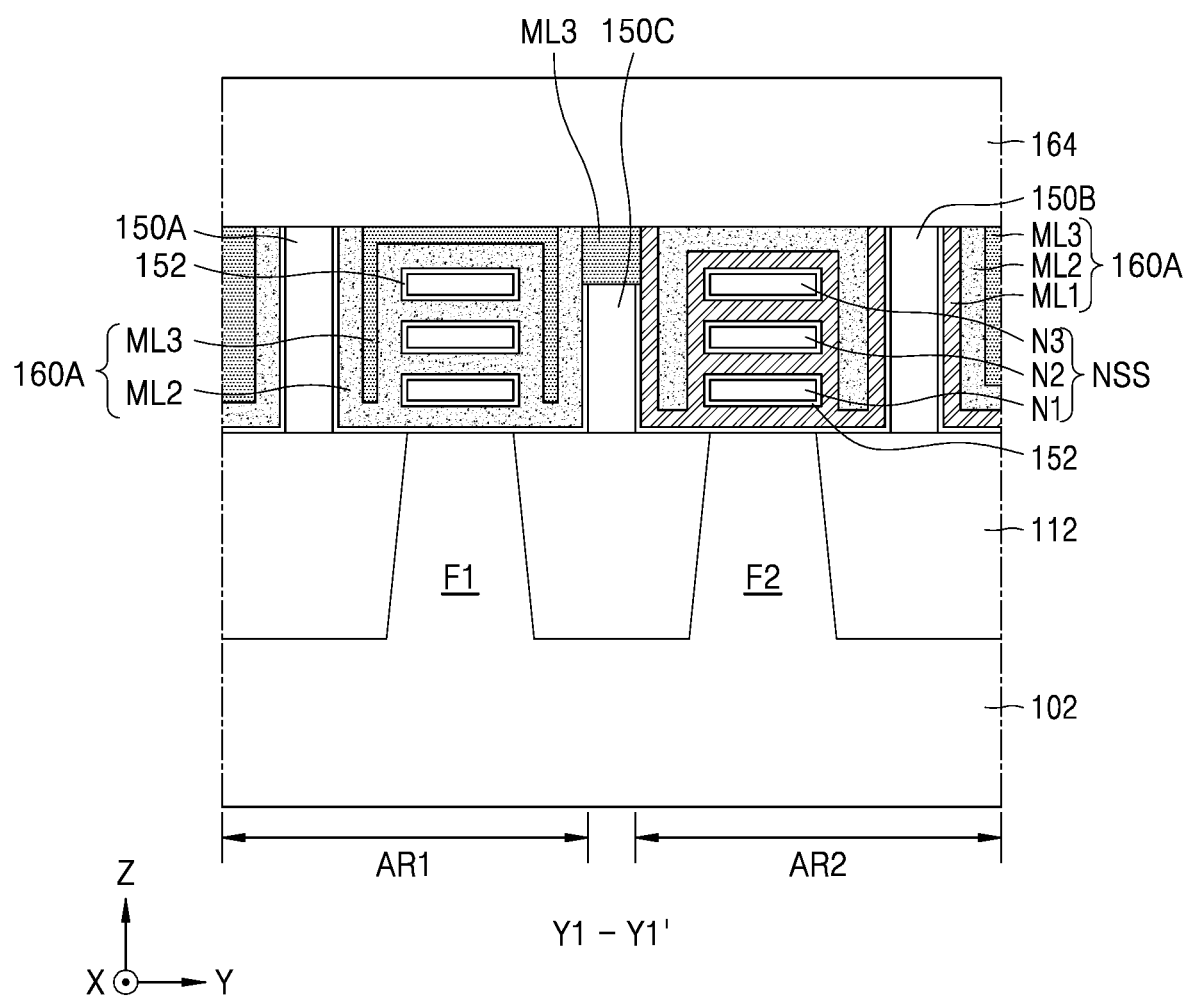

Referring to FIG. 25, the first work function metal film ML1, the second work function metal film ML2, the gap-fill metal film ML3, and the gate cut insulating films 150 may be lowered by partially removing the first work function metal film ML1, the second work function metal film ML2, and the gap-fill metal film ML3, which fill the gate spaces GS (see FIG. 17C), and the gate cut insulating films 150 from the top surface of the resultant structure of FIG. 24. At this time, the gate cut insulating film 150 at the boundary between the first device region AR1 and the second device region AR2 may be protected by the gap-fill metal film ML3 and thus not be changed in height. As a result, the first and second gate cut insulating patterns 150A and 150B and the inter-region insulating pattern 150C may be obtained from the gate cut insulating films 150.

Thereafter, a capping insulating pattern 164 may be formed on the first work function metal film ML1, the second work function metal film ML2, the gap-fill metal film ML3, and the first and second gate cut insulating patterns 150A and 150B to fill the remaining region of the gate spaces GS (see FIG. 17C).

In an implementation, the first work function metal film ML1, the second work function metal film ML2, and the gap-fill metal film ML3 in the resultant structure of FIG. 25 may form the gate lines 160 of the integrated circuit device 100 illustrated in FIGS. 2A through 2C. In an implementation, the first work function metal film ML1, the second work function metal film ML2, and the gap-fill metal film ML3 in the resultant structure of FIG. 25 may form the gate lines 160A of the integrated circuit device 100A illustrated in FIG. 3.

Thereafter, as shown in FIGS. 2A and 2B, the source/drain contacts 174, which pass through the intergate insulating film 144 and the insulating liner 142 and are connected to the first source/drain regions SD1 on the first device region AR1 and the second source/drain regions SD2 on the second device region AR2, and the metal silicide film 172 between the first and second source/drain regions SD1 and SD2 and the source/drain contacts 174, may be formed. As shown in FIGS. 2A through 2C, the insulating structure 190, which covers the top surface of the resultant structure including the metal silicide film 172 and the source/drain contacts 174, may be formed, and the source/drain via contacts 192, each of which passes through the insulating structure 190 and is connected to a source/drain contact 174, may be formed. In an implementation, a process of forming a plurality of gate contacts, each of which passes through the capping insulating pattern 164 and is connected to a gate line 160, and a plurality of gate via contacts, each of which passes through the insulating structure 190 and is connected to a gate contact, may be further performed.

It is understood that the integrated circuit devices 100B, 200, 300, 400, 500, and 500A described with reference to FIGS. 4 through 10 and other various integrated circuit devices having similar structures thereto may be manufactured by making various modifications and changes in the descriptions given with reference to FIGS. 11A through 25.

In an implementation, to manufacture the integrated circuit device 100B of FIG. 4, the inter-region insulating pattern 150C obtained from the gate cut insulating film 150 in the boundary between the first device region AR1 and the second device region AR2 may be formed to have the non-planar top surface TB by controlling an etching atmosphere in each of the process of removing the sacrificial film SCT, as described above with reference to FIG. 22, and the process of partially removing the gate dielectric film 152, the second work function metal film ML2, and first work function metal film ML1, which are exposed by the opening MH5, as described above with reference to FIG. 23.

To manufacture the integrated circuit device 200 of FIG. 5 or the integrated circuit device 300 of FIG. 6, the position of a third opening MH3 corresponding to the boundary between the first device region AR1 and the second device region AR2 among the third openings MH3 of the third mask pattern MP3 may be changed when the third mask pattern MP3 is formed as described above with reference to FIGS. 14A through 14C.

In an implementation, when the third mask pattern MP3 is formed as described above with reference to FIGS. 14A through 14C, the third mask pattern MP3 may be formed such that the position of the third opening MH3 corresponding to the boundary between the first device region AR1 and the second device region AR2 is closer to the first fin active region F1 on the first device region AR1 than to the second fin active region F2 on the second device region AR2, and then the subsequent processes described with reference to FIGS. 14A through 25 may be performed so that the integrated circuit device 200 of FIG. 5 may be manufactured.

In an implementation, when the third mask pattern MP3 is formed as described above with reference to FIGS. 14A through 14C, the third mask pattern MP3 may be formed such that the position of the third opening MH3 corresponding to the boundary between the first device region AR1 and the second device region AR2 is closer to the second fin active region F2 on the second device region AR2 than to the first fin active region F1 on the first device region AR1, and then the subsequent processes described with reference to FIGS. 14A through 25 may be performed so that the integrated circuit device 300 of FIG. 6 may be manufactured.

To manufacture the integrated circuit device 400 of FIG. 7, the length of the sacrificial film SCT in the vertical direction (the Z direction) may be made greater than that shown in FIG. 15C in the process of substituting the upper portion of the gate cut insulating film 150 at the boundary between the first device region AR1 and the second device region AR2 with the sacrificial film SCT, as described above with reference to FIGS. 15A through 15C, such that the level of the contact surface between the sacrificial film SCT and the gate cut insulating film 150 therebelow is lower than that shown in FIG. 15C. Thereafter, the integrated circuit device 400 of FIG. 7 may be manufactured by performing the subsequent processes described with reference to FIGS. 16A through 25.

Figure 26:
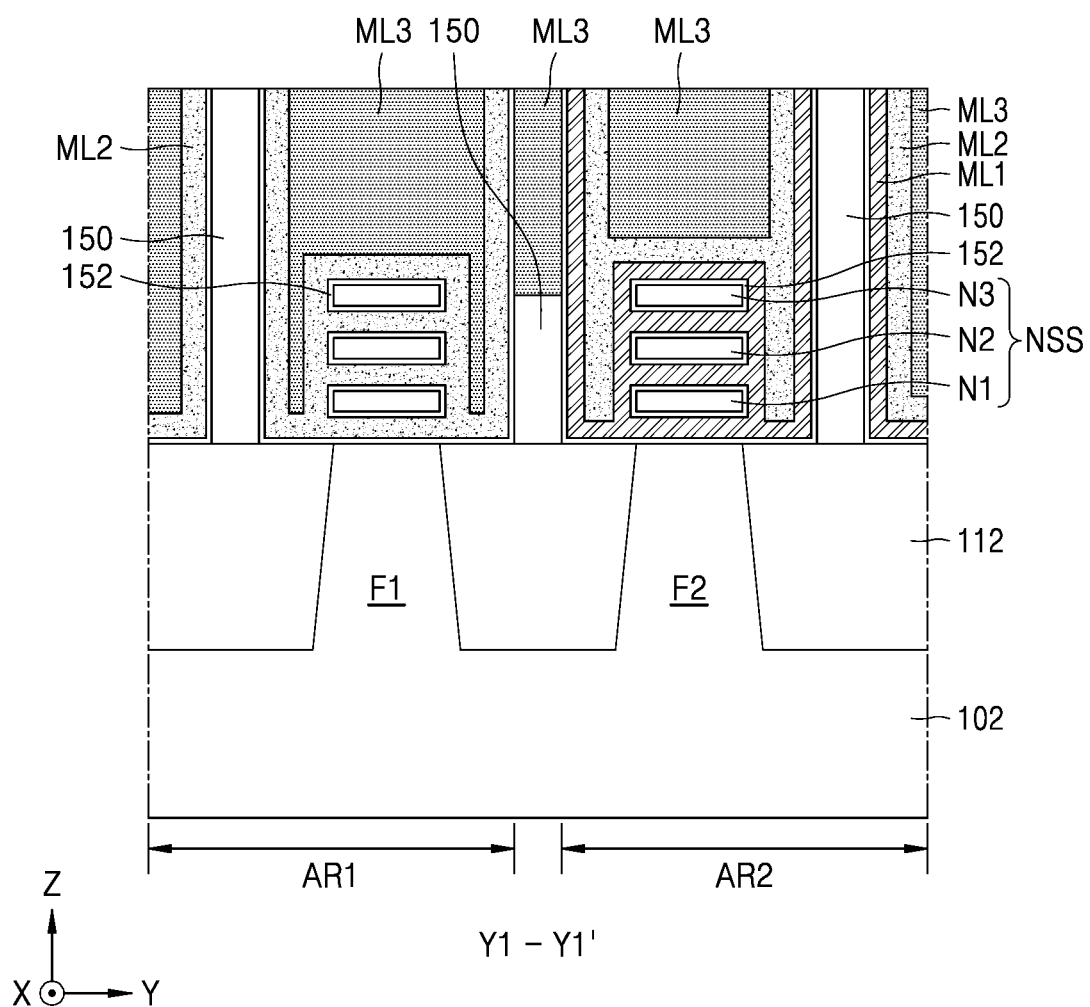
FIG. 26 is a cross-sectional view of a stage in a method of manufacturing an integrated circuit device, according to some embodiments.

FIG. 26 is a cross-sectional view of a stage in a method of manufacturing an integrated circuit device, according to some embodiments. Another example method of manufacturing the integrated circuit devices 100 and 100B illustrated in FIGS. 1 through 3 will be described with reference to FIG. 26.

Referring to FIG. 26, after the top surface of the sacrificial film SCT is exposed by the opening MH5 of the fifth mask pattern MP5 by performing the processes described with reference to FIGS. 11A through 21, the sacrificial film SCT may be removed through the opening MH5 using the method described with reference to FIG. 22.

Thereafter, a side wall of each of the second work function metal film ML2 and the first work function metal film ML1 may be exposed by the opening MH5 by partially removing the gate dielectric film 152, which is exposed by the opening MH5, using a method similar to that described with reference to FIG. 23. In an implementation, differently from the description given with reference to FIG. 23, the process of partially removing the second work function metal film ML2 and the first work function metal film ML1 through the opening MH5 may be omitted.

Thereafter, the topmost surfaces of a plurality of gate cut insulating films 150 may be exposed by removing the fifth mask pattern MP5, forming the gap-fill metal film ML3 filling the remaining portions of the gate spaces GS on the first and second device regions AR1 and AR2, and planarizing the resultant structure, using a method similar to that described with reference to FIG. 24. As a result, the first work function metal film ML1, the second work function metal film ML2, and the gap-fill metal film ML3 may remain in only the gate spaces GS (see FIG. 17C) and the space above the gate cut insulating film 150 at the boundary between the first device region AR1 and the second device region AR2. Thereafter, the integrated circuit device 100 illustrated in FIGS. 2A through 2C or the integrated circuit device 100A illustrated in FIG. 3 may be manufactured by performing the processes described with reference to FIG. 25.

FIGS. 27A through 27F are cross-sectional views of stages in a method of manufacturing an integrated circuit device, according to some embodiments. FIGS. 27A through 27F illustrate partial configurations of a portion corresponding to the cross-section taken along the line Y1-Y1' in FIG. 8. Example methods of manufacturing the integrated circuit devices 500 and 500B illustrated in FIGS. 8 through 10 will be described with reference to FIGS. 27A through 27F below. In FIGS. 1 through 10 and FIGS. 27A through 27F, like reference numerals denote like elements, and detailed descriptions thereof may be omitted.

Figure 27A:
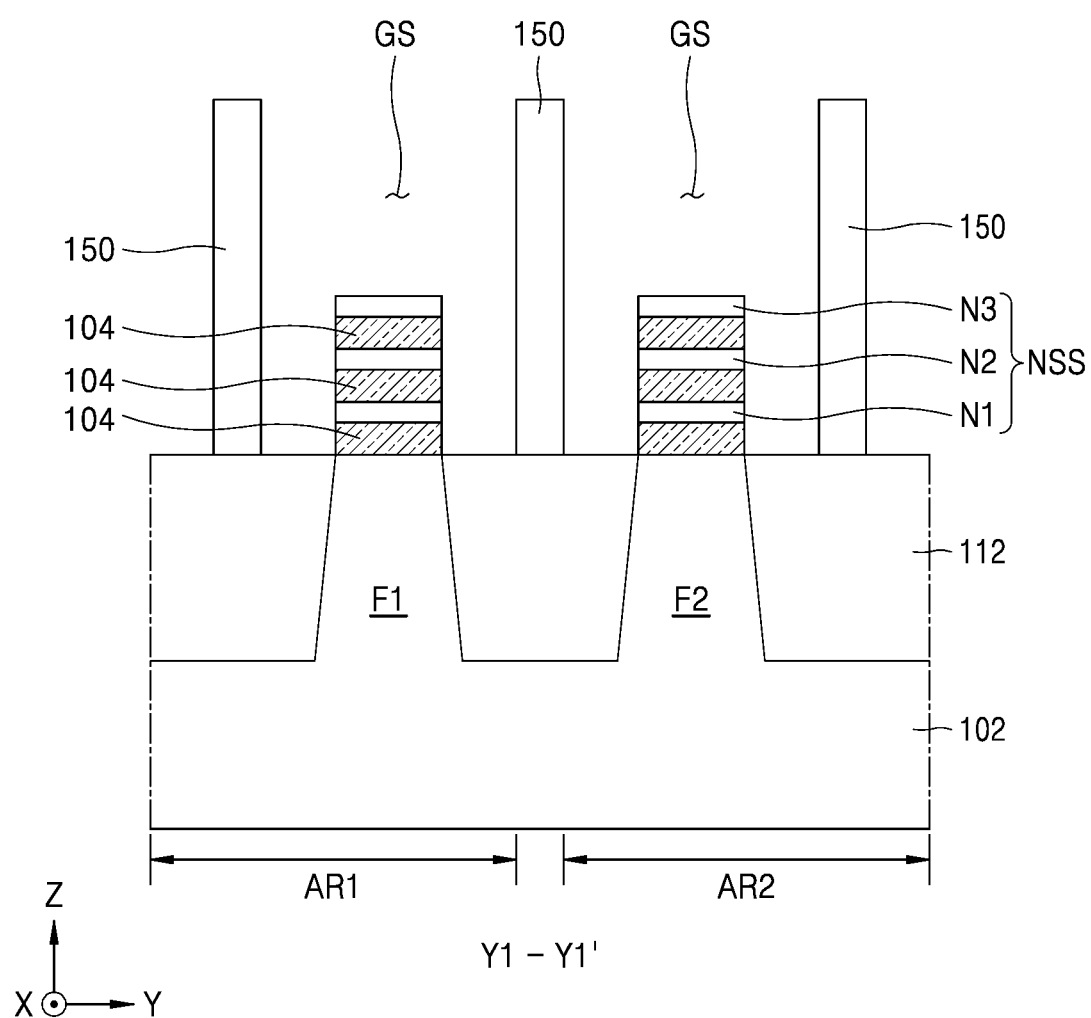
FIGS. 27A through 27F are cross-sectional views of stages in a method of manufacturing an integrated circuit device, according to some embodiments.

Referring to FIG. 27A, the processes described with reference to FIGS. 11A through 15C may be performed. In an implementation, the process of substituting the upper portion of the gate cut insulating film 150 at the boundary between the first device region AR1 and the second device region AR2 with the sacrificial film SCT may be omitted from the processes described with reference to FIGS. 15A through 15C. As a result, a plurality of gate cut insulating films 150 above the substrate 102 may have equal or similar heights in the vertical direction (the Z direction) to one another.

Figure 27B:
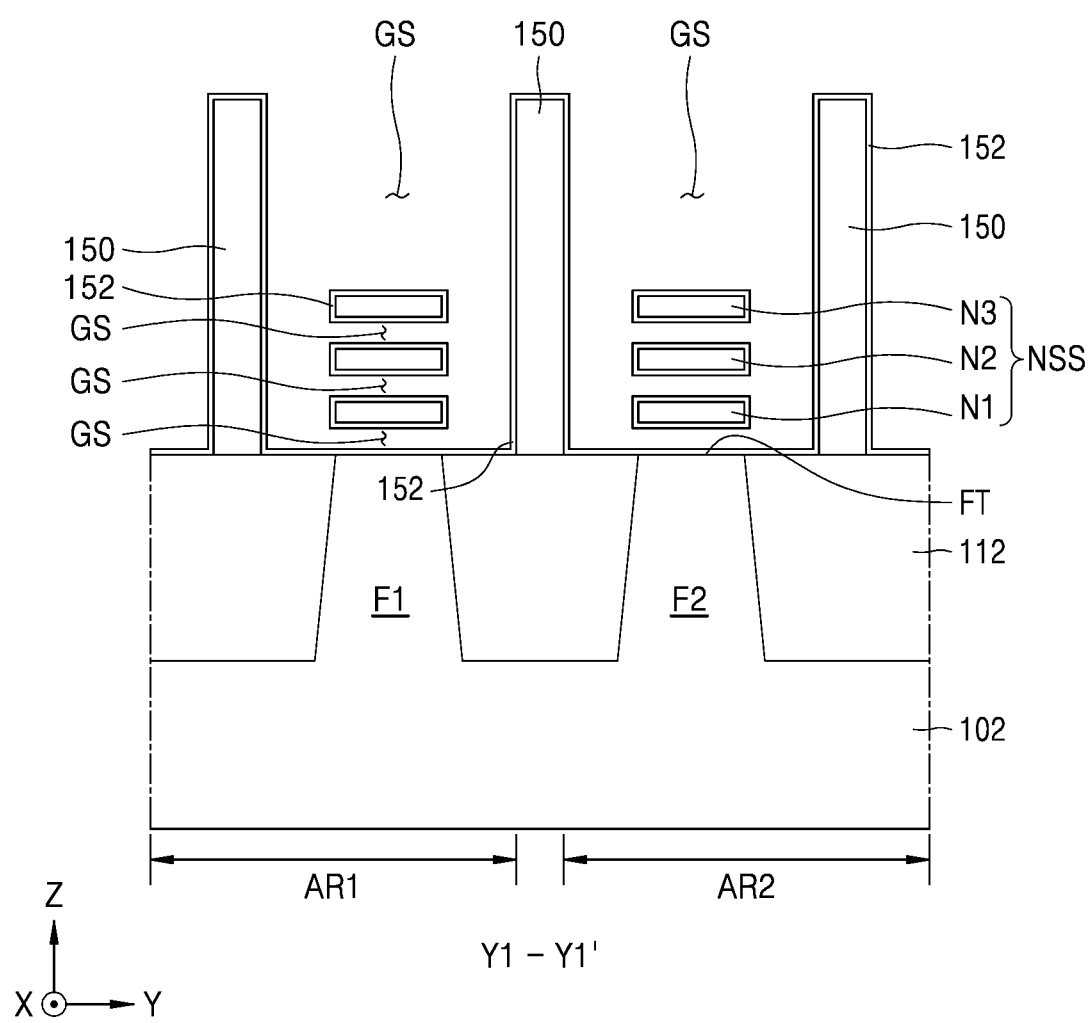

Referring to FIG. 27B, a gate space GS may be extended to spaces among the first, second, and third nanosheets N1, N2, and N3 and the fin top FT by removing the sacrificial semiconductor layers 104 remaining on each of the first and second fin active regions F1 and F2 from the resultant structure of FIG. 27A, and the gate dielectric film 152, which covers the exposed surfaces of the first, second, and third nanosheets N1, N2, and N3 and the first and second fin active regions F1 and F2, may be formed, using a method similar to that described with reference to FIGS. 16A through 17C.

Figure 27C:
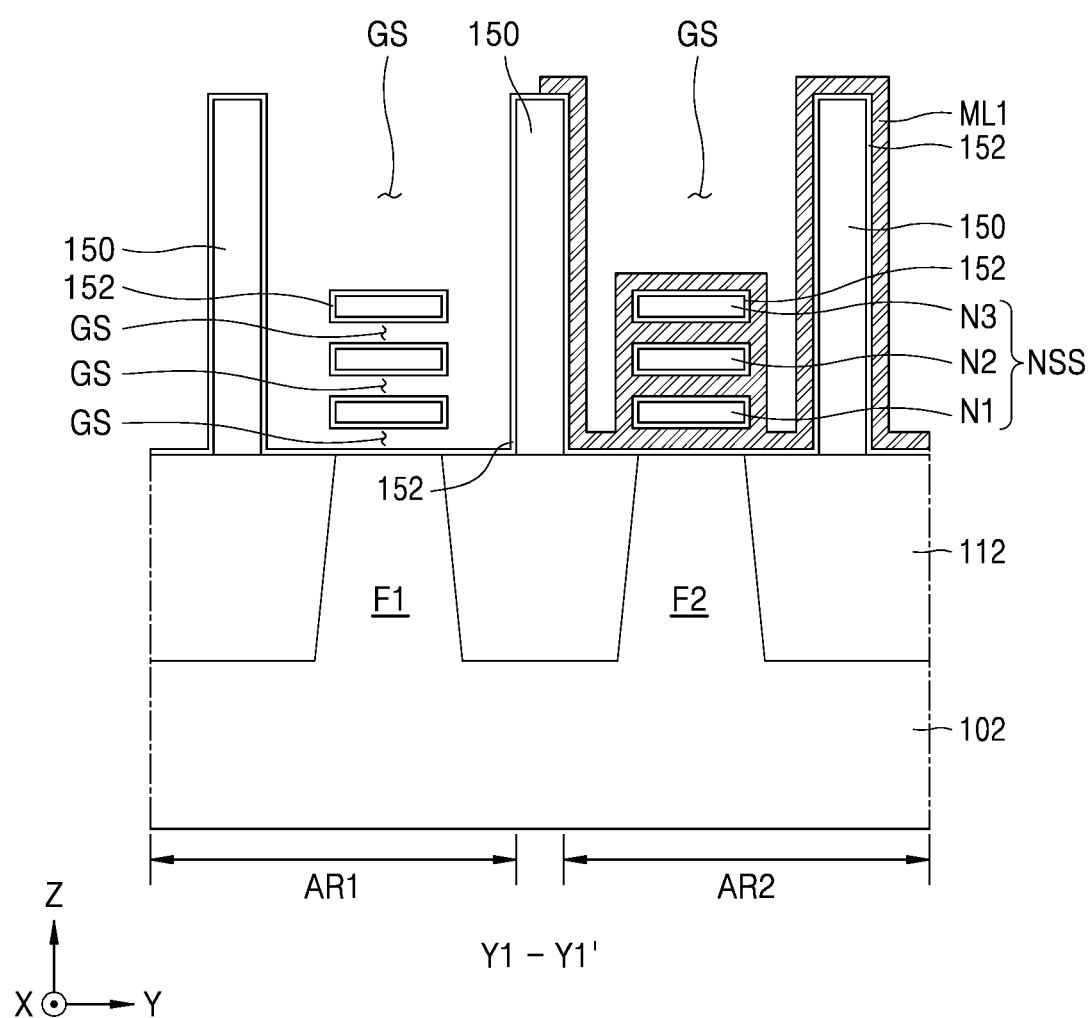

Referring to FIG. 27C, the first work function metal film ML1, which covers the exposed surfaces on the first and second device regions AR1 and AR1 of the resultant structure of FIG. 27B, may be formed, and the gate dielectric film 152 on the first device region AR1 may be exposed by selectively removing the first work function metal film ML1 from only the first device region AR1, using a method similar to that described with reference to FIGS. 18 and 19.

To selectively remove the first work function metal film ML1 exposed on the first device region AR1, wet etching may be performed. In an implementation, because a gate cut insulating film 150 is on the isolation film 112 between the first device region AR1 and the second device region AR2, wet etching may be performed for a sufficient time to completely remove even portions of the first work function metal film ML1, which fill the spaces among the first, second, and third nanosheets N1, N2, and N3 and the fin top FT of the first fin active region F1, during the process of removing the first work function metal film ML1 from the first device region AR1. During the wet etching, the first work function metal film ML1 and structures around the first work function metal film ML1 on the second device region AR2 may be protected by the fourth mask pattern MP4 and the gate cut insulating film 150 on the isolation film 112 between the first device region AR1 and the second device region AR2 against an etching atmosphere.

Figure 27D:
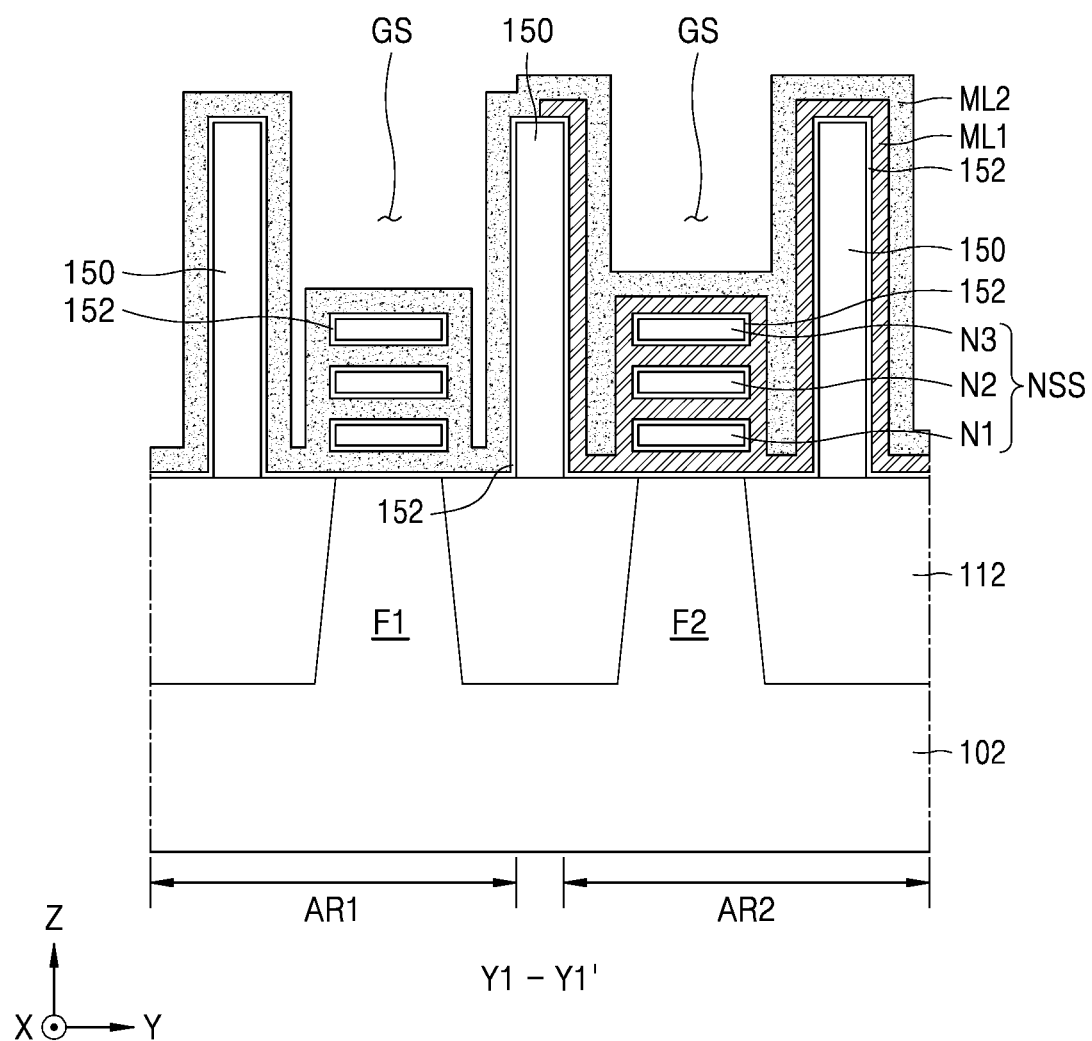

Referring to FIG. 27D, the second work function metal film ML2, which covers surfaces exposed by the gate spaces GS in the resultant structure of FIG. 27C, may be formed using a method similar to that described with reference to FIG. 20.

Figure 27E:
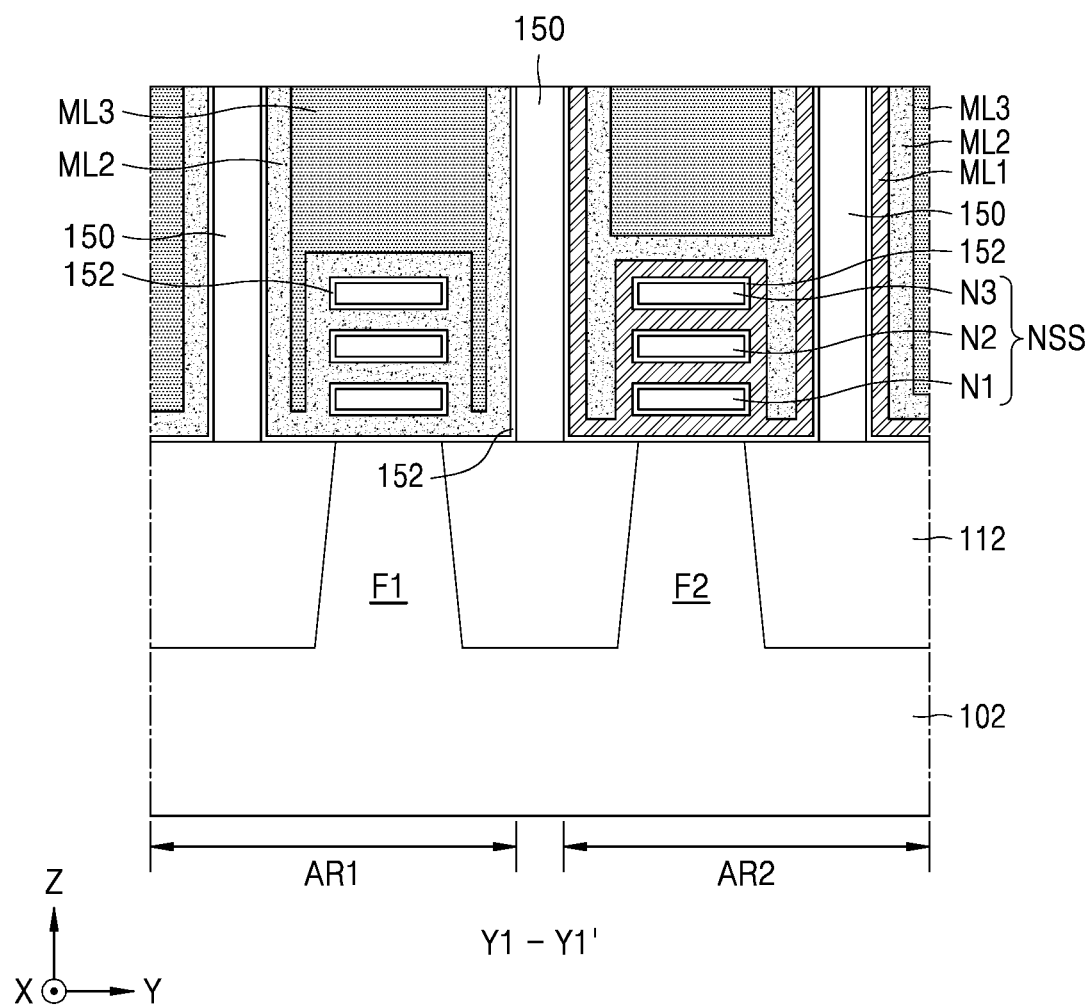

Referring to FIG. 27E, the topmost surfaces of a plurality of gate cut insulating films 150 may be exposed by forming the gap-fill metal film ML3 filling the remaining portions of the gate spaces GS on the first and second device regions AR1 and AR2 of the resultant structure of FIG. 27D and planarizing the resultant structure, using a method similar to that described with reference to FIG. 24.

Figure 27F:
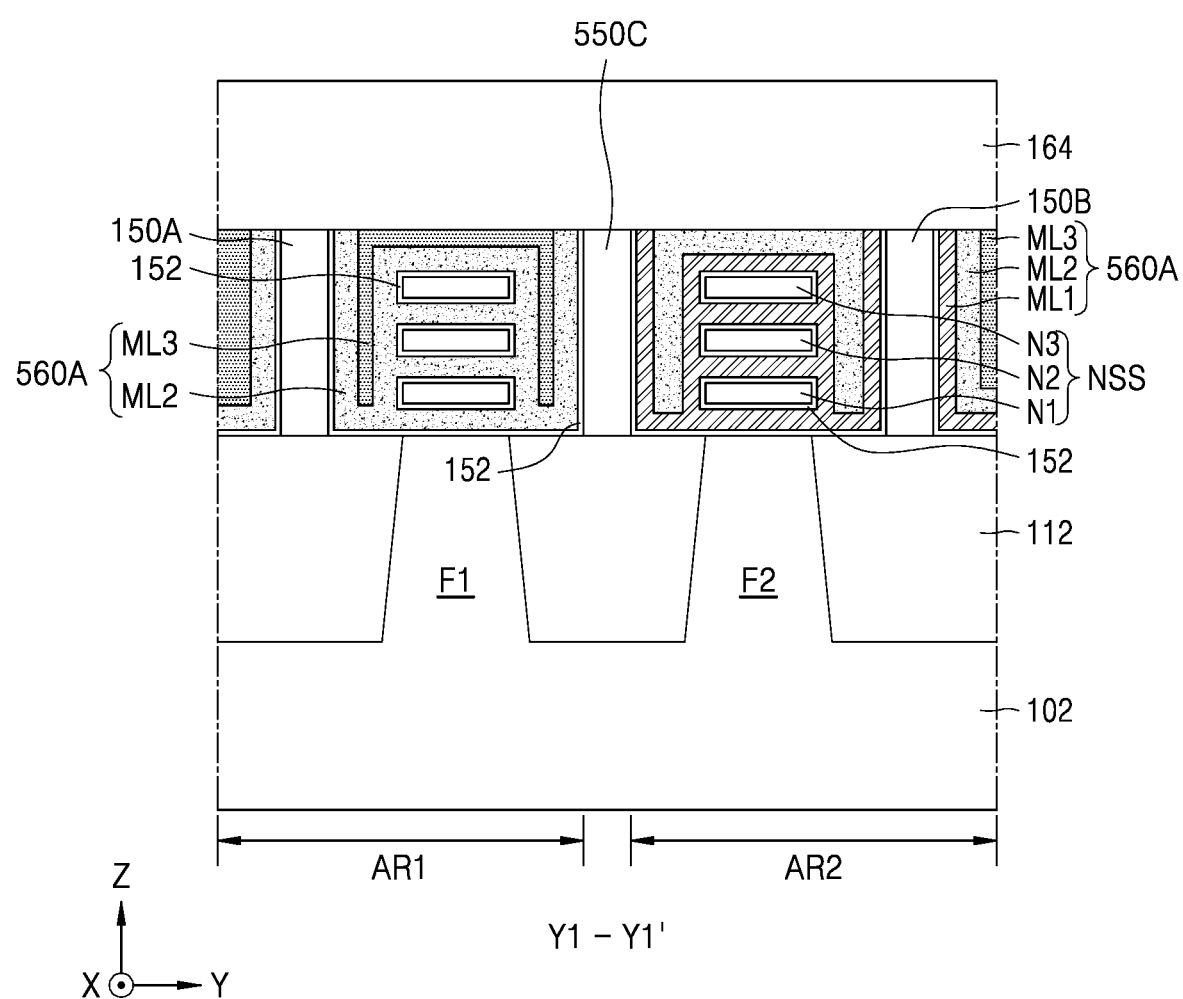

Referring to FIG. 27F, the first work function metal film ML1, the second work function metal film ML2, the gap-fill metal film ML3, and the gate cut insulating films 150 may be lowered by partially removing the first work function metal film ML1, the second work function metal film ML2, the gap-fill metal film ML3, and the gate cut insulating films 150 from the top surface of the resultant structure of FIG. 27E, using a method similar to that described with reference to FIG. 25. As a result, the first and second gate cut insulating patterns 150A and 150B and the inter-region insulating pattern 550C may be obtained from the gate cut insulating films 150. Thereafter, the capping insulating pattern 164, which covers the first work function metal film ML1, the second work function metal film ML2, the gap-fill metal film ML3, the first and second gate cut insulating patterns 150A and 150B, and the inter-region insulating pattern 550C, may be formed.

In an implementation, the first work function metal film ML1, the second work function metal film ML2, and the gap-fill metal film ML3 in the resultant structure of FIG. 27F may form the gate lines 560 of the integrated circuit device 500 illustrated in FIGS. 8 and 9. In an implementation, the first work function metal film ML1, the second work function metal film ML2, and the gap-fill metal film ML3 in the resultant structure of FIG. 27F may form the gate lines 560A of the integrated circuit device 500A illustrated in FIG. 10.

Thereafter, the integrated circuit device 500 illustrated in FIGS. 8 and 9 or the integrated circuit device 500A illustrated in FIG. 10 may be manufactured by forming the insulating structure 190 on the capping insulating pattern 164, forming a pair of gate contacts 582 to pass through the insulating structure 190 and the capping insulating pattern 164 and to be respectively connected to a pair of gate lines 560 (see FIG. 9) or 560A (see FIG. 10) respectively on the first and second device regions AR1 and AR2, and forming the conductive line 586 on the insulating structure 190 to be connected to the gate contacts 582, as shown in FIGS. 9 and 10.

By way of summation and review, with the increase in the integration density of semiconductor devices and the decrease in the size thereof, a structure for increasing the performance and reliability of an NSFET may be considered.

One or more embodiments may provide an integrated circuit device including a field-effect transistor.

One or more embodiments may provide a method in which a wet etch time may be increased as much as it is desired during the process of opening either the NMOS region or the PMOS region and removing a metal.

One or more embodiments may provide a method in which a wet etch time may be increased as much as it is desired during the process of opening either the NMOS region or the PMOS region and removing a metal.

One or more embodiments may provide a device in which a side wall of the isolation structure, which is formed at the boundary between the NMOS region and the PMOS region, may be linearly or planarly extended in a vertical direction without a stepped portion. In addition, to enhance the performance of the NMOS and PMOS transistors, the isolation structure may be closer to one region between the NMOS region and the PMOS region. The height of the isolation structure may be lower than the height of the topmost surface of a nanosheet.

One or more embodiments may provide an integrated circuit device for removing the probability of occurrence of defective processes during the manufacture of the integrated circuit device and providing the stable performance and enhanced reliability of a nanosheet field-effect transistor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
a substrate including a first device region and a second device region;
a first fin active region extending in a first horizontal direction on the first device region;
a second fin active region extending in the first horizontal direction on the second device region;
an isolation film covering opposite side walls of each of the first fin active region and the second fin active region;
a plurality of gate cut insulating patterns on the isolation film on the first device region and the second device region;
a gate line extending on the first fin active region and the second fin active region in a second horizontal direction that crosses the first horizontal direction, the gate line having a length in the second horizontal direction limited by the plurality of gate cut insulating patterns; and an inter-region insulating pattern on the isolation film between the first fin active region and the second fin active region and at least partially penetrating the gate line in a vertical direction, wherein the inter-region insulating pattern has a bottommost surface proximate to the substrate, a topmost surface distal to the substrate, and a flat side wall linearly extending an entire distance from the bottommost surface to the topmost surface.

2. The integrated circuit device as claimed in claim 1, wherein a height of the inter-region insulating pattern in the vertical direction is less than a height of each of the plurality of gate cut insulating patterns in the vertical direction.

3. The integrated circuit device as claimed in claim 1, further comprising:
at least one first nanosheet on the first fin active region and surrounded by the gate line; and
at least one second nanosheet on the second fin active region and surrounded by the gate line,
wherein a level of the top surface of the inter-region insulating pattern is lower than a level of a topmost surface of each of the at least one first nanosheet and the at least one second nanosheet.

4. The integrated circuit device as claimed in claim 1, wherein a first shortest distance in the second horizontal direction between the inter-region insulating pattern and the first fin active region is different from a second shortest distance in the second horizontal direction between the inter-region insulating pattern and the second fin active region.

5. The integrated circuit device as claimed in claim 1, further comprising:
at least one first nanosheet on the first fin active region and surrounded by the gate line; and
at least one second nanosheet on the second fin active region and surrounded by the gate line,
wherein the at least one first nanosheet or the at least one second nanosheet is at a higher level than the top surface of the inter-region insulating pattern.

6. The integrated circuit device as claimed in claim 1, wherein the top surface of the inter-region insulating pattern is a non-planar surface.

7. The integrated circuit device as claimed in claim 1, wherein:
the gate line includes:
a first portion covering the first fin active region on the first device region and having a first stack structure,
a second portion covering the second fin active region on the second device region and having a second stack structure that is different from the first stack structure, and
a gate connecting portion integrally connected to the first portion and the second portion and covering the top surface of the inter-region insulating pattern, and
the gate connecting portion has a structure different from the first stack structure and the second stack structure.

8. The integrated circuit device as claimed in claim 1, wherein:
the gate line includes a first gate portion on the first device region and a second gate portion on the second device region, and
the first gate portion is separated from the second gate portion with the inter-region insulating pattern between the first gate portion and the second gate portion in the second horizontal direction.

9. The integrated circuit device as claimed in claim 8, further comprising:
a first gate contact on the gate line and connected to the first gate portion of the gate line;
a second gate contact on the gate line and connected to the second gate portion of the gate line; and
a conductive line on the first gate contact and the second gate contact and connected to the first gate contact and the second gate contact.

10. An integrated circuit device, comprising:
a substrate including a first device region and a second device region separated from the first device region;
a first fin active region extending in a first horizontal direction on the first device region;
a second fin active region extending in the first horizontal direction on the second device region;
an isolation film covering opposite side walls of each of the first fin active region and the second fin active region;
a gate line extending on the first device region and the second device region in a second horizontal direction that crosses the first horizontal direction;
a first nanosheet stack facing a first fin top of the first fin active region at a position separated from the first fin top in a vertical direction, the first nanosheet stack including at least one first nanosheet surrounded by the gate line;
a second nanosheet stack facing a second fin top of the second fin active region at a position separated from the second fin top in the vertical direction, the second nanosheet stack including at least one second nanosheet surrounded by the gate line; and
an inter-region insulating pattern on the isolation film between the first fin active region and the second fin active region and partially penetrating the gate line in the vertical direction,
wherein the inter-region insulating pattern has a bottommost surface contacting the isolation film, a topmost surface contacting the gate line, and a flat side wall linearly extending an entire distance from the bottommost surface to the topmost surface.

11. The integrated circuit device as claimed in claim 10, wherein:
the gate line includes a gate connecting portion contacting the top surface of the inter-region insulating pattern, and
a length of the gate connecting portion in the vertical direction is less than a length of the inter-region insulating pattern in the vertical direction.

12. The integrated circuit device as claimed in claim 10, wherein:
the gate line includes a gate connecting portion contacting the top surface of the inter-region insulating pattern, and
a length of the gate connecting portion in the vertical direction is greater than a length of the inter-region insulating pattern in the vertical direction.

13. The integrated circuit device as claimed in claim 10, wherein:
the top surface of the inter-region insulating pattern is a non-planar surface, and
the gate line includes a gate connecting portion having a non-planar surface contacting the top surface of the inter-region insulating pattern.

14. The integrated circuit device as claimed in claim 10, wherein a level of the top surface of the inter-region insulating pattern is lower than a level of a topmost surface of each of the first nanosheet stack and the second nanosheet stack.

15. The integrated circuit device as claimed in claim 10, wherein a first shortest distance in the second horizontal direction between the inter-region insulating pattern and the first fin active region is less than a second shortest distance in the second horizontal direction between the inter-region insulating pattern and the second fin active region.

16. The integrated circuit device as claimed in claim 10, wherein a first shortest distance in the second horizontal direction between the inter-region insulating pattern and the first fin active region is greater than a second shortest distance in the second horizontal direction between the inter-region insulating pattern and the second fin active region.

17. The integrated circuit device as claimed in claim 10, wherein:
   the gate line includes:
      a first portion covering the first fin active region on the first device region and having a first stack structure,
      a second portion covering the second fin active region on the second device region and having a second stack structure, and
      a gate connecting portion integrally connected to the first portion and the second portion and covering the top surface of the inter-region insulating pattern, and
   the gate connecting portion includes a single metal film.

18. An integrated circuit device, comprising:
   a substrate including an N-channel metal-oxide semiconductor (NMOS) transistor region and a P-channel MOS (PMOS) transistor region separated from the NMOS transistor region;
   a first fin active region extending in a first horizontal direction on the NMOS transistor region;
   a second fin active region extending in the first horizontal direction on the PMOS transistor region;
   an isolation film covering opposite side walls of each of the first fin active region and the second fin active region;
   a plurality of gate cut insulating patterns on the isolation film on the NMOS transistor region and the PMOS transistor region and having a first height in a vertical direction;
   a gate line extending on the NMOS transistor region and the PMOS transistor region in a second horizontal direction that crosses the first horizontal direction;
   a first nanosheet stack on the first fin active region and including at least one first nanosheet surrounded by the gate line;
   a second nanosheet stack on the second fin active region and including at least one second nanosheet surrounded by the gate line; and
   an inter-region insulating pattern between the NMOS transistor region and the PMOS transistor region, partially penetrating the gate line in the vertical direction, and having a second height in the vertical direction that is less than the first height,
   wherein the inter-region insulating pattern has a bottom surface contacting the isolation film, a top surface contacting the gate line, and a side wall linearly extending from the bottom surface to the top surface.

19. The integrated circuit device as claimed in claim 18, wherein a first shortest distance in the second horizontal direction between the inter-region insulating pattern and the first nanosheet stack is different from a second shortest distance in the second horizontal direction between the inter-region insulating pattern and the second nanosheet stack.

20. The integrated circuit device as claimed in claim 18, wherein:
   one first nanosheet of the first nanosheet stack is at a higher level than the top surface of the inter-region insulating pattern, and
   one second nanosheet of the second nanosheet stack is at a higher level than the top surface of the inter-region insulating pattern.

\* \* \* \* \*